(12) United States Patent
Ogawa et al.

(10) Patent No.: US 6,236,393 B1
(45) Date of Patent: May 22, 2001

(54) INTERFACE CIRCUIT AND LIQUID CRYSTAL DRIVING CIRCUIT

(75) Inventors: Yoshinori Ogawa, Yamatotakada; Takuya Watanabe, Tenri; Shigeki Tamai, Yoshino-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/176,102

(22) Filed: Oct. 21, 1998

(30) Foreign Application Priority Data

Oct. 31, 1997 (JP) .................................................. 9-299872
May 29, 1998 (JP) .................................................. 10-150283

(51) Int. Cl.[7] ...................................................... G09G 5/00
(52) U.S. Cl. .............................. 345/211; 345/98; 345/204
(58) Field of Search .................................... 345/211, 212, 345/98, 99, 100, 204

(56) References Cited

U.S. PATENT DOCUMENTS

| 5,130,702 | * | 7/1992 | Lee | 345/22 |
| 5,287,172 | * | 2/1994 | Lee | 348/518 |
| 5,856,816 | * | 1/1999 | Youn | 345/98 |
| 5,986,641 | * | 11/1999 | Shimamoto | 345/150 |

FOREIGN PATENT DOCUMENTS

| 0 515 853 A1 | 12/1992 | (EP) . |
| 2-310827 | 12/1990 | (JP) . |
| 05122029 | 5/1993 | (JP) . |

* cited by examiner

Primary Examiner—Bipin Shalwala
Assistant Examiner—Ricardo Osorio
(74) Attorney, Agent, or Firm—Nixon & Vanderhye, PC

(57) ABSTRACT

An interface circuit which performs level shifting with respect to an inputted digital signal with a small amplitude and outputs a digital signal with a greater amplitude than that of the inputted digital signal is equipped with a filter circuit composed of a low-pass filter and a comparator circuit composed of a plurality of comparators. Digital signals with small amplitudes are supplied to non-inverting input terminals of the comparators, respectively, while a reference voltage signal which is obtained by filtering, through the filter circuit, one predetermined digital signal among the digital signals supplied to the non-inverting input terminals is supplied to every inverting input terminal of the comparators. By so doing, it is possible to provide an interface circuit and a liquid crystal driving circuit which ensure that EMI noise is reduced and various problems which tend to occur in the case where display data input lines increase in number is avoided.

16 Claims, 52 Drawing Sheets

FIG. 31

FIG. 50 (a)
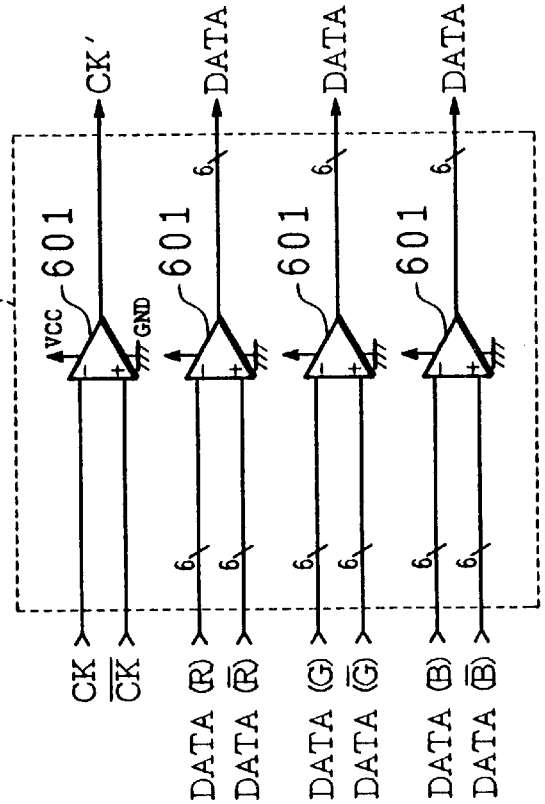
FIG. 50 (b)
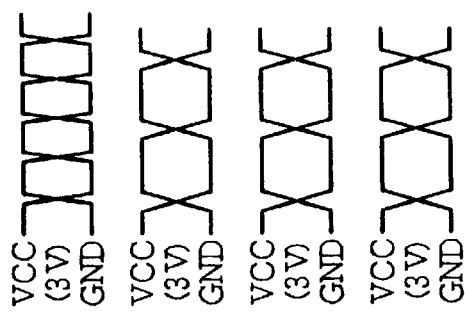
FIG. 50 (c)

INTERFACE CIRCUIT AND LIQUID CRYSTAL DRIVING CIRCUIT

FIELD OF THE INVENTION

The present invention relates to an interface circuit which interfaces a plurality of digital input signals having a small amplitude each by using comparators and shifts levels of the inputted digital input signals by using the comparators so that the digital signals are amplified, and particularly relates to an interface circuit which is installed inside a liquid crystal driving circuit and ensures suppression of EMI (electromagnetic interference: a generic term for discharge phenomena such as electromagnetic disturbance and interference with respect to outside) noise, as well as relates to the liquid crystal driving circuit incorporating the interface circuit.

BACKGROUND OF THE INVENTION

The following description will explain a conventional TFT (thin film transistor) -LCD (liquid crystal display) module, while referring to FIG. 40. Here, "module" refers to an independent unit which satisfies requirements such that only by combining a plurality of the modules, a grand system such as a TV set or a personal computer can be formed.

A TFT-LCD module 501 is equipped with a controller 510, a liquid crystal driving power source circuit 520, a gate driver group (gate electrode driving circuit) 530, a source driver group (source electrode driving circuit) 540, and a liquid crystal panel 550, as shown in FIG. 40.

According to a synchronization signal supplied from outside (from a host system), the controller 510 controls production of a scanning pulse by the gate driver group 530 and performs timing control of an Nbit display data signal and a driving control signal by the source driver group 540. The liquid crystal power source circuit 520 receives power from an external power source and supplies power to the gate driver group 530 and the source driver group 540, as well as to a common electrode.

The gate driver group 530 is composed of an "m" number of gate drivers G1 through Gm, and the gate drivers G1 through Gm are multi-output drivers for driving gate bus lines (a plurality of the same are provided horizontally as viewed in FIG. 41) of the liquid crystal panel 550, and are generally referred to as gate drivers. Each gate driver is, though not shown in the figure, composed of (1) films called as tape carriers made of copper film wires which are laid at fine intervals on an insulating film so as to connect input/output terminals of an LSI chip with electrodes of other constituent parts, respectively, and (2) sealing resin for fixing and dehumidifying the LSI chip.

Likewise, the source driver group 540 is composed of an "n" number of source drivers S1 through Sn. The source drivers SI through Sn are multi-output drivers for driving source bus lines (a plurality of the same are provided vertically as viewed in FIG. 41) of the liquid crystal panel 550, and are generally referred to as source drivers. Each source driver is, though not shown in the figure, composed of (1) films called as tape carriers made of copper film wires which are laid at fine intervals on an insulating film so as to connect input/output terminals of an LSI chip with electrodes of other constituent parts, respectively, and (2) sealing resin for fixing and dehumidifying the LSI chip.

The liquid crystal panel 550, as shown in FIG. 41, can be plotted into an equivalent circuit diagram of a TFT liquid crystal panel. In the liquid crystal panel 550, a plurality of TFTs are provided in a matrix form, and each TFT is connected with a display electrode which is formed so as to correspond to each pixel. Further, the common electrode is formed so as to face each display electrode. The common electrode is an electrode commonly corresponding to all the pixels.

When a positive voltage is applied to the gate electrode of the TFT (usually supplied from the gate driver), the TFT is turned on. In accordance with a voltage applied to the source bus line, a liquid crystal load capacitor formed between the display electrode and the common electrode is charged.

When a negative voltage is applied to the gate electrode, the TFT is turned off, and a voltage applied at the time is maintained by the liquid crystal load capacitor between the display electrode and the common electrode.

By controlling a gate voltage in a state in which an appropriate voltage is applied to the source electrode (usually supplied from the source driver), a desired voltage can be maintained by the pixel. Transmittance of the liquid crystal is varied in accordance with the voltage thus maintained, whereby images are displayed. To be more specific, as shown in FIG. 42, the liquid crystal whose transmittance has varied is backlighted, and light having passed through the liquid crystal is projected on color filters, whereby images are displayed.

The following description will explain the gate drivers G1 through Gm constituting the gate driver group 530, while referring to FIG. 43. Since the gate drivers G1 through Gm have the same arrangement, FIG. 43 is a schematic block diagram of one gate driver LSI chip.

The gate driver LSI chip is provided with a shift register circuit 561, a level shifter circuit 562, and an output circuit 563. The functions of the blocks will be explained below.

The shift register circuit 561 performs a shifting operation in accordance with a horizontal synchronization signal SPD in response to a vertical synchronization signal CLD, and outputs a selection pulse for selecting, from among the pixels of the liquid crystal panel, a pixel to be driven by a voltage outputted from the source driver group 540.

The level shifter circuit 562 shifts a level of the selection pulse to a voltage level required for turning on/off TFTs, and a signal thus converted is sent to the output circuit 563. The output circuit 563 amplifies the signal thus inputted thereto, by using an output buffer circuit installed therein, and outputs the amplified signal through an output terminal. Outputs OP1 through OPn from the output circuit 563 are signals in a pulse form, and are hereinafter referred to as gate pulses.

Signal timings of the vertical synchronization signal CLD, the horizontal synchronization signal SPD, and the outputs OP1 through OPn are shown in FIG. 44 which explains the present invention.

The following description will explain the source drivers S1 through Sn constituting the source driver group 540, while referring to FIG. 45. FIG. 45 is a schematic block diagram showing one of the source driver LSI chips which constitute the source drivers S1 through Sn, respectively. A block diagram of an arrangement for display with 64 scales of color gradation is shown here.

The source driver LSI chip is composed of a shift register circuit 571, an input latch circuit 572, a sampling memory circuit 573, a holding memory circuit 574, a reference voltage producing circuit 575, a DA converter circuit 576, and an output circuit 577. The functions of the blocks are explained below.

The shift register circuit 571 performs a shifting operation in response to a start pulse signal SPI of the source driver in accordance with an input clock signal CK, and selects a bit for sampling data. Here, a start pulse signal SPO (cascade output signal) is outputted from a final stage of the shift register circuit 571 to an LSI chip of the subsequent stage.

Therefore, the start pulse signal SPI is supplied from outside only to the source driver S1 among the source drivers S1 through Sn installed in the liquid crystal panel 550. Regarding each of the other source drivers, the cascade output signal SPO taken out of the final stage of the previous shift register circuit 571 is inputted as the start pulse signal. FIG. 46 shows an example of a liquid crystal panel 550 equipped with four source drivers.

The input latch circuit 572 temporarily latches an input display data signal DATA (6 bits per each of R, G, and B), and thereafter, sends it to the sampling memory circuit 573.

The sampling memory circuit 573 samples the data inputted thereto by time sharing and stores the data.

The hold memory circuit 574 latches the data (display data signal) stored in the sampling memory circuit 573 all together, in accordance with a signal LS inputted thereto.

The reference voltage producing circuit 575 generates voltages of 64 levels by resistance dividing, based on a reference voltage of a signal Vref.

The DA converter circuit 576 generates an analog signal in accordance with the display data signal, and sends the analog signal to the output circuit 577. The output circuit 577 amplifies the analog signal of 64 levels by using an output buffer circuit, and outputs the amplified result through an output terminal.

The source driver for display of 64 scales of color gradation can be explained as in the foregoing description.

FIG. 47 is a timing chart showing the signals of the source driver for display of 64 scales in the case where four source drivers are provided to the liquid crystal panel 550 as shown in FIG. 46.

Incidentally, as the resolution of the liquid crystal panel is further heightened (due to an increase in the number of dots provided in vertical and horizontal directions) and scales of color gradation thereof increase, the liquid crystal driver (source driver in this case) is recently more and more required to have a higher data transfer speed.

The data transfer speed (fxck) of the liquid crystal driver is found by the following formula:

$$fxck = Y \times X \times N \times fFR/D/n \text{ (Hz)}$$

where:

Y: number of dots in horizontal direction [(number of pixels in horizontal direction)×3 (RGB)]

X: number of dots in vertical direction [number of pixels in vertical direction]

N: number of scale-use bits [$2^N$ scales]

fFR: frame frequency [usually, about 70 Hz]

D: number of data inputted [N×3 (RGB)]

n: driving parameter [n=2 in the case of both-side driving, or n=1 in the case of one-side driving]

For example, assume that regarding a XGA-use liquid color panel of 1024×768 size, the number N of scale-use bits, the frame frequency fFR, and the number of inputted data are set to 64 (N=6), 70Hz, and 18 bits, respectively, and the unilateral driving is performed. In this case, the data transfer frequency required of the source driver is:

$$(1024 \times 3 \times 768 \times 6 \times 70) \div 18 = 55 \text{ MHz}$$

Table 1 below shows data transfer speeds of the source drivers of various pixel size specifications (calculated in the aforementioned manner).

TABLE 1

| SPECIFICATION | NUMBER OF DOTS | DATA TRANSFER SPEED OF SOURCE DRIVER |
|---|---|---|
| SVGA | 800 × 600 | - 35 MHz - |
| XGA | 1024 × 768 | - 55 MHz - |
| SXGA | 1280 × 1024 | - 95 MHz - |

However, regarding the TFT-LCD module, it has been known to those skilled in the art that EMI noise is a great problem with respect to a high data transfer speed which such high resolution specification as above requires, and various enterprises have so far examined and attempted various schemes to solve the problem.

For example, to suppress the EMI noise, a small amplitude differential signal transmitting scheme has conventionally been applied to a driving circuit of a liquid crystal display device.

The small amplitude differential signal transmitting scheme is a scheme as shown in FIG. 48. In a TFT-LCD module 502, a signal from the controller 510 is sent to a source driver group 540 with a small amplitude, and the signal thus transmitted to the source driver group 540 is first received by a comparator circuit group of a differential amplifier type before being transmitted to a circuit on the subsequent stage or the like. More specifically, it is generally said that a radiation level of the EMI noise is proportional to a square of a voltage of a signal line and the number of signal lines. The small amplitude differential signal transmitting scheme uses a differential signal with an extremely small amplitude, and hence, it is regarded as one of schemes which ensure reduction of the EMI.

Here, the small amplitude differential signal transmitting scheme will be explained in the following description.

FIG. 48 shows an example of the TFT-LCD module 502 of the small amplitude differential signal transmitting scheme. The TFT-LCD module 502 differs from the TFT-LCD module 501 shown in FIG. 40, in the following aspect: in the TFT-LCD module 502, lines through which the display data signal DATA (R, G, B ×Nbit) and the input clock signal CK are supplied from the controller 510 to the source driver group 540 are doubled, as compared to the TFT-LCD module 501.

The reason why the input lines from the controller 510 to the source driver group 540 are doubled is, though it will be explained in detail later, as follows. Twisted signals with small amplitudes are supplied to an interface circuit 600 (see FIG. 49) installed in each source driver, and they are compared by comparator circuits of a differential amplifier type, each of which has two input terminals for non-inverting input (+) and inverting input (−). Thereafter, compared results are converted to signals with great amplitudes, and the signals are supplied to internal circuits at the subsequent stage. Incidentally, according to the small amplitude differential signal transmitting scheme, even a level of an input signal with an extremely small amplitude can be changed by a differential amplifier, but there are the following drawbacks: the number of input terminals increases by at least two per one output circuit, and consumed power increases since a response speed of the differential amplifier has to be raised by flowing much current through a constant power supply source of the differential amplifier. More specifically, in the case where the small amplitude differential signal transmitting scheme is applied, current necessary for the constant power source of the differential amplifier becomes several tens $\mu$A, which is one order higher than that for a usual comparator circuit.

FIG. 49 is a block diagram of a source driver constituting the source driver group 540 of the TFT-LCD module 502. Here, a circuit block diagram of a source driver LSI chip constituting one among the source driver $S_1$ through $S_n$ is shown.

The foregoing source driver LSI chip greatly differs from the driver LSI chip shown in FIG. 45 in the following aspect: in the case of the former, the input clock signal and the input display data signals are supplied through the interface circuit 600. Incidentally, as described above, the number of input lines for the display data signals and the number of input terminals for the input clock signals are doubled, respectively, as compared with those of the source driver LSI chip shown in FIG. 45.

FIG. 50(b) shows an arrangement example of the interface circuit 600. The interface circuit 600 is composed of a plurality of comparators 601 each of which is a differential amplifier-type comparator with two input terminals for non-inverting input (+) and inverting input (−) and one output terminal. More specifically, as shown in FIG. 50(a), regarding each pair of the input terminals CK and DATA for the clock signal and the display data signals in the interface circuit 600, small-amplitude pulse signals of 1.0 V to 1.4 V in a twisted state are supplied to the input terminals for the non-inverting input (+) and the inverting input (−), respectively. The pulse signals are compared by the comparators 601, and then, their levels are shifted. Thereafter, as shown in FIG. 50(c), pulse signals of 0 V to 3 V are outputted by setting the power source voltages VCC of the comparators 601 to 3V, the same level of that of the source driver LSI chip.

Each comparator 601 is equipped with, for example, a comparing circuit 601a and a source follower circuit 601b, as shown in FIG. 51. In the case where a P-channel transistor and an N-channel transistor provided in the comparator 601 as described above are replaced with each other, it results in a comparator 602 equipped with a comparing circuit 602a and a source follower circuit 602b as shown in FIG. 52.

Incidentally, to narrow a frame part of the liquid crystal module, a scheme wherein liquid crystal drivers (drivers for driving the source bus line side) are provided on both upper and lower sides of the liquid crystal panel so that the liquid crystal panel is driven from both the sides has recently been substituted by a scheme wherein the liquid crystal drivers are provided on one side of the liquid crystal panel so as to drive the liquid crystal panel, and therefore, twice the conventional transfer speed of the liquid crystal drivers has been required.

Besides, the number of pixels has been rapidly changed, from that of VGA to that of SVGA, and further, shift to XGA, and to SXGA has started. This entails a rapid increase in a necessary driving frequency.

However, as described above, in the case where a high-speed pulse signal is dealt with, the EMI noise is a serious problem. As a typical scheme to reduce the EMI noise, the aforementioned small amplitude differential signal transmitting scheme is well-known.

The small amplitude differential signal transmitting scheme which has been conventionally conducted, however, requires two differential input terminals per one bit. For example, in a 64-scale source driver, 18 (6 bits×3 (RGB)) data input lines have conventionally been needed, but in the case of the small amplitude differential signal transmitting scheme, twice the number in the conventional case, that is, 36 (6 bits×3 (RGB)×2), of display data input lines are needed. Further, in the case of 256 scales, no less than 48 (8 bits×3 (RGB)×2) display data input lines are necessary.

Such an increase in the number of display data input lines causes many problems to manufacturers and assemblers.

The problems include expansion of a size of the LSI chip which entails a rise of costs, a decline of a yield of the LSI chip, degradation of reliability stemming from an increase in the number of the input terminals, expansion of a size of TCP (tape carrier package) which entails a rise of costs, a decline of the yield due to the TCP assembling process, expansion of an input lines substrate of the TFT-LCD module which entails expansion of a frame thereof.

SUMMARY OF THE INVENTION

An object of the present invention is to provide such an interface circuit and a liquid crystal driving circuit that ensure suppression of the EMI noise, by applying the small amplitude differential signal transmitting scheme without increasing display data input lines, thereby ensuring that various problems which tend to occur in the case where the display data input lines increase in number are avoided.

To achieve the aforementioned object, an interface circuit of the present invention is characterized by comprising a plurality of comparators and a low-pass filter, each comparator having a non-inverting input terminal and an inverting input terminal, wherein (1) digital signals with small amplitudes are supplied to the non-inverting input terminals of the comparators, respectively, (2) a reference voltage signal obtained by filtering, through the low-pass filter, one predetermined digital signal among the digital signals supplied to the non-inverting input terminals is supplied to every inverting terminal of the comparators, and (3) each comparator performs level shifting with respect to the digital signals with the small amplitudes inputted thereto, and outputs a digital signal with a greater amplitude than that of the inputted digital signals.

According to the foregoing arrangement, the signal produced by the low-pass filter is supplied to every inverting input of the comparators. Therefore, since the digital signals supplied from outside are supplied only through the non-inverting input terminals, the input terminals of the interface circuits decrease in number.

With this arrangement, various problems stemming from an increase in the number of the input terminals can be solved. More specifically, for example, in the case where the interface circuits of the foregoing arrangement are applied to a liquid crystal driving circuit, the following problems can be avoided: expansion of a size of a LSI chip used to form the liquid crystal driving circuit, which also entails a rise of costs; a decline of the yield of the LSI chip; degradation of reliability stemming from an increase in the number of input terminals; expansion of a size of a TCP, which also entails a rise of costs; a decline of the yield due to the TCP assembling process; and expansion of an input lines substrate of the TFT-LCD module, which also entails expansion of a frame thereof.

Furthermore, in the case where the interface circuit thus arranged is applied to the Liquid crystal driving circuit, power-source-originated high frequency components, which are generated by charging/discharging current of logic circuits driven in response to digital signals of a clock system and a display data system outside the liquid crystal driving circuit, can be suppressed by making the digital signals of the clock system and the display data system have small amplitudes while limiting the number of the input terminals. Therefore, it is possible to suppress high frequency components emitted from peripheral circuits (devices) outside the liquid crystal driving circuit.

Furthermore, a liquid crystal driving circuit of the present invention is characterized by comprising (1) a plurality of liquid crystal driving circuit elements each of which has input terminals to which digital signals such as a clock signal and display data signals are supplied, respectively, and a driving signal producing section for producing a driving signal for driving a liquid crystal display device in accordance with the digital signals supplied through the input terminals, and (2) a plurality of interface circuits having a plurality of comparators and at least one low- pass filter, each comparator having a non-inverting input terminal and an inverting input terminal, wherein digital signals with small amplitudes are supplied to the non- inverting input terminals of the comparators, respectively, while a reference voltage signal obtained by filtering, through the low-pass filter, one predetermined digital signal among the digital signals supplied to the non-inverting input terminals is supplied to every inverting terminal of the comparators, so that each comparator performs level shifting with respect to the digital signals with the small amplitudes inputted thereto, and outputs a digital signal with a greater amplitude than that of the inputted digital signal, and further, the liquid crystal driving circuit is characterized in that each interface circuit is provided between the input terminals and the driving signal producing section inside each liquid crystal driving circuit element.

With the foregoing arrangement wherein the interface circuit is provided between the input terminal and the driving signal producing section of the liquid crystal driving circuit element, it is possible to transmit signals (clock signal, display data signal) in a small- amplitude digital signal form, and to convert them to digital signals (clock signal, display data signal) with great amplitudes at the input section of the liquid crystal driving circuit by using the comparators of the interface circuit, thereby supplying the converted signals to the circuit of the next stage.

This ensures suppression of the EMI noise which adversely affects high-speed driving of a liquid crystal display device, that is, the EMI noise occurring outside the liquid crystal driving circuit.

For a fuller understanding of the nature and advantages of the invention, reference should be made to the ensuing detailed description taken in conjunction with the accompanying drawings.

BRIEF DESCRIPTION OF THE DRAWINGS

FIG. 13(a) is a waveform chart of input signals, FIG. 13(b) is a schematic block diagram of the interface circuit, and FIG. 13(c) is a waveform chart of output signals.

FIG. 21(a) is a waveform chart of input signals, FIG. 21(b) is a schematic block diagram, and FIG. 21(c) is a waveform chart of output signals.

FIG. 31 is a timing chart of the 64-scale source driver of connected with the liquid crystal panel shown in FIG. 30.

FIGS. 50(a) through 50(c) are views regarding an interface circuit provided in the source driver LSI chip shown in FIG. 49. FIG. 50(a) is a waveform chart of input signals, FIG. 50(b) is a schematic block diagram, and FIG. 50(c) is a waveform chart of output signals.

DESCRIPTION OF THE PREFERRED EMBODIMENTS

[First Embodiment]

The following description will explain an embodiment of the present invention, while referring to FIGS. 1 through 16.

Note that in the following description of the present embodiment, a case where an interface circuit of the present invention is applied to a liquid crystal driving circuit will be explained.

Figure 2:
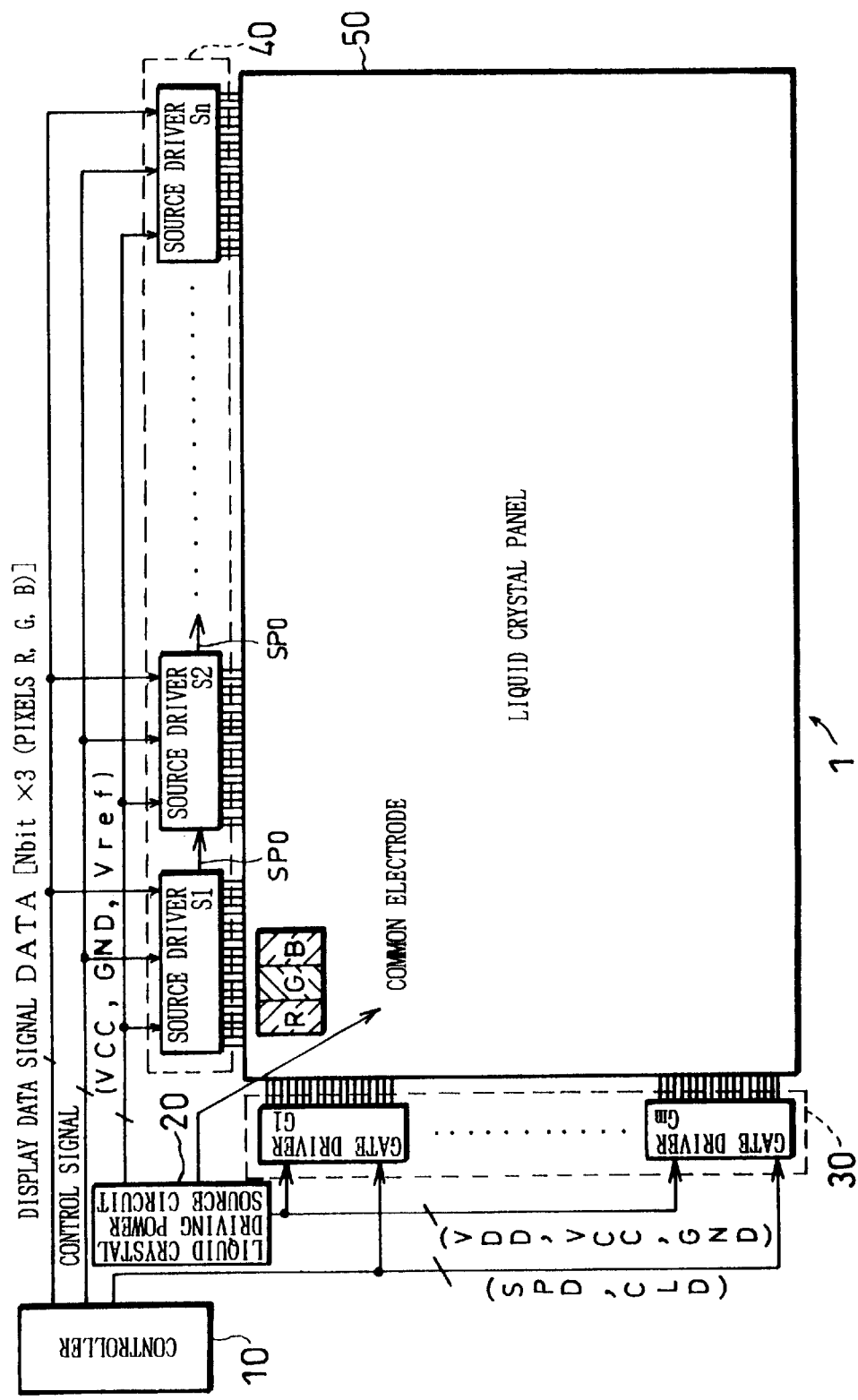
FIG. 2 is a block diagram showing a schematic arrangement of a TFT-LCD module having a liquid crystal driving circuit in which the interface circuit shown in FIG. 1 is installed.

A TFT-LCD module 1 equipped with a liquid crystal driving circuit in accordance with the present embodiment is provided with a controller 10, a liquid crystal driving power source circuit 20, a gate driver group (gate electrode driving circuit) 30, a source driver group (source electrode driving circuit) 40, and a liquid crystal panel 50, as shown in FIG. 2.

The controller 10 performs (1) control of production of a scanning pulse of the gate driver group 30 and (2) timing control of Nbit display data signals and a driving control signal of the source driver group 40, in accordance with a synchronization signal supplied from outside (host system).

The liquid crystal driving power source circuit 20 receives power from an external power source and supplies power to the gate driver group 30, the source driver group 40, and a common electrode.

The gate driver group 30 is composed of m gate drivers G1 through Gm. The gate drivers G1 through Gm are multi-output drivers for driving gate bus lines of the liquid crystal panel 50 (a plurality of gate bus lines are provided in a horizontal direction as viewed in FIG. 3), which are usually called as gate drivers. Each gate driver is composed of (1) films called as tape carriers made of copper film wires which are laid at fine intervals on an insulating film so as to connect input/output terminals of an LSI chip with electrodes of other constituent parts, respectively, and (2) sealing resin for fixing and dehumidifying the LSI chip (not shown)

Likewise, the source driver group 40 is composed of n source drivers S1 through Sn. The source drivers S1 through Sn are multi-output drivers for driving source bus lines of the liquid crystal panel 50 (a plurality of source bus lines are provided in a vertical direction as viewed in FIG. 3), which are usually called as source drivers. Each source driver is composed of (1) films called as tape carriers made of copper film wires which are laid at fine intervals on an insulating film so as to connect input/output terminals of an LSI chip with electrodes of other constituent parts, respectively, and (2) sealing resin for fixing and dehumidifying the LSI chip (not shown).

Figure 3:
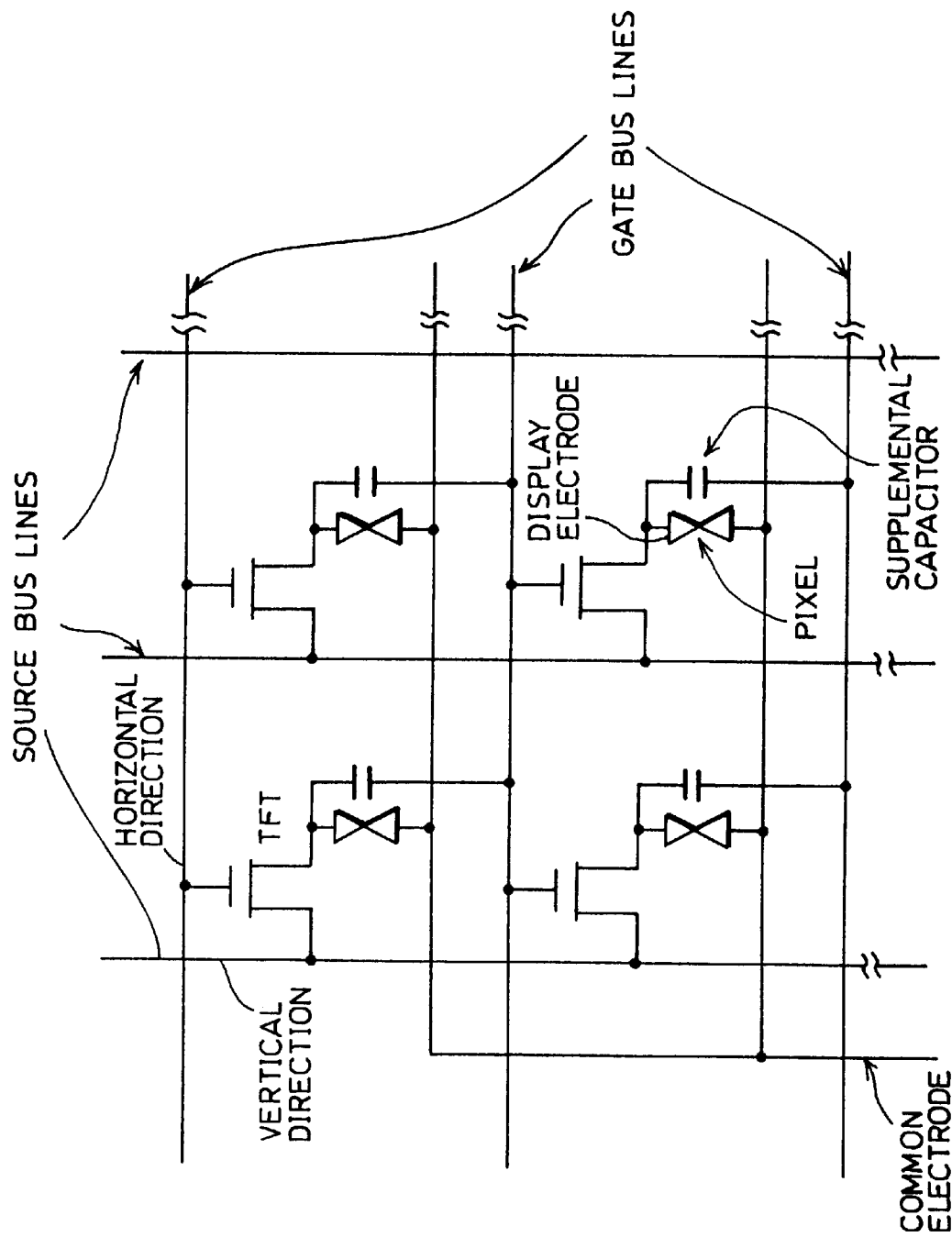
FIG. 3 is an equivalent circuit diagram of a liquid crystal panel provided in the TFT-LCD module shown in FIG. 2.

The liquid crystal panel 50 is, as shown in FIG. 3, expressed by an equivalent circuit diagram of a TFT liquid crystal panel. In the liquid crystal panel 550, a plurality of TFTs are formed in matrix, and each TFT is connected with a display electrode which is formed in such a manner that the display electrodes correspond to the pixels, respectively. At a position facing the display electrodes, a common electrode is formed. The common electrode is an electrode commonly corresponding to all the pixels. To be more specific, when a positive voltage is applied to a gate electrode of a TFT (usually, a signal is supplied from the gate driver), the TFT is turned on, and a liquid crystal load capacitor formed between the display electrode and the common electrode is charged by the voltage applied to the source bus line. Then, when a negative voltage is applied to the gate electrode, the TFT is turned off, and the voltage applied at the time is maintained between the display electrode and the common electrode. By controlling a gate voltage in a state in which an appropriate voltage is applied (usually, a signal is supplied from the source driver), a pixel is made to maintain a desired voltage. A transmittance of liquid crystal is varied in accordance with the maintained voltage, whereby images are displayed.

Figure 4:
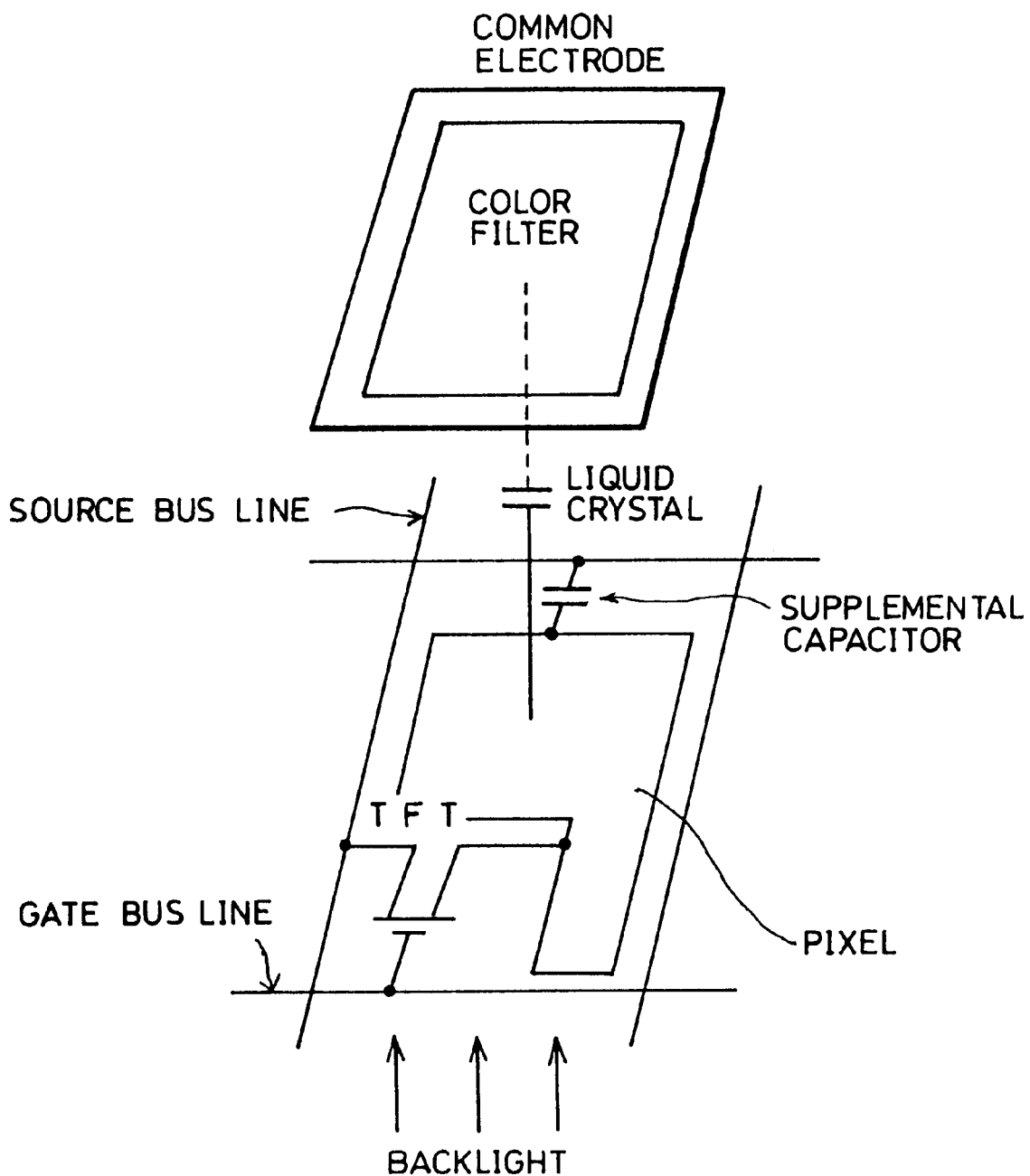
FIG. 4 is an explanatory view illustrating an image display operation of the liquid crystal panel provided in the TFT-LCD module shown in FIG. 2.

More specifically, as shown in FIG. 4, by backlighting the liquid crystal whose transmittance is varied, the light having passed through the liquid crystal is projected onto color filters, whereby images are displayed.

Figure 5:
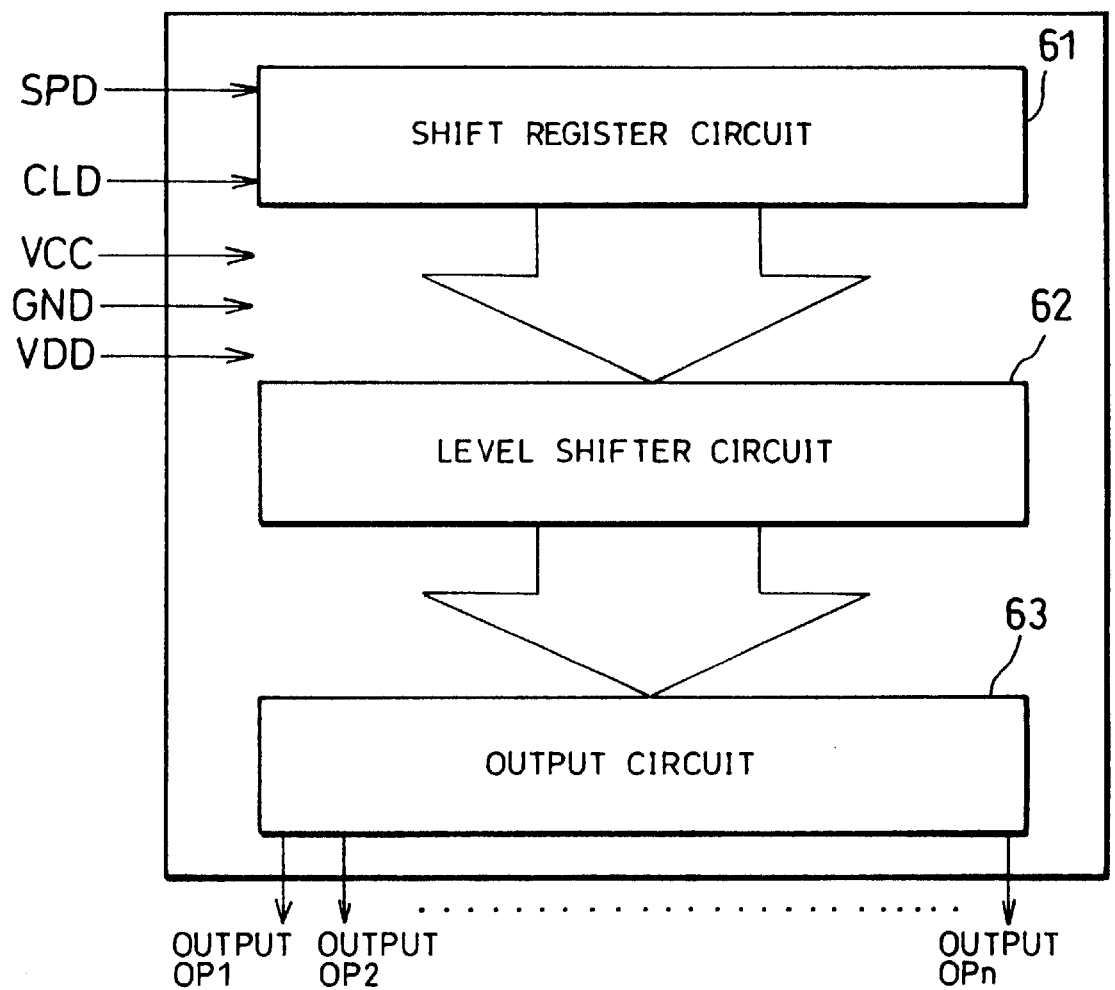
FIG. 5 is a block diagram illustrating a schematic circuit arrangement of a gate driver LSI chip provided in the TFT-LCD module shown in FIG. 2.
Figure 6:
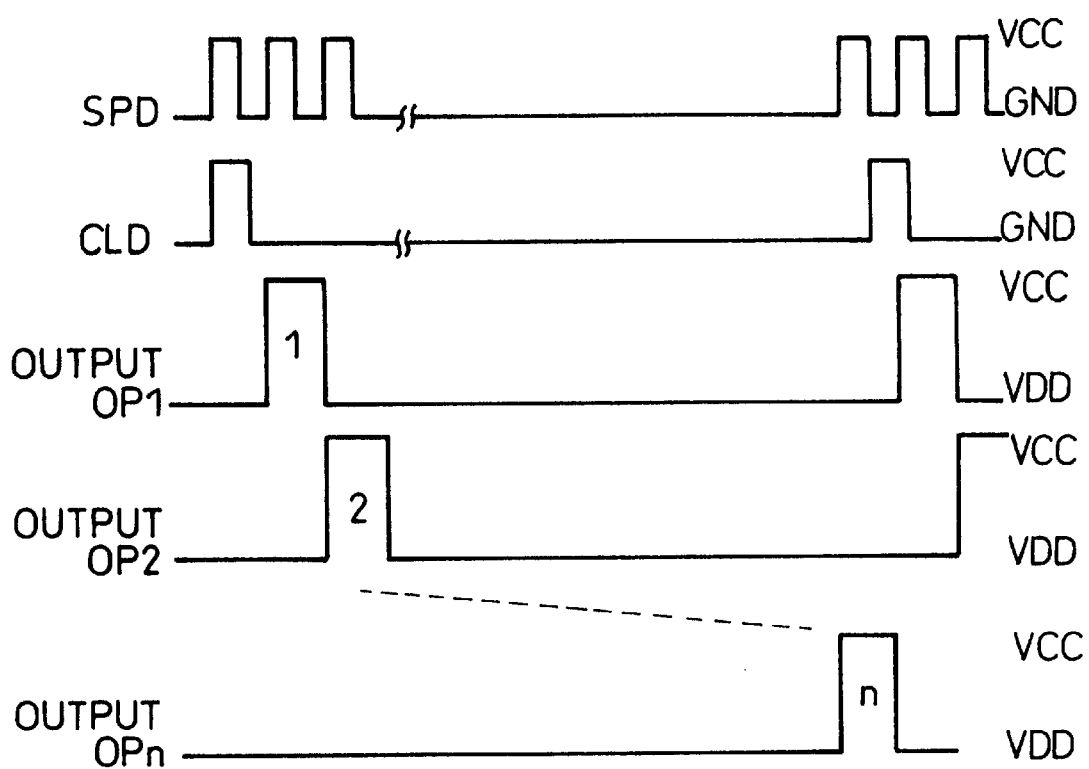
FIG. 6 is a timing chart for the gate driver LSI chip shown in FIG. 5.

Here, the following description will explain the gate drivers G1 through Gm composing the gate driver group 30, while referring to FIGS. 5 and 6. FIG. 5 is a circuit block diagram illustrating an LSI chip constituting one gate driver (hereinafter referred to as a gate driver LSI chip). Note that the gate drivers G1 through Gm have the same arrangement.

The gate driver LSI chip has a shift register circuit 61, a level shifter circuit 62, and an output circuit 63. Functions of these blocks are explained below.

The shift register circuit 61 conducts a shifting operation in response to a vertical synchronization signal CLD in accordance with a horizontal synchronization signal SPD, and outputs a selective pulse for selecting a pixel to be driven from among the pixels of the liquid crystal panel 50, in accordance with a voltage outputted from the source driver group 40.

The level shifter circuit 62 shifts a level of the selective pulse from the shift register circuit 61 to a voltage level necessary for turning the TFT on/off, and sends it to the output circuit 63.

The output circuit 63 amplifies the signal supplied from the level shifter circuit 62 by using an output buffer circuit which is installed therein, and outputs the amplified signal from an output terminal thereof. Outputs OP1 through OPn from the output circuit 63 are signals in a pulse form, and are called as gate pulses.

FIG. 6 is a timing chart of the vertical synchronization signal CLD, the horizontal synchronization signal SPD, and the outputs OPT through OPn. From the timing chart of FIG. 6, it is understood that the gate pulse denoted as OUTPUTs OP1 through OPn are sequentially outputted from the output circuit 63.

Figure 7:
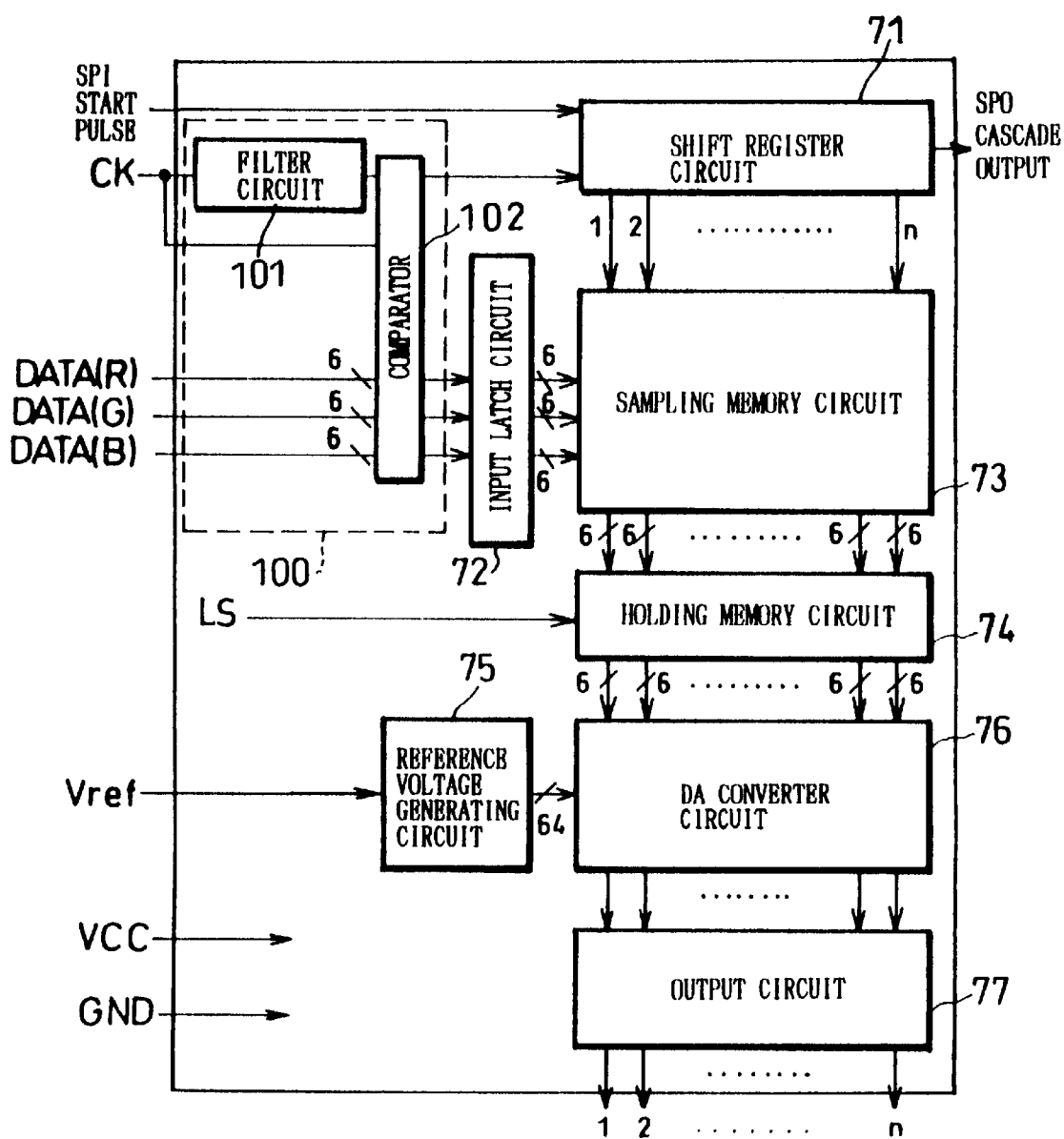
FIG. 7 is a block diagram illustrating a schematic circuit arrangement of a source driver LSI chip provided in the TFT-LCD module shown in FIG. 2.
Figure 8:
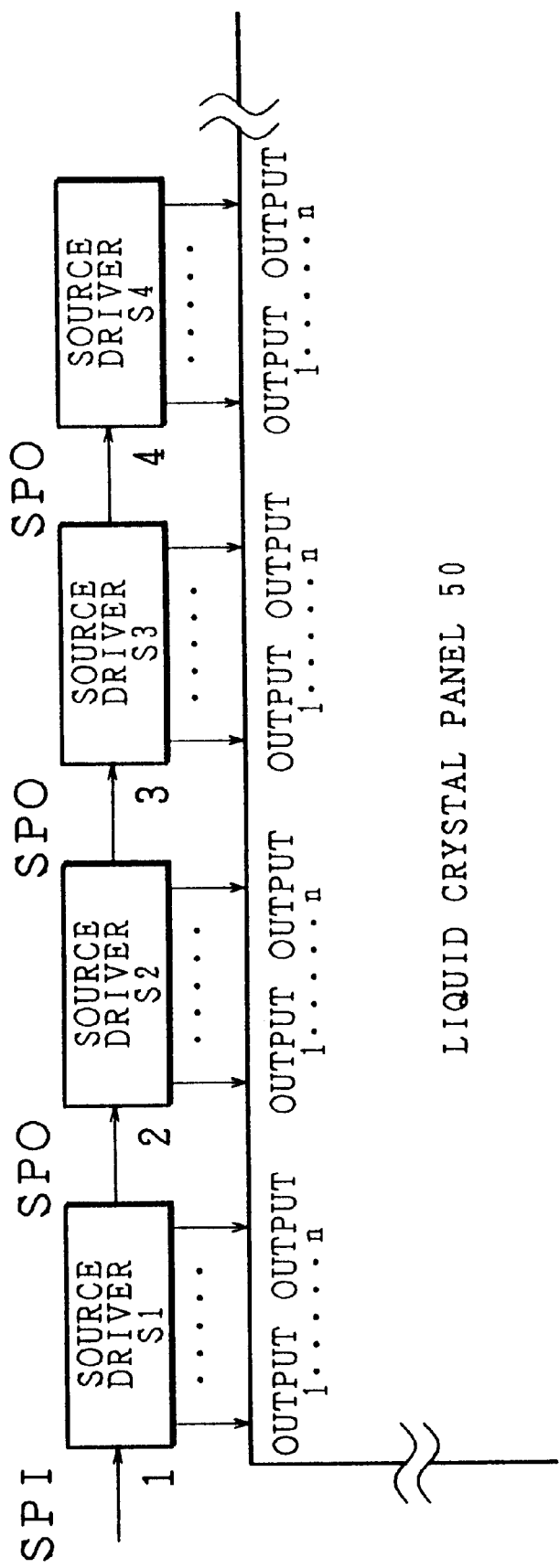
FIG. 8 is an explanatory view illustrating a state in which four source drivers are connected to the liquid crystal panel provided in the TFT-LCD module shown in FIG. 2.
Figure 9:
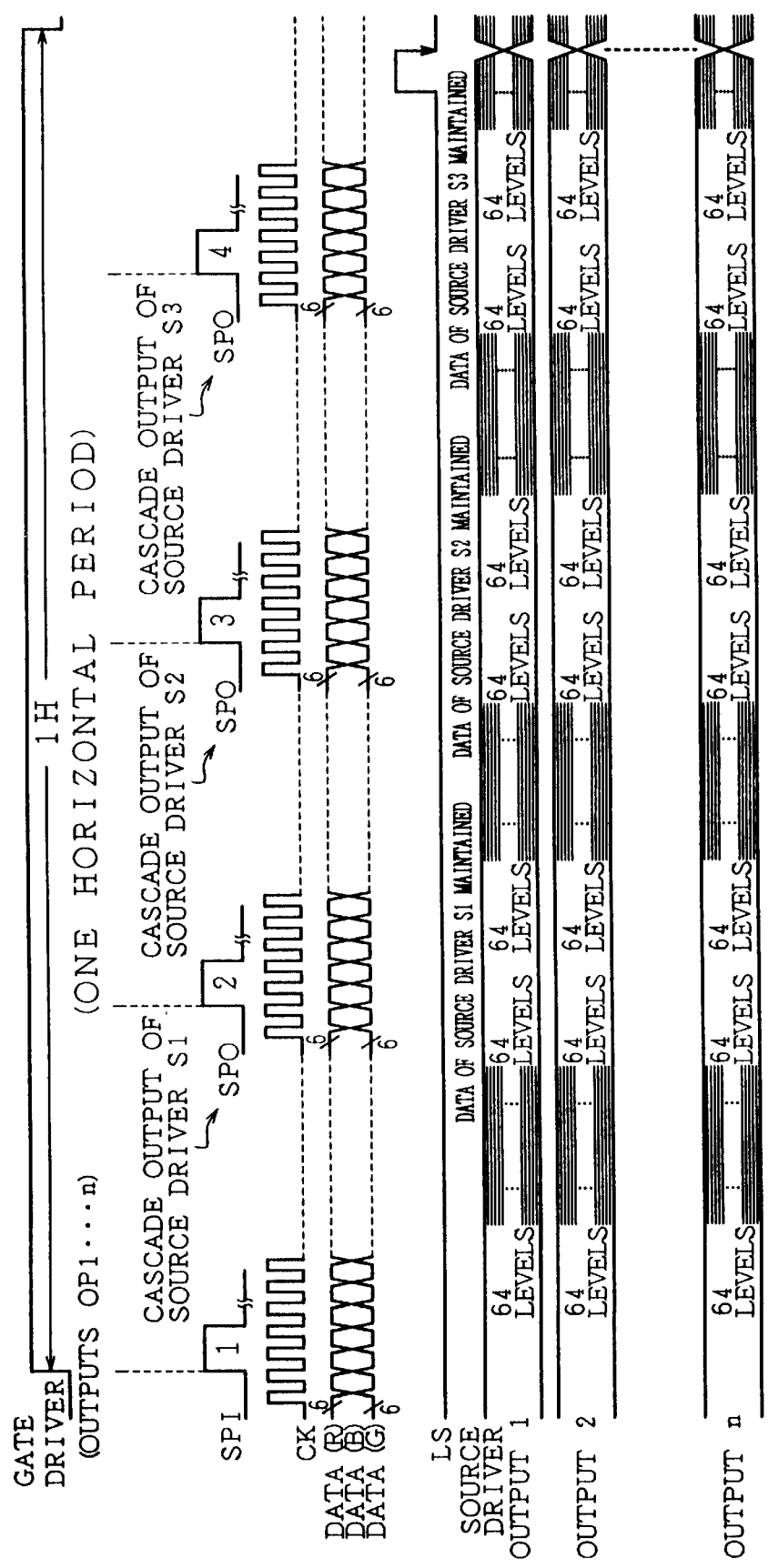
FIG. 9 is a timing chart of the 64-scale source drivers of which are connected with the liquid crystal panel as shown in FIG. 8.

Next, the following description will explain the source drivers S1 through Sn composing the source driver group 40, while referring to FIGS. 7 through 9. FIG. 7 is a block diagram illustrating an LSI chip constituting one source driver (hereinafter referred to as source driver LSI chip). Note that each of the source drivers Si through Sn is a 64-scale source driver and has a same structure.

More specifically, the source driver LSI chip includes a shift register circuit 71, an input latch circuit 72, a sampling memory circuit 73, a holding memory circuit 74, a reference voltage producing circuit 75, a DA converter circuit 76, and an output circuit 77 which together constitute a driving signal producing section.

Further, on an input side to the input latch circuit 72, an interface circuit 100 is provided. In other words, the interface circuit 100 is provided between a signal input terminal of the source driver LSI chip and the driving signal producing section.

Functions of the blocks will be explained below.

The shift register circuit 71 performs a shifting operation, in response to the start pulse signal SPI which serves as a start pulse signal for the source driver, in accordance with the clock signal supplied through the interface circuit 100. Then, the shift register circuit 71 selects a bit for sampling data, and outputs a start pulse signal (cascade output signal SPO) for a next-stage source driver LSI, from the last stage of the shift register circuit 71 of the current-stage source driver LSI.

Thus, only regarding the source driver Si among the source drivers SI through Sn provided to the liquid crystal panel 50, the start pulse signal SPI is supplied from outside thereto. As to each of the other source drivers, the cascade output signal SPO outputted from the last stage of the shift register circuit 71 of the previous-stage source driver LSI is supplied thereto as the start pulse signal.

For example, as shown in FIG. 8, in the case where four source drivers are provided to the liquid crystal panel 50, the start pulse signal for the first-stage source driver Si is the start pulse signal SPI, but regarding the other source drivers S2 through S4, the output signals SPO of the previous-stage source drivers S1 through S3 are supplied thereto as the start pulse signals, respectively.

The input latch circuit 72 temporarily latches the display data signals DATA (6 bits per each of R, G, and B) supplied thereto, and thereafter it transfers the signals to the sampling memory circuit 73. More specifically, to the sampling memory circuit 73, the input display data signals DATA are supplied by time sharing. Incidentally, the display data signals DATA inputted to the input latch circuit 72 are signals resulting on level shifting by the interface circuit 100. Details of the interface circuit 100 will be described later.

The sampling memory circuit 73 samples and stores the data supplied thereto by time sharing.

The holding memory circuit 74 latches data (display data signals) stored in the sampling memory circuit 73 all together, in response to a signal LS inputted to the holding memory circuit 74.

The reference voltage producing circuit 75 produces voltages of 64 levels by resistance dividing, based on a reference voltage of a signal Vref.

The DA converter circuit 76 generates an analog signal in accordance with the display data signal, and sends the analog signal to the output circuit 77.

The output circuit 77 amplifies the analog signal of 64 levels supplied from the DA converter circuit 76 by using an output buffer circuit, and outputs the amplified signal through an output terminal.

The source driver for display of 64 scales of color gradation can be explained as above, and a timing chart of signals in this case is shown in FIG. 9.

Here, the following description will explain the interface circuit 100 incorporated in the source driver LSI chip.

Figure 1:
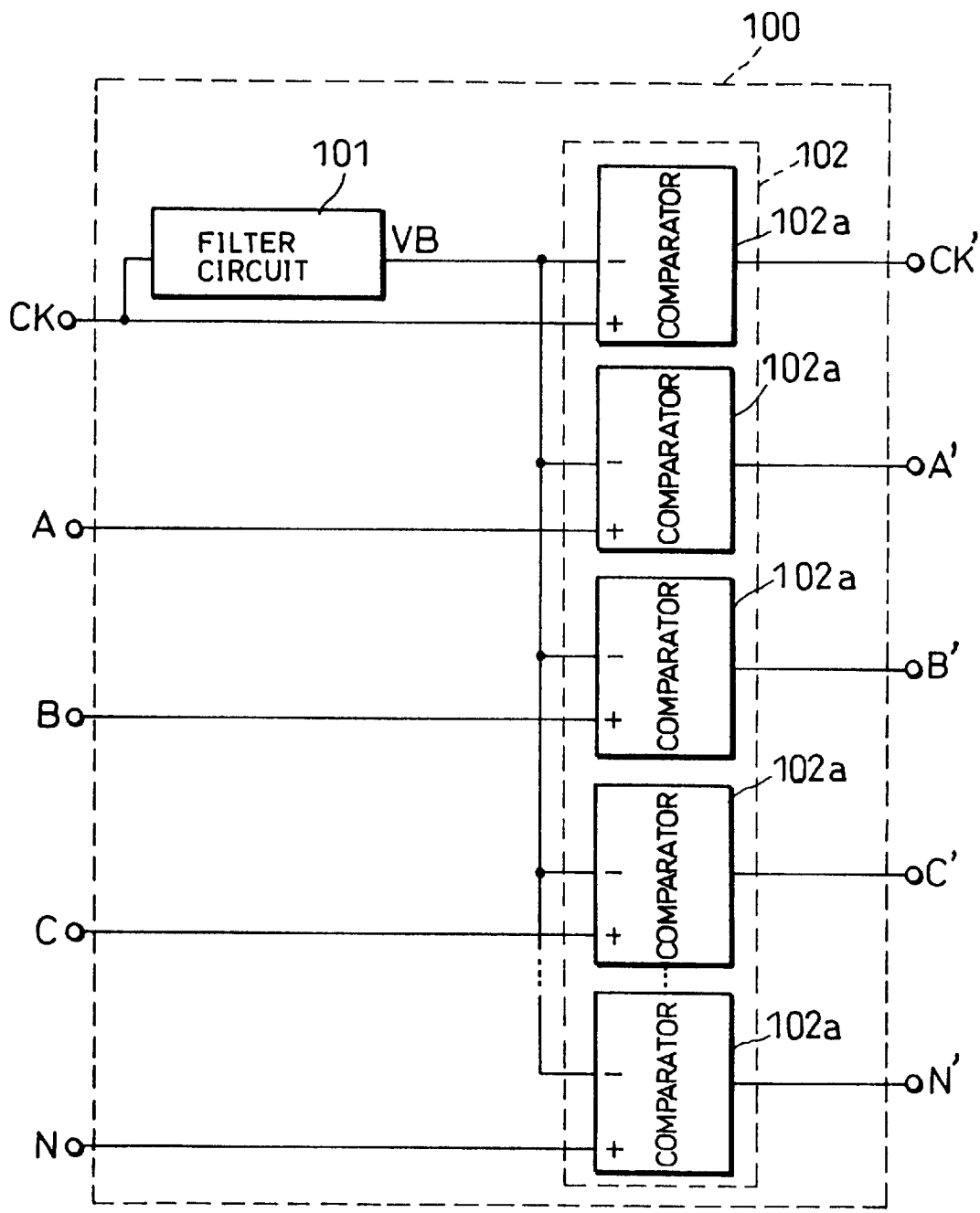
FIG. 1 is a block diagram illustrating a schematic arrangement of an interface circuit in accordance with an embodiment of the present invention.

The interface circuit 100 is composed of a filter circuit 101 which is a low-pass filter, and a comparator circuit 102 constituted by a plurality of comparators 102a, as shown in FIG. 1.

In FIG. 1, CK, A, B, C, . . ., N denote input terminals for small-amplitude digital signals. More specifically, CK denotes a clock signal input terminal, and A, B, C, . . ., N denote data signal input terminals, respectively. To noninverting input (+) terminals of the comparators 102a, the clock signal and data signals having small amplitudes which have been inputted through the input terminals CK, . . ., N are supplied, respectively. On the other hand, a reference voltage signal VB which is obtained by filtering the clock signal through the filter circuit 101 is supplied to every inverting input (−) terminal of the comparator 102a.

Therefore, in the interface circuit 100, comparison and level shifting are carried out by the comparators 102a with respect to the plurality of the small-amplitude data signals thus inputted thereto, and digital signals (a clock signal and data signals) having great amplitudes are outputted from the comparators 102a. CK', A', B', C', . . ., N' denote output terminals for digital signals with high amplitudes, and concretely, CK' denotes a clock signal output terminal and A', . . . N' denote data signal output terminals, respectively.

Figure 10:
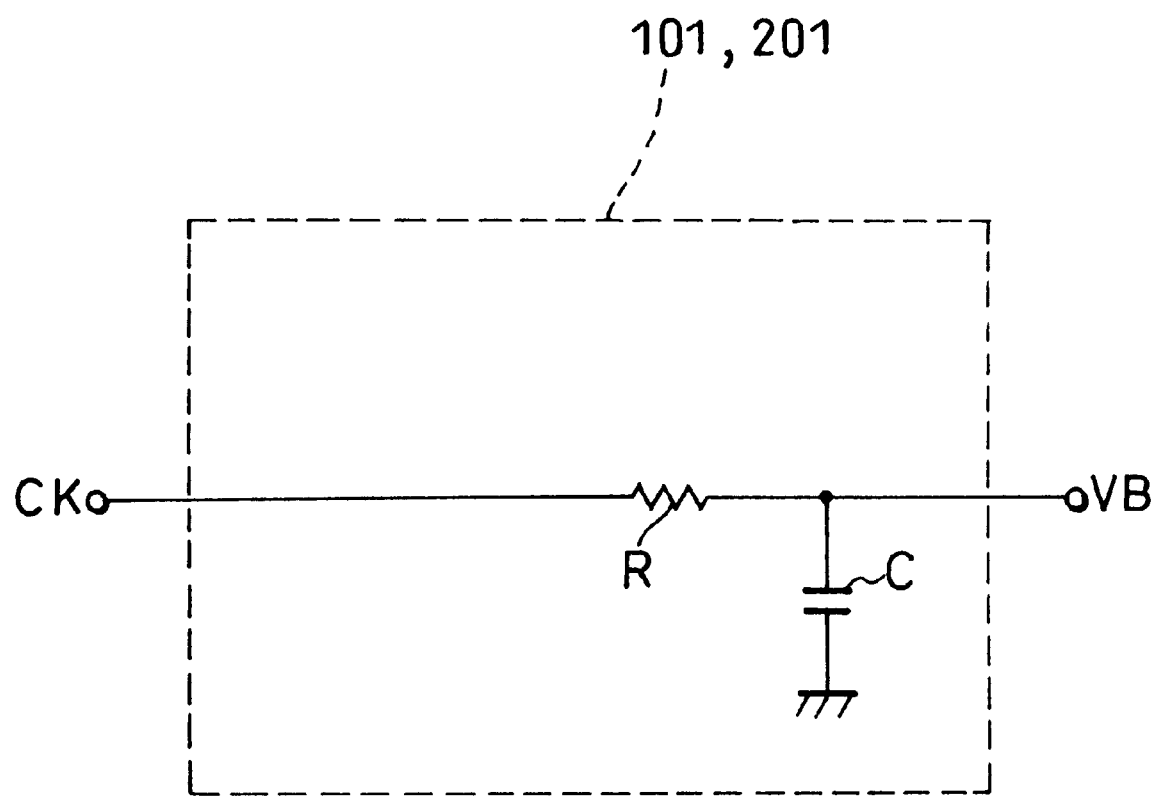
FIG. 10 is a circuit diagram of a low-pass filter provided in the interface circuit shown in FIG. 1.

The filter circuit 101 is composed of a resistive element R and a capacitive element C, as shown in FIG. 10, that is, the filter circuit 101 has an arrangement identical to that of a generally used filter circuit. To be more specific, the clock signal input terminal CK is connected with an end of the resistive element R, and the other end of the resistive element R is connected with an electrode of the capacitive element C and an output terminal of the filter circuit 101 (through which the reference voltage signal VB is outputted). The other electrode of the capacitive element C is grounded.

Therefore, in the case where the frequency of the clock signal supplied through the input terminal CK is set sufficiently higher than a cut-off frequency of the low-pass filter composed of the resistive element R and the capacitive element C, the reference voltage signal VB is made to have a mean level of the levels of amplitude voltages of the clock signal is outputted. Incidentally, in this case, a duty ratio of the clock signal should be set to 1:1. For example, in the case where a clock signal whose "Low" level is 1 V and whose "High" level is 2 V is supplied to the input terminal CK, the output voltage (reference voltage signal) is a signal of 1.5 V.

Figure 11:
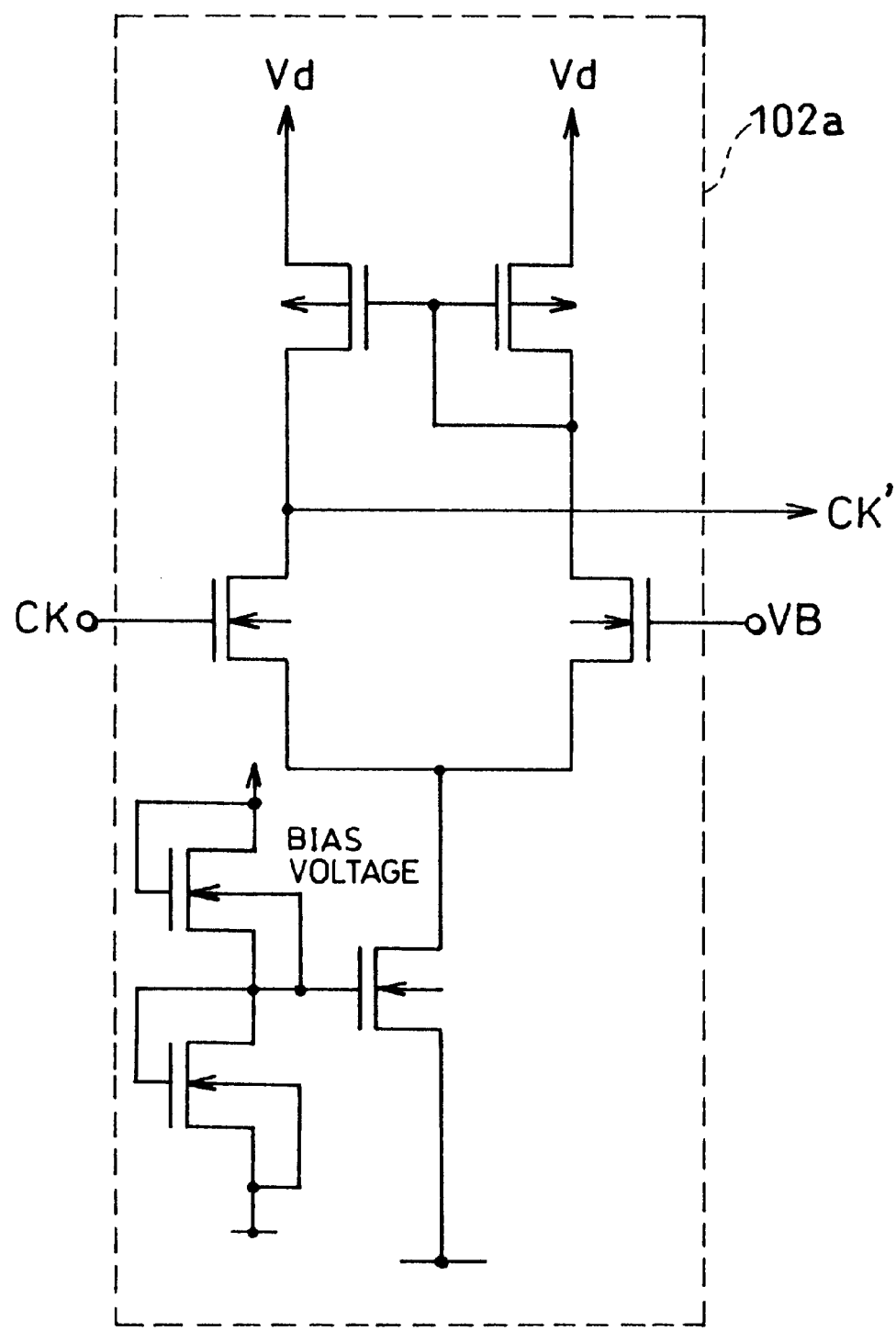
FIG. 11 is a circuit diagram of a comparator provided in the interface circuit shown in FIG. 1.

As the comparator circuit 102, a comparator circuit of a operative amplifier type is used in the present embodiment. FIG. 11 shows a circuit arrangement of the comparator 102a used in the present embodiment. Note that FIG. 11 shows a circuit arrangement of one comparator 102a, and since the other comparators 102a have the same circuit arrangement each, their description is omitted.

The comparator 102a of the operative amplifier type shown in FIG. 11 uses a conventionally well-known N-channel differential amplifier. As to the comparator 102a, a reference voltage signal VB is supplied to an inverting input side thereof from the low-pass filter 101, while the clock signal with a small amplitude is supplied to a non-inverting input side thereof through the input terminal CK.

In an operation, the output CK' comes to have a "High" level or a "Low" level depending on whether a voltage level of the clock signal supplied through the input terminal CK is higher or lower than that of the reference voltage signal VB. By setting the power source voltage Vd higher than the amplitude voltage inputted thereto, a level-shifted (amplified) voltage is outputted.

Figure 12:
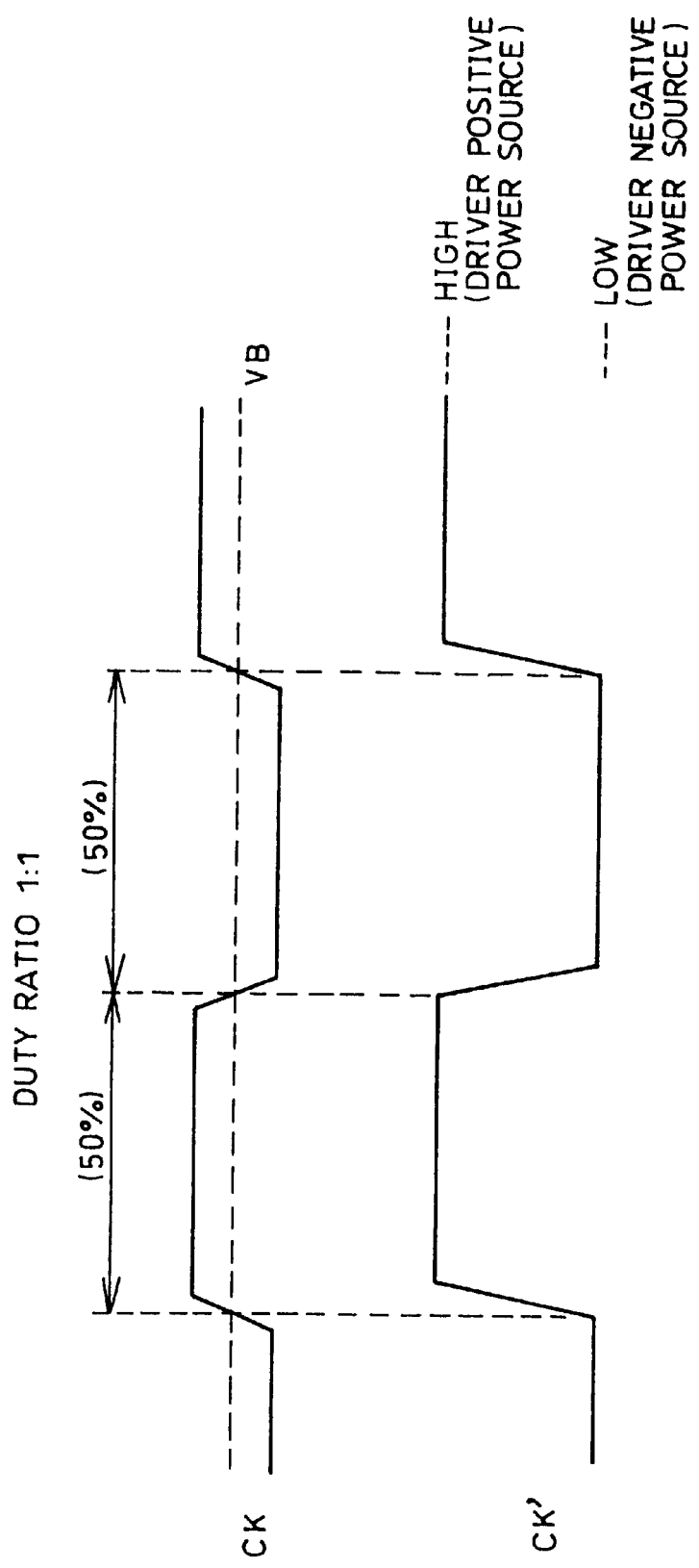
FIG. 12 is a waveform chart showing relationship between an input CK and an output CK' in the interface circuit shown in FIG. 1.
Figure 13:
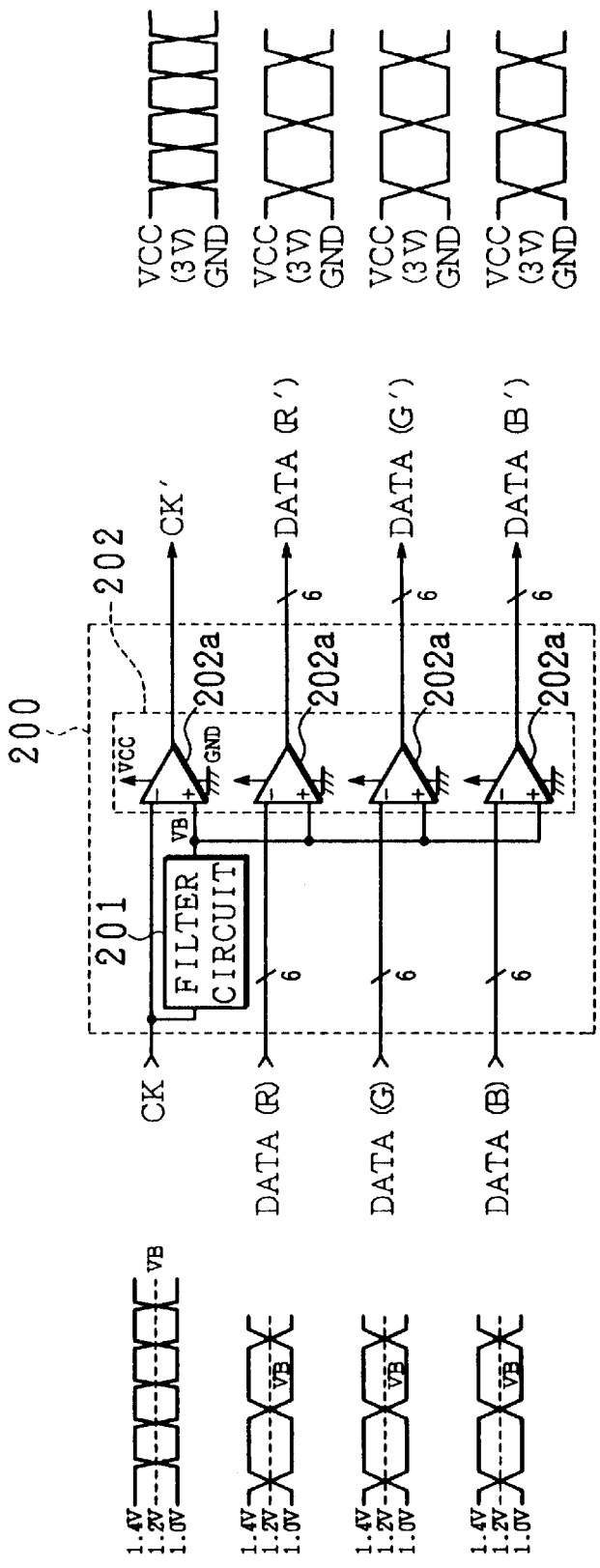
FIGS. 13(a) through 13(c) are views relating an interface circuit in accordance with another embodiment of the present invention.

FIG. 12 is a waveform chart showing relationship between the input CK and the output CK'. From this waveform chart, it is understood that the amplitude of the output CK' is greater than that of the input CK.

In the foregoing description, a section from the filter circuit 101 till one comparator 102a of the comparator circuit 102 outputting the output CK' is explained, and each of the other comparators 102a performs the same operation. More specifically, the output of the filter circuit 101 is supplied to the inverting input side of every comparator 102a, while the data signals with the same amplitudes as that of the clock signal supplied through the input terminal CK are supplied to the non-inverting input sides of the comparators 102a, respectively, whereby an identical operation is performed in each comparator 102a.

Therefore, as shown in FIG. 1, the data signals supplied through the input terminals A, B, C, . . . , N can be made voltages with small amplitudes like the clock signal. In other words, it is possible that the data signals supplied thereto are level-shifted by the comparators 102a of the comparator circuit 102, respectively, thereby, for example, being amplified so as to be suitable for operational voltages for the liquid crystal driving circuit.

Thus, the interface circuit 100 shifts the levels of the clock signal and display data signals which have small amplitudes, thereby converting them to the clock signal and display data signals having great amplitudes, and then, supplies the converted signals to the shift register circuit 71 and the input latch circuit 72.

By so doing, in the case where the interface circuit 100 thus arranged is applied to the source driver group 40 of the TFT-LCD module 1 as shown in FIG. 2, the input signals which usually have high frequencies when being supplied to the liquid crystal driving circuit can be made to have small amplitudes when being supplied thereto. As a result, the EMI noise can be suppressed.

To state differently, the TFT-LCD module 1 in which the interface circuit 100 arranged as above is applied to the liquid crystal driving circuit is capable of reducing the EMI noise by applying the small amplitude differential signal transmitting scheme, and further, it is capable of solving various problems caused by an increase in the number of input lines for display data since there is no need to increase the number of input lines for display data.

Incidentally, the foregoing interface circuit 100 is designed so that a signal obtained by filtering the input clock signal through the filter circuit 101 is supplied to the inverting input (−) terminal of every comparators 102a of the comparator circuit 102, while the input clock signal CK and the display data signals are supplied to the non-inverting input (+) terminals of the comparators 102a, but the arrangement of the interface circuit 100 is not limited to this. For example, a signal obtained by filtering the input clock signal CK through the filtering circuit 101 may be supplied to the non-inverting input (+) terminals of the comparators 102a while the input clock signal and the display data signals may be supplied to the inverting input (−) terminals of the comparators 102a.

An example of a circuit thus arranged is an interface circuit 200 as shown in FIG. 13(b). The interface circuit 200 includes: an input terminal CK and input terminals DATA (6 bits per each of R, G, and B) through which the input clock signal and the display data signals having small amplitudes are supplied, respectively; a filter circuit 201; and a comparator circuit 202 composed of a plurality of the comparators 202a.

The filter circuit 201 is arranged in the same manner as that for the filter circuit 101 shown in FIG. 10. Namely, the filter circuit 201 is composed of the resistive element R and the capacitive element C, like a generally used low-pass filter. More specifically, the input terminal CK for the clock input signal is connected with an end of the resistive element R, and the other end of the resistive element R is connected with an electrode of the capacitive element C and an output terminal of the filter circuit 201 (through which the reference voltage signal VB is outputted) The other electrode of the capacitive element C is grounded.

As to an operation of the same, in the case where the frequency of the clock signal supplied through the input terminal CK is set sufficiently higher than a cut- off frequency of the low-pass filter composed of the resistive element R and the capacitive element C, the reference voltage signal VB is made to have a mean level of the levels of amplitude voltages of the clock signal is outputted. Incidentally, in this case, a duty ratio of the clock signal should be set to 1:1.

For example, in the case where a clock signal whose "Low" level is 1 V and whose "High" level is 1.4 V is supplied to the input terminal CK as shown in FIG. 13(a), the output voltage (reference voltage signal) is a signal of 1.2 V.

In the foregoing comparator circuit 202, the clock signal and display data signals with small amplitudes which have been supplied through the input terminals CK and DATA (6 bits per each of R, G, B), respectively, are supplied to the inverting input (−) terminals, respectively, whereas the reference voltage signal VB obtained by filtering the clock signal CK through the filter circuit 201 is supplied to every non-inverting input (+) terminal. Here, for conveniences' sake, four types of signals, namely, the clock signal and the display data signals of R, G, and B, are taken into consideration as signals inputted thereto. Therefore, the comparators 202a of the comparator circuit 202 are four in number. This applies to cases of the following descriptions.

Figure 14:
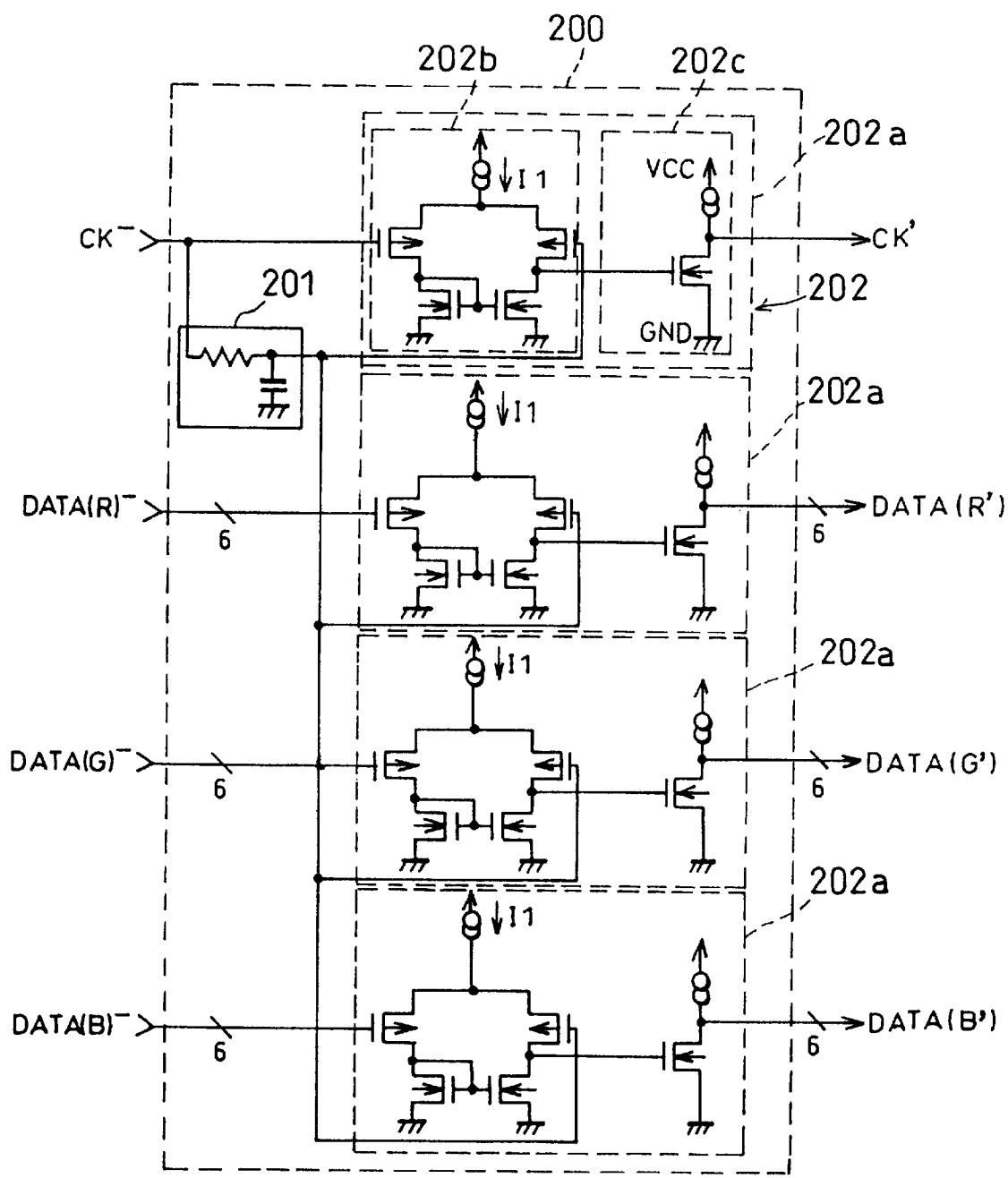
FIG. 14 is a circuit diagram of a comparator provided in the interface circuit shown in FIG. 13(b).

A concrete example of each comparator 202a is, for example, composed of a comparing circuit 202b constituted by a differential amplifier, and a source follower circuit 202c with an extremely small impedance, as shown in FIG. 14.

The comparators 202a conduct comparison and level shifting with respect to the clock signal and the display data signals, thereby outputting digital signals with great amplitudes (a clock signal and display data signals). In FIG. 14, CK' and DATA (6 bits per each of R', G', and B') denote output terminals of digital signals with great amplitudes, and specifically, CK' denotes a clock signal output terminal, while DATA (6 bits per each of R', G', and B') denote display data signal output terminals.

Figure 15:
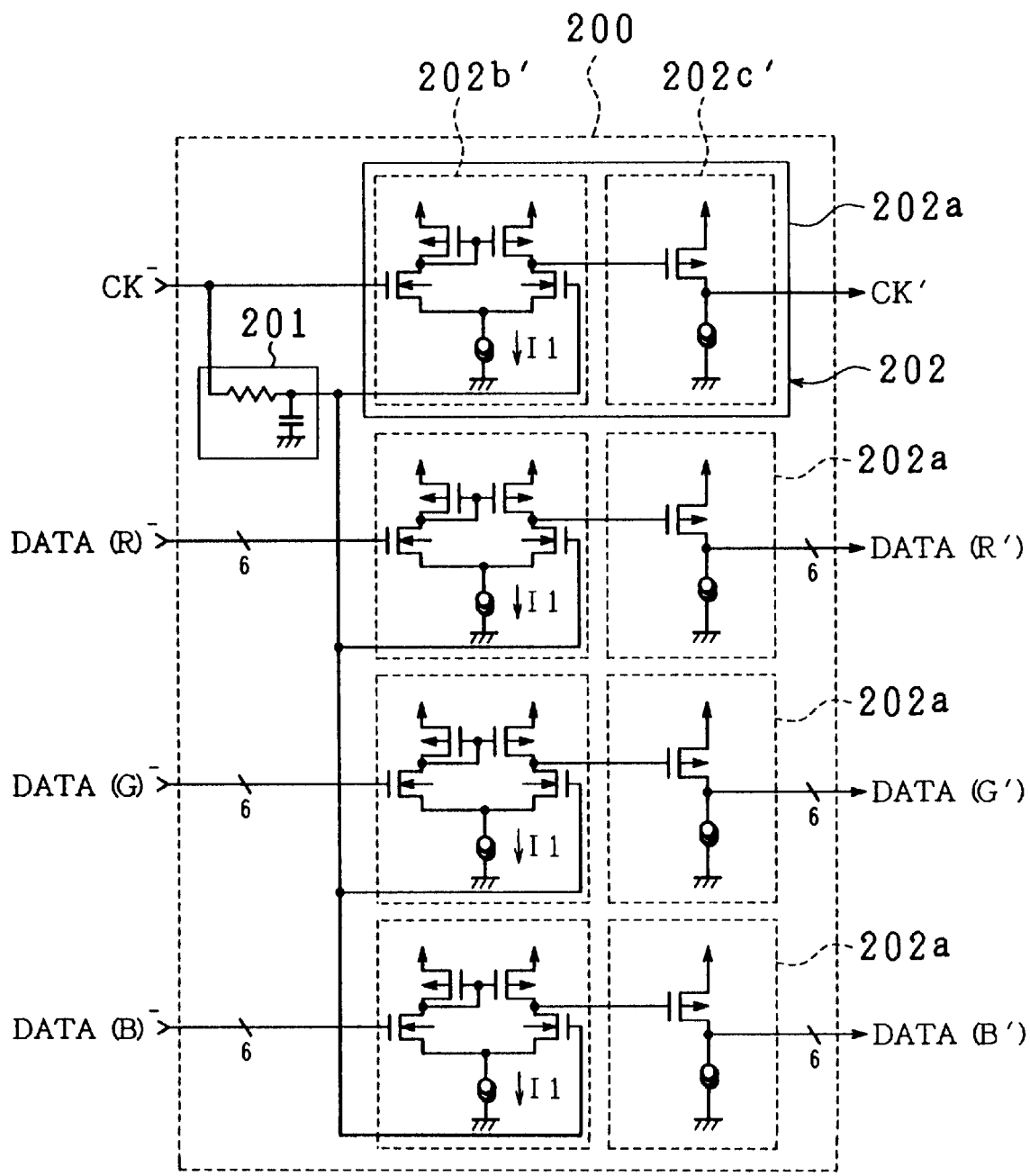
FIG. 15 is a circuit diagram of another comparator provided in the interface circuit shown in FIG. 13(b).

Incidentally, the foregoing comparator 202a is composed of (i) the comparing circuit 202b constituted by a P-channel differential amplifier in which P-channel transistors are used for non-inverting input and inverting input and (ii) the source follower circuit 202c, but the arrangement of the comparator 202a is not limited to this. For example, as shown in FIG. 15, the comparator 202a may be composed of a comparing circuit 202c' constituted by a N-channel differential amplifier, and a source follower circuit 202c'.

The following description will explain an operation of the foregoing interface circuit 200, while referring to FIGS. 13(a) through 13(c).

In the operation of the interface circuit 200 shown in FIG. 13(b), first of all, whether each of voltage levels of the clock signal and the display data signals supplied through the input terminals is higher or lower than the voltage level of the reference voltage signal VB is judged. Then, based on the result of the judgement, the power source voltages VCC of the comparators 202a are set higher than input amplitude voltages, and by so doing, each of voltages of signals outputted through the output terminals CK' and DATA (6 bits per each of R', G', B') is shifted (amplified) to the "High" level or the "Low" level. Then, signals with low impedances are outputted from the source follower circuits (not shown).

To concretely explain, in the case where, as shown in FIG. 13(a) for example, the "Low" level and the "High" level of the clock signal and the display data signals supplied through the input terminals are 1.0 V and 1.4 V, respectively, the reference voltage signal VB is converted by the low-pass filter 201 to an output voltage of 1.2 V. Then, by using the output voltage (reference voltage signal VB) of 1.2 V as reference, whether the voltage levels of the clock signal and the display data signals supplied through the input terminals are higher or lower than the reference is judged by the comparators 202a, respectively. By setting the power source voltage VCC of the comparators 202a to 3V which is equal to that for the source driver LSI, signals amplified so as to have a "Low" level of 0 V and a "High" level of 3 V, as shown in FIG. 13(c), are outputted to the output terminals CK' and DATA (6 bits per each of R', G', B') of the comparators 202a.

As described above, the interface circuit 200 is arranged so as to convert a inputted clock signal and display data signals which have small amplitudes to a clock signal and display data signals which have great amplitudes, and to supply the converted signals to the shift register circuit 71 and the input latch circuit 72, respectively. With this arrangement, as in the case where the aforementioned interface circuit 100 is used, a high-frequency input signal can be inputted with a small amplitude, and as a result, the EMI noise can be reduced.

Figure 16:
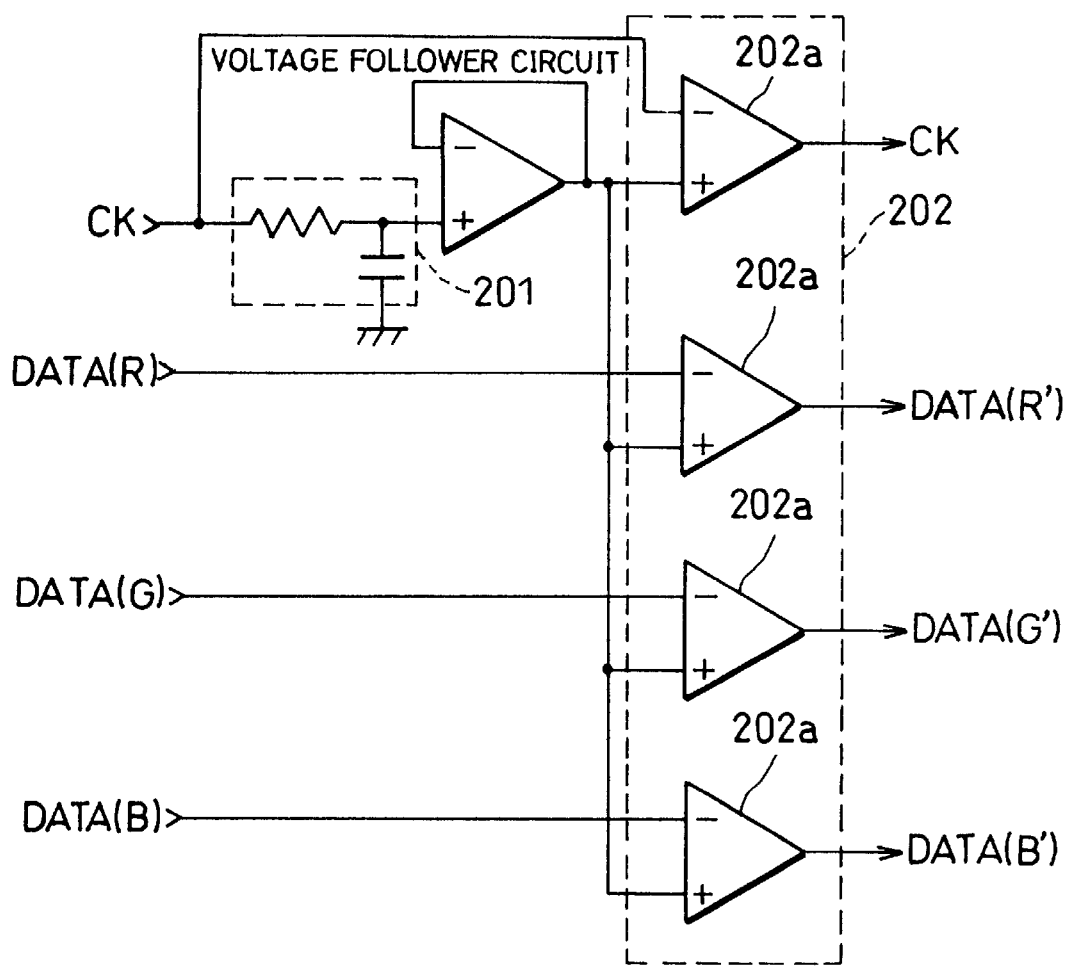
FIG. 16 is a block diagram illustrating another arrangement of the interface circuit shown in FIG. 13(b).

Incidentally, in the case where many comparators 202a are provided in the comparator circuit 202, loads due to paths through which the signals are supplied to the non-inverting input (+) terminals of the comparators 202a are different between the comparators 202a positioned close to the low-pass filter 201 and the comparators 202a positioned far therefrom. Therefore, to eliminate the loads, providing a voltage follower circuit between the filter circuit 201 and the comparator circuit 202 is thought of, as shown in FIG. 16.

The arrangement in accordance with the present embodiment ensures reduction of the input terminals for the clock signal CK and the display data signals DATA to half, as compared with the conventional arrangement of the small amplitude differential signal transmitting scheme. However, it is necessary to raise the response speed by flowing much current through the constant power source, so that the differential amplifier can follow a speed of a signal inputted to the comparator circuit even in the case where the speed of the signal is extremely high. As a result, power consumption rises. Then, an arrangement to ensure reduction of power consumption will be explained as a second embodiment in the following description.

[Second Embodiment]

The following description will explain another embodiment of the present invention, while referring to FIGS. 17 through 39. Note that the members having the same structure (function) as those in the first embodiment will be designated by the same reference numerals and their description will be omitted.

Figure 17:
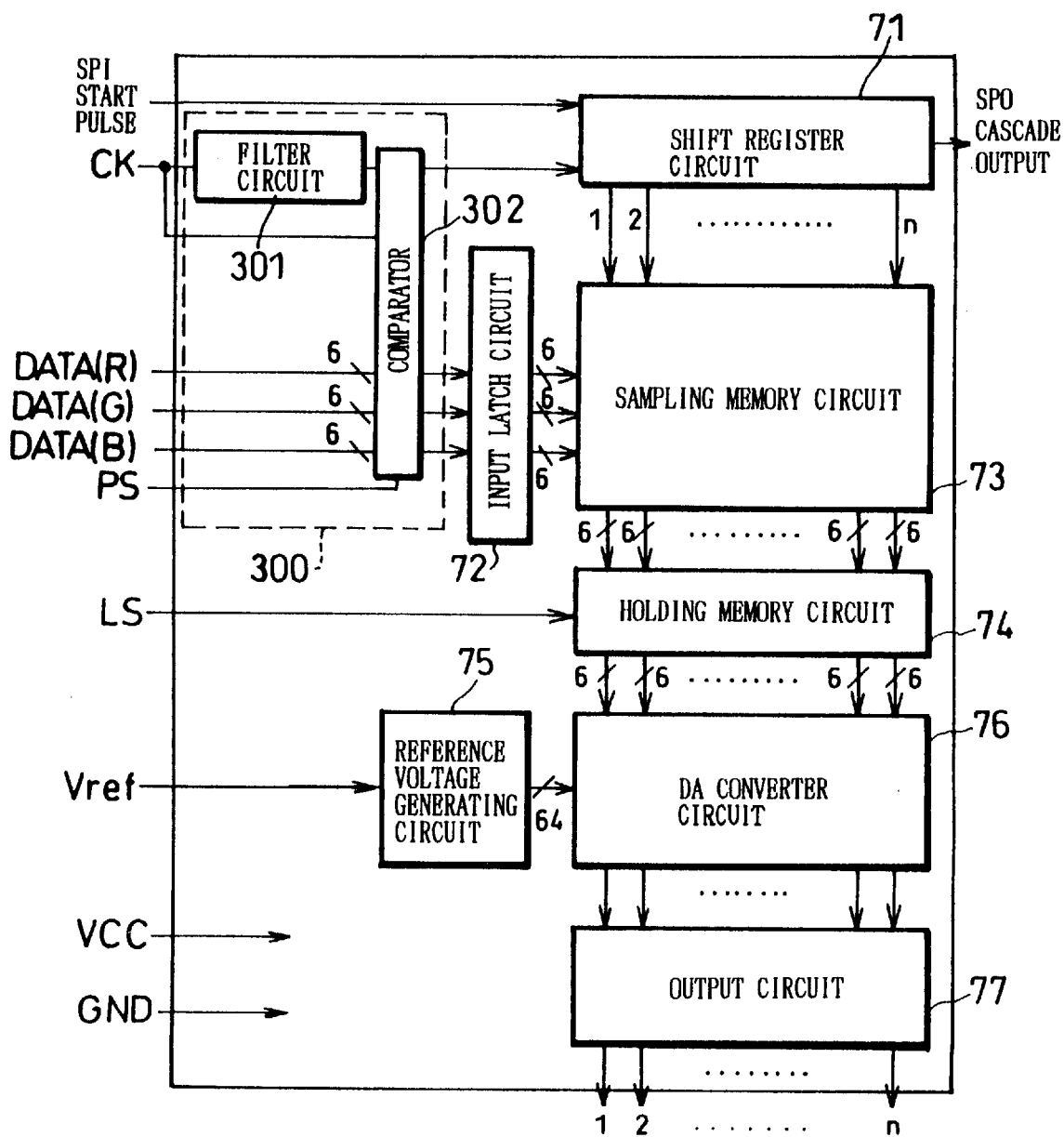
FIG. 17 is a block diagram illustrating a schematic circuit arrangement of a source driver LSI chip in accordance with another embodiment of the present invention.

An arrangement of a source driver in accordance with the present embodiment is substantially the same as that of the source driver of the first embodiment which is explained with reference to FIG. 7, except that an interface circuit 300 which is slightly different from the interface circuit 100 shown in FIG. 7 is used in the source driver of the present embodiment, as shown in FIG. 17.

The interface circuit 300 is composed of a filter circuit 301 which is a low-pass filter, and a comparator circuit 302. To the comparator circuit 302, a control signal PS is supplied from outside.

More specifically, in the interface circuit 300 shown in FIG. 17, in response to input of the control signal PS to the comparator circuit 302, opening and closing of the comparator circuit 302 is selectively carried out, so that unnecessary power consumption in a non-operating state is prevented. In other words, the comparator circuit 302 is arranged so as to have a power saving function. The comparator circuit 302 having the power saving function will be more concretely explained later.

Figure 18:
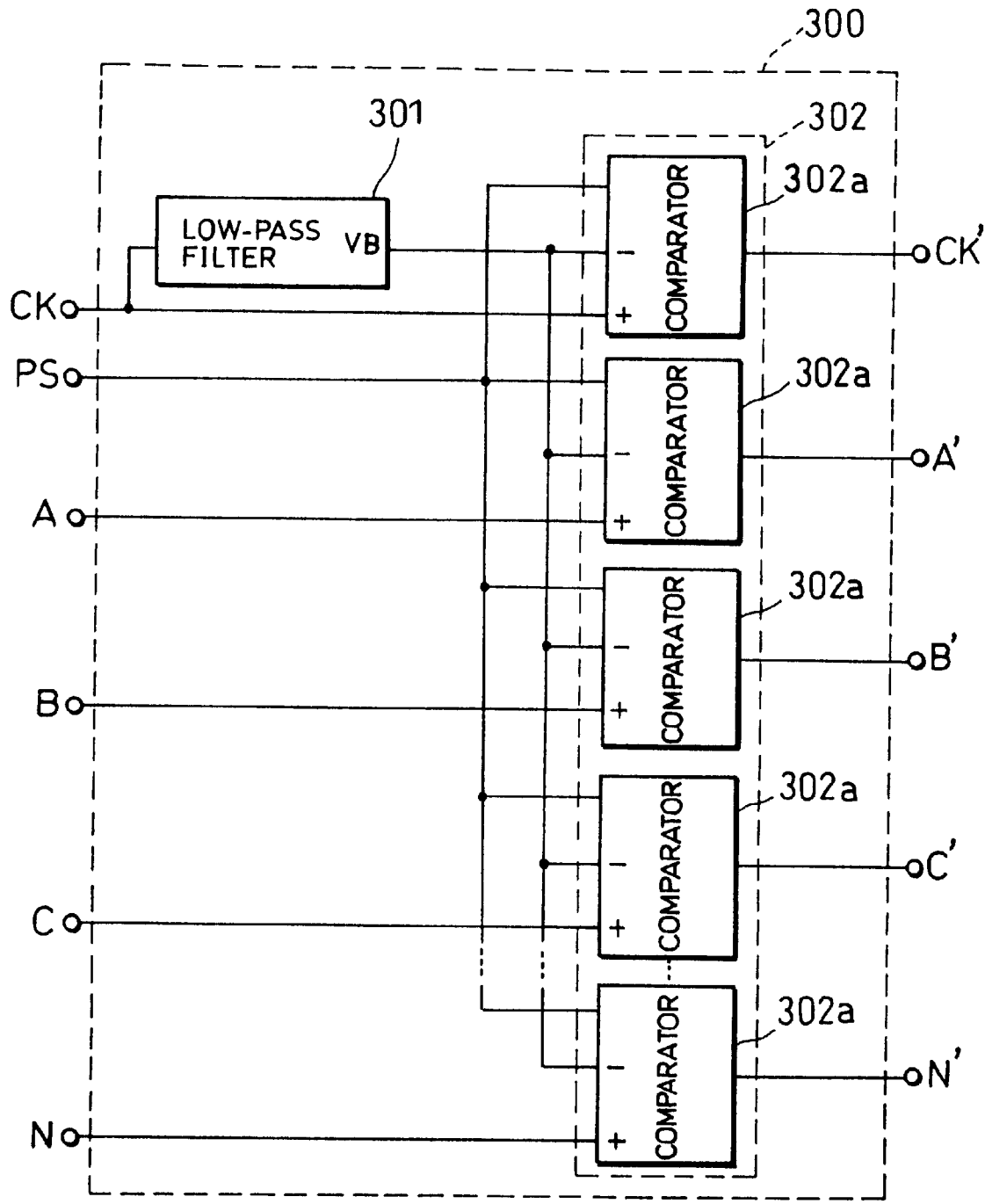
FIG. 18 is a block diagram illustrating a schematic arrangement of an interface circuit provided in the source driver LSI chip shown in FIG. 17.

FIG. 18 is a block diagram illustrating an arrangement of the interface circuit 300 incorporating the comparator circuit 302 with the power saving function.

In FIG. 18, CK, A, B, C, . . . , N denote input terminals for small-amplitude digital signals, and more specifically, CK denotes a clock signal input terminal, and A, . . . , N denote data signal input terminals, respectively.

Further, the comparator circuit 302 has a plurality of comparators 302a which have the power saving function each. Non-inverting input (+) terminals of the comparators 302a are supplied with the small-amplitude clock signal and data signals inputted through the input terminals CK, . . . N, respectively. On the other hand, inverting input (−) terminals of the comparators 302a are all supplied with a reference voltage signal VB which is obtained by filtering the clock signal through the filter circuit 301. Furthermore, a power saving control signal inputted through a power saving control signal input terminal PS is supplied to the comparators 302a.

The comparators 302a perform comparison and level shifting with respect to the small-amplitude data signals supplied thereto and output great-amplitude digital signals (clock signal and data signals).

In FIG. 18, CK', A', B', C', . . . , N' denote output terminals for great-amplitude digital signals, and more specifically, CK' denotes a clock signal output terminal, and A', . . . , N' denote data signal output terminals, respectively.

Here, the following description will concretely explain the comparator circuit 302. Note that the plurality of the comparators 302a constituting the comparator circuit 302 have the same arrangement each, and here, the comparator 302a to which CK is inputted and from which CK' is outputted will be explained.

Figure 19:
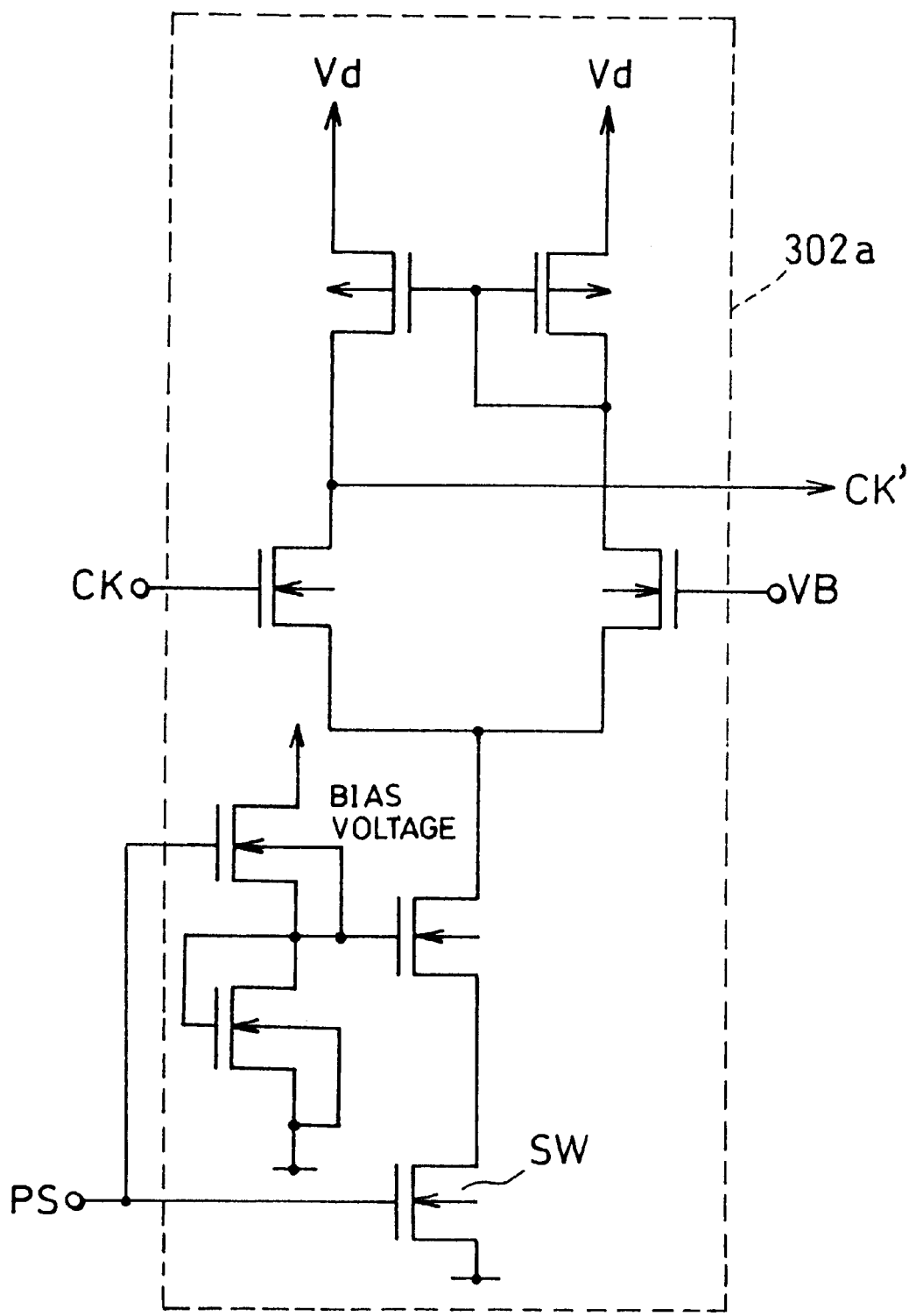
FIG. 19 is a circuit diagram of a comparator with a power saving function which is provided in the source driver LSI chip shown in FIG. 17.

The comparator 302a is arranged as follows, as shown in FIG. 19: a switching element SW composed of a MOS transistor is provided in the circuit, and is controlled in response to the control signal PS supplied from outside so as to be closed and opened thereby becoming conductive and non-conductive. With this arrangement, unnecessary power consumption of the comparator 302a in the non-operating state can be prevented.

To be more specific, in response to the control signal at a "High" level to the control signal input terminal PS of the comparator 302a, the switching element SW is closed so as to become conductive, thereby causing the comparator 302a to carry out a predetermined comparing/level-shifting operation. On the other hand, in response to input of the control signal at a "Low" level to the control signal input terminal PS, the switching element SW is opened so as to become non-conductive, thereby causing the comparator 302a to suspend its operation.

Therefore, by supplying the control signal of the "low" level to the control signal input terminal PS when the comparator 302a is in a non-operating state, unnecessary power consumption of the comparator 302a in the non-operating state can be avoided.

In the case where the interface circuit 300 thus arranged so as to include comparators having the power saving function is provided at a signal input section (a section for input of the clock signal and the display data signals) of the liquid crystal driving circuit, the following effects can be achieved. Incidentally, the following description takes as an example a liquid crystal driving circuit for 64-scale display.

The liquid crystal driving circuit incorporating the interface circuit 300 which includes comparators having the power saving function is arranged so that the interface circuit 300 converts a clock signal and display data signals which have small amplitudes to a clock signal and display data signals which have great amplitudes, respectively, and supplies them to the shift register circuit 71 and the input latch circuit 72, respectively. This arrangement makes it possible that a high-frequency input signal is inputted with a small amplitude, and as a result, the EMI noise can be suppressed.

Furthermore, in the interface circuit 300, the comparators 302a with the power saving function are used. Therefore, the liquid crystal driving circuits may be arranged as follows: among the plurality of the liquid crystal driving circuits which are cascaded, the power saving control signals of the "High" level are supplied only to the interface circuits 300 of the liquid crystal driving circuits currently performing the data input operation, and the power saving control signals of the "Low" level are supplied to the interface circuit 300 of the other liquid crystal driving circuits. By so doing, only the comparators 302a in the liquid crystal driving circuits performing the data input operation are caused to be in an operating state, whereas the comparators 302a of the interface circuits 300 of the other liquid crystal driving circuits are caused to be in a non-operating state. As a result, unnecessary power consumption can be prevented.

Incidentally, the present embodiment is explained by taking as an example a case where the power saving control signal is generated outside the interface circuit 300, but the present embodiment is not limited to this, and means for producing the power saving control signal may be provided inside the interface circuit.

Figure 20:
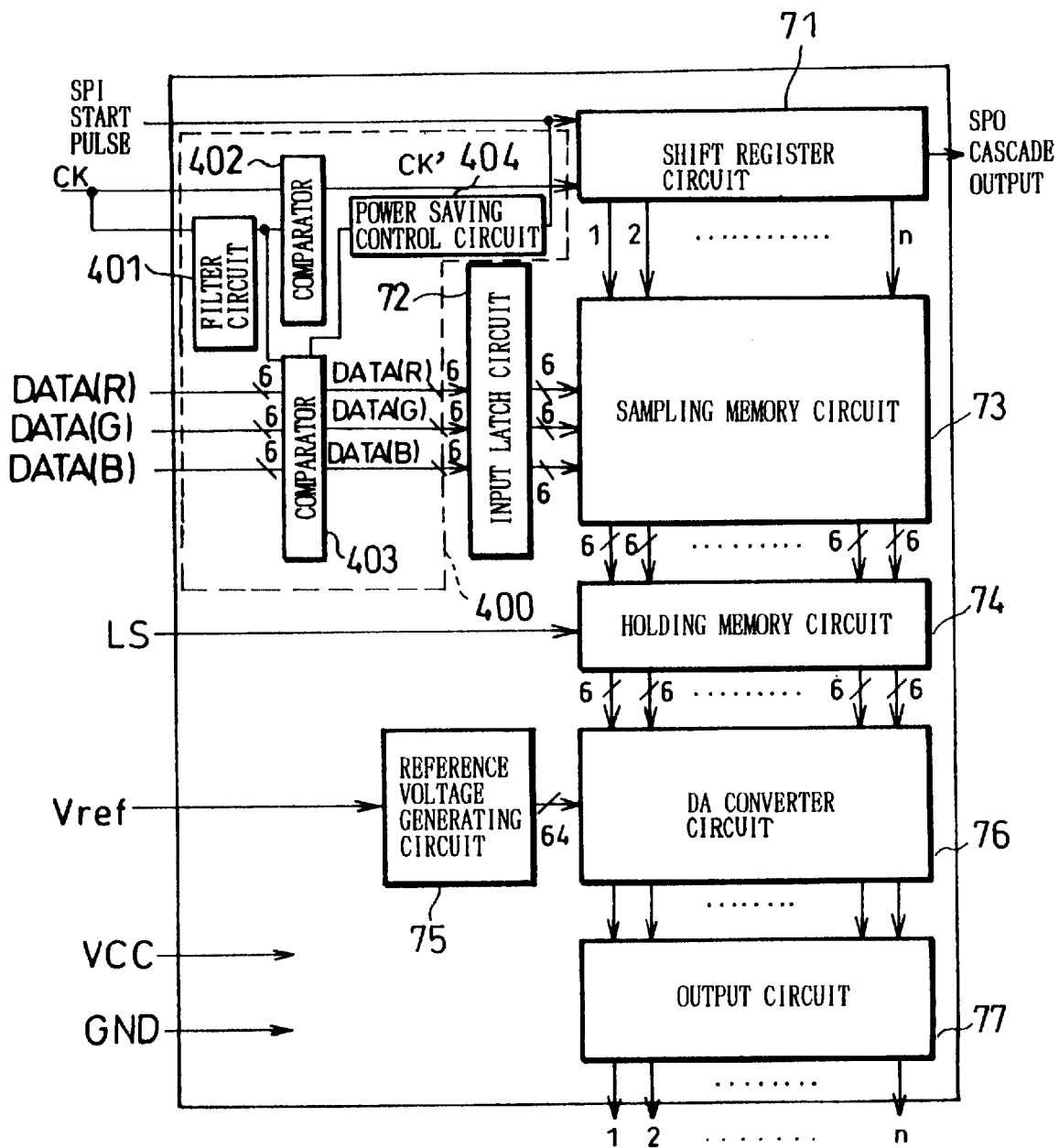
FIG. 20 is a block diagram illustrating a schematic circuit arrangement of a source driver LSI chip in accordance with another embodiment of the present invention.
Figure 21:
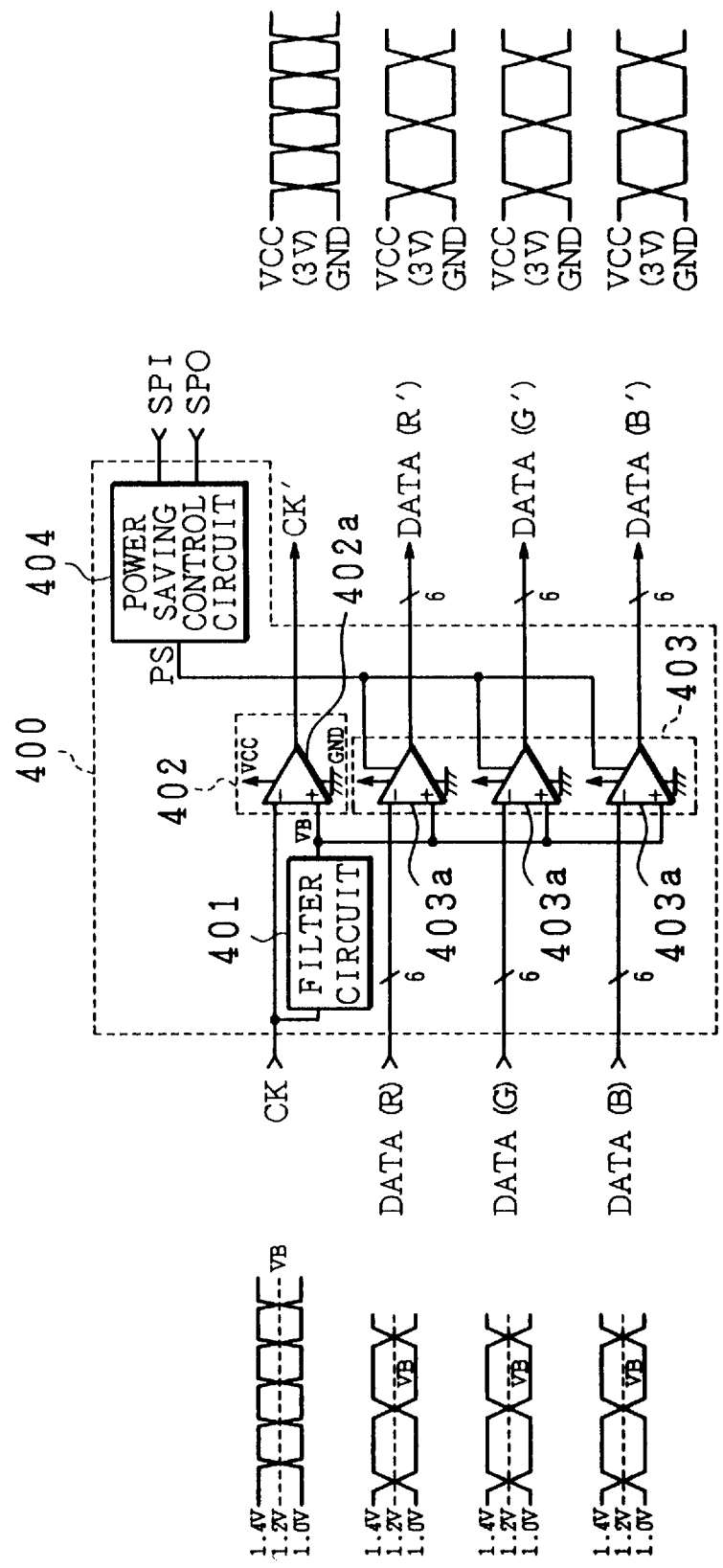
FIGS. 21(a) through 21(c) are views relating to an interface circuit provided in the source driver LSI chip shown in FIG. 20.

FIG. 20 is a block diagram of a liquid crystal driving circuit arranged in an identical manner in the case where it is adapted so as to be used as a source driver for 64-scale display. The source driver includes the shift register circuit 71, the input latch circuit 72, the sampling memory circuit 73, the holding memory circuit 74, the reference voltage producing circuit 75, the DA converter circuit 76, and the output circuit 77, as well as an interface circuit 400 in a section for input of the clock signal CK and the display data signals DATA (6 bits per each of R, G, B).

As shown in FIG. 21(b), for example, the interface circuit 400 has an input terminal CK and input terminals DATA (6 bits per each of R, G, B) for digital signals with small amplitudes, and is equipped with a filter circuit 401 which is a low-pass filter, a first comparator circuit 402 which is a usual comparator 402a, and a second comparator circuit 403 composed of a plurality of comparators 403a having the power saving function, and a power saving control circuit 404.

To an inverting input (−) terminal of the comparator 402a constituting the first comparator circuit 402, a small-amplitude clock signal as shown in FIG. 21(a), which is inputted through the input terminal CK is supplied.

To inverting input (−) terminals of the comparators 403a constituting the second comparator circuit 403, display data signals supplied through the input terminals DATA (6 bits per each of R, G, B) are supplied, respectively.

To every non-inverting input (+) terminal of the comparators 402a and 403a, a signal obtained by filtering, through the filter circuit 401, the clock signal supplied through the input terminal CK is supplied.

Furthermore, to the comparators 403a having the power saving function, the power saving control signal supplied through the output terminal PS of the power saving control circuit 404 is supplied.

To input terminals SPI and SPO of the power saving control circuit 404, the start pulse signal and the cascade output signal are supplied, respectively.

The clock signal and the display data signals are subject to comparison and level shifting by the comparators 402a and 403a, thereby being converted to digital signals with great amplitudes (the clock signal, and the display data signals) and outputted.

In FIG. 21(b), CK', DATA (6 bits per each of R', G', and B') denote output terminals for the digital signals with great amplitudes, and more specifically, CK' denotes a clock signal output terminal, while DATA (6 bits per each of R', G', and B') denote display data signal output terminals, respectively.

In the case where, as shown in FIG. 21(a) for example, the "Low" level and the "High" level of the clock signal and the display data signals supplied through the input terminals are 1.0 V and 1.4 V, respectively, the reference voltage signal VB is converted by the low-pass filter as the filter circuit 401 to an output voltage of 1.2 V. Then, by using the output voltage (reference voltage signal VB) of 1.2 V as reference, whether the voltage levels of the clock signal and the display data signals supplied through the input terminals CK and DATA are higher or lower than the reference is judged by the comparators 402a and 403a, respectively. By setting the power source voltage VCC of the first and second comparator circuits 402 and 403 to 3 V which is equal to that for the source driver LSI chip, signals outputted from the output terminal CK' of the first comparator circuit 402 and from the output terminals DATA (6 bits per each of R', G', and B') of the second comparator circuit 403 are amplified so as to have a "Low" level of 0 V and a "High" level of 3 V, as shown in FIG. 21(c).

Figure 22:
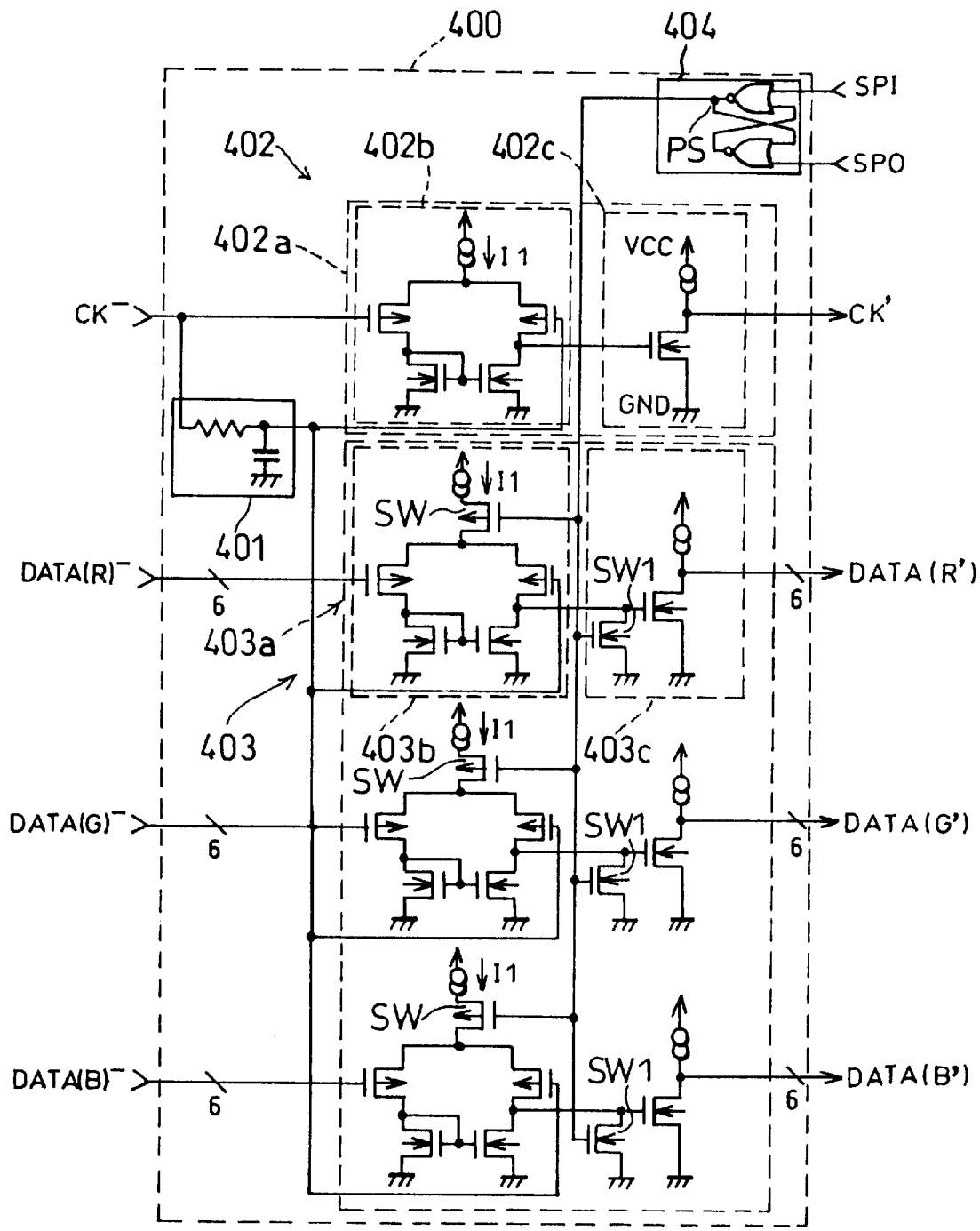
FIG. 22 is a circuit diagram of comparators provided in the interface circuit shown in FIG. 21(b).

The following description will explain concrete arrangements of the first comparator circuit 402 and the second comparator 403, while referring to FIG. 22.

The first comparator circuit 402 is equipped with the comparator 402a, and the comparator 402a is, like the aforementioned comparator 202a shown in FIG. 14, composed of (i) a comparing circuit 402b which is a differential amplifier and (ii) a source follower circuit 402c with an extremely small output impedance.

Each of the comparators 403a constituting the second comparator circuit 403 is, like the aforementioned comparator 202a shown in FIG. 14, composed of (i) a comparing circuit 403b which is a differential amplifier and (ii) the source follower circuit 403c with an extremely small output impedance.

The comparing circuit 403b is arranged as follows. A switching element SW composed of a MOS transistor is inserted in a current path of the comparing circuit 403b. The switching element SW is arranged so that the power saving control signal is supplied thereto through the output terminal PS of the power saving control circuit 404 which is composed of a NOR gate RS flip-flop (latch circuit). By so doing, in response to the power saving control signal, the comparing circuit 403b allows current to flow through the circuit or prevents the current from flowing.

To prevent an input gate of the source follower circuit 403c from becoming in a floating state in a situation in which the switching element SW is opened, a switching element SW1 is inserted in a path connecting the output terminal of the comparing circuit 403b with the input terminal of the source follower circuit 403c. Therefore, unnecessary power consumption in the non-operating state can be avoided.

Figure 23:
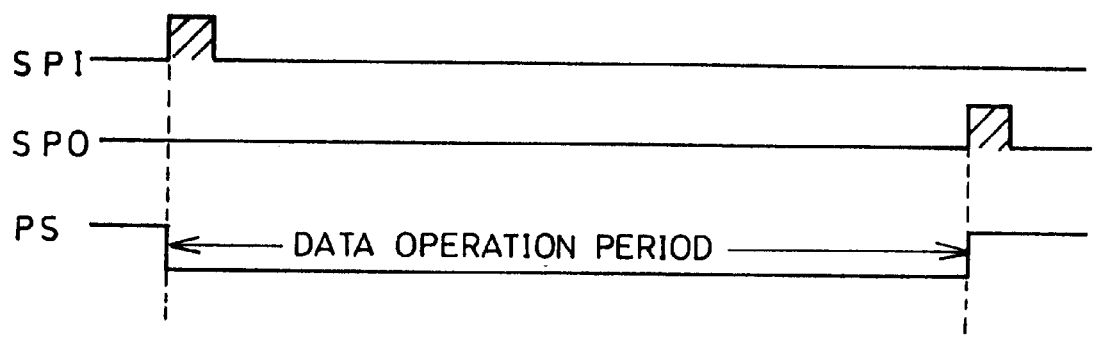
FIG. 23 is a waveform chart of a control signal for the comparators shown in FIG. 22.

Regarding an operation of the power saving circuit 404, as shown in FIG. 23, a control signal at the "Low" level is outputted through the output terminal PS, when the level of the start pulse signal supplied to the input terminal SPI becomes "High" in a state in which both the levels of the start pulse signal and the cascade output signal supplied to the input terminals SPI and SPO respectively are "Low." On the other hand, a control signal at the "High" level is outputted through the output terminal PS, when the level of the cascade output signal supplied to the input terminal SPO becomes "High" in a state in which both the levels of the start pulse signal and the cascade output signal supplied to the input terminals SPI and SPO respectively are "Low." Therefore, a period since a rise of the signal supplied to the input terminal SPI until a rise of the signal supplied to the input terminal SPO is a DATA operation period.

More specifically, in response to the control signal outputted from the output terminal PS of the power saving control circuit arranged as described above, the switching element SW of the comparing circuit 403b is closed so as to become conductive, and the switching element SW1 of the source follower circuit 403c is opened so as to become non-conductive, thereby causing the comparing circuit 403b and the source follower circuit 403c to perform the predetermined comparing and level-shifting operation and output a signal with a low impedance. Note that this state is maintained even after the level of the signal supplied to the input terminal SPI changes from the "High" level to the "Low" level.

Subsequently, in response to transition from this state to the state in which the level of the signal supplied to the input terminal SPO becomes "High," a control signal at the "High" level is outputted to the output terminal PS. Here, the switching element SW of the comparing circuit 403b is opened so as to become non-conductive while the switching element SWI of the source follower circuit 403c is closed so as to become conductive, thereby causing the comparing circuit 403b and the source follower circuit 403c to suspend their operations.

Thus, to prevent the input gate of the source follower circuit 403c from becoming in a floating state in a situation in which the switching element SW is opened so as to become non-conductive, the switching element SW1 is closed so as to become conductive, thereby ensuring that the source follower circuit 403c suspends its operation.

Furthermore, the power saving control circuit 404 is composed of a NOR gate RS flip-flop as described above, but it is not limited to this. For example, as shown in FIG. 24, a power saving control circuit 404' composed of a NAND gate RS flip-flop may be used.

Figure 24:
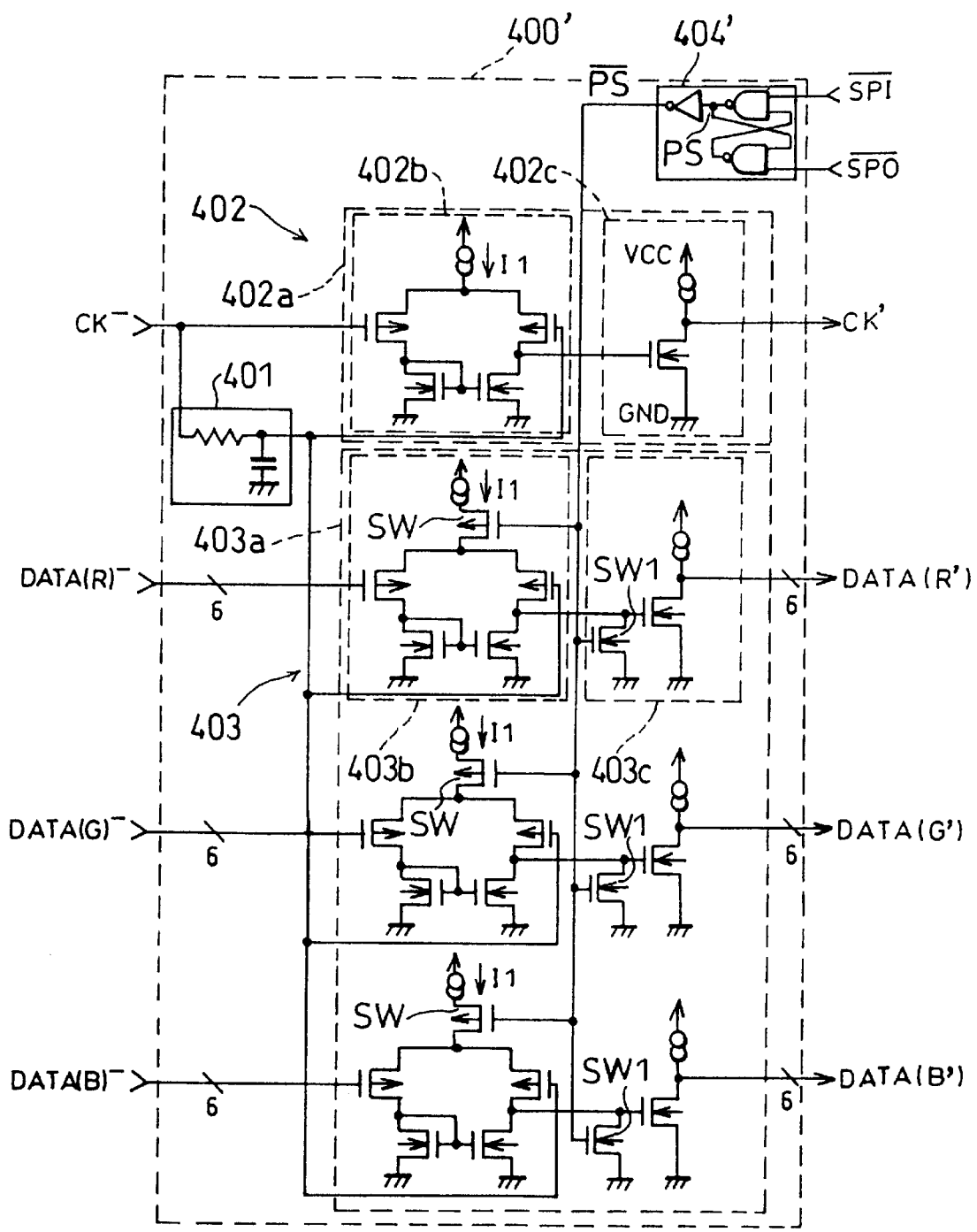
FIG. 24 is a circuit diagram of other comparators provided in the interface circuit shown in FIG. 21(b).
Figure 25:
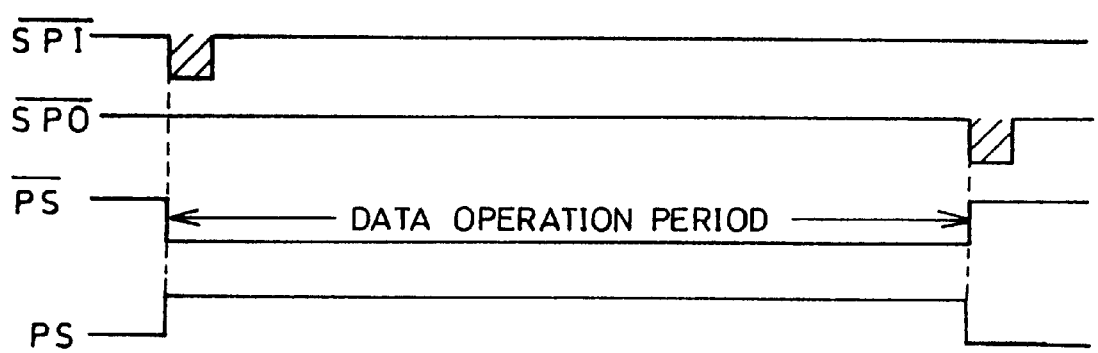
FIG. 25 is a waveform chart of a control signal for the comparators shown in FIG. 24.

In this case, as shown in FIG. 24, a signal obtained by inverting the start pulse signal (hereinafter referred to as inverted start pulse signal) is supplied to an input terminal $\overline{SPI}$, while a signal obtained by inverting the cascade output signal (hereinafter referred to as inverted cascade output signal) is supplied to an input terminal $\overline{SPO}$.

Therefore, when the level of the inverted start pulse signal supplied to the input terminal $\overline{SPI}$ becomes "Low" in a state in which both the levels of the inverted start pulse signal and the inverted cascade output signal supplied to the input terminals $\overline{SPI}$ and $\overline{SPO}$ respectively are "High," a control signal at the "Low" level is outputted through the output terminal PS. On the other hand, when the level of the signal supplied to the input terminal $\overline{SPO}$ becomes "Low" in a state in which both the levels of the signals supplied to the input terminals $\overline{SPI}$ and $\overline{SPO}$ respectively are "High," a control signal at the "High" level is outputted through the output terminal PS.

Therefore, a period since a fall of the signal supplied to the input terminal $\overline{SPI}$ until a fall of the signal supplied to the input terminal $\overline{SPO}$ is a DATA operation period.

The comparator 402a of the first comparator circuit 402 shown in FIG. 24 is composed of (i) the comparing circuit 402b which is a P-channel differential amplifier in which P-channel transistors are used for non-inverting input and inverting input, and (ii) a source follower circuit 402c. The comparator 403a of the second comparator circuit 403 is composed of (i) the comparing circuit 403b which is a P-channel differential amplifier in which P-channel transistors are used for non-inverting input and inverting input, and (ii) a source follower circuit 403c. However, the type of the differential amplifier does not have to be the P-channel type. The comparator 402a may be composed of (i) a comparing circuit 402b' which is an N-channel differential amplifier and (ii) a source follower circuit 402c', and the comparator 403a may be composed of (i) a comparing circuit 403b' which is an N-channel differential amplifier and (ii) a source follower circuit 403c'.

Figure 26:
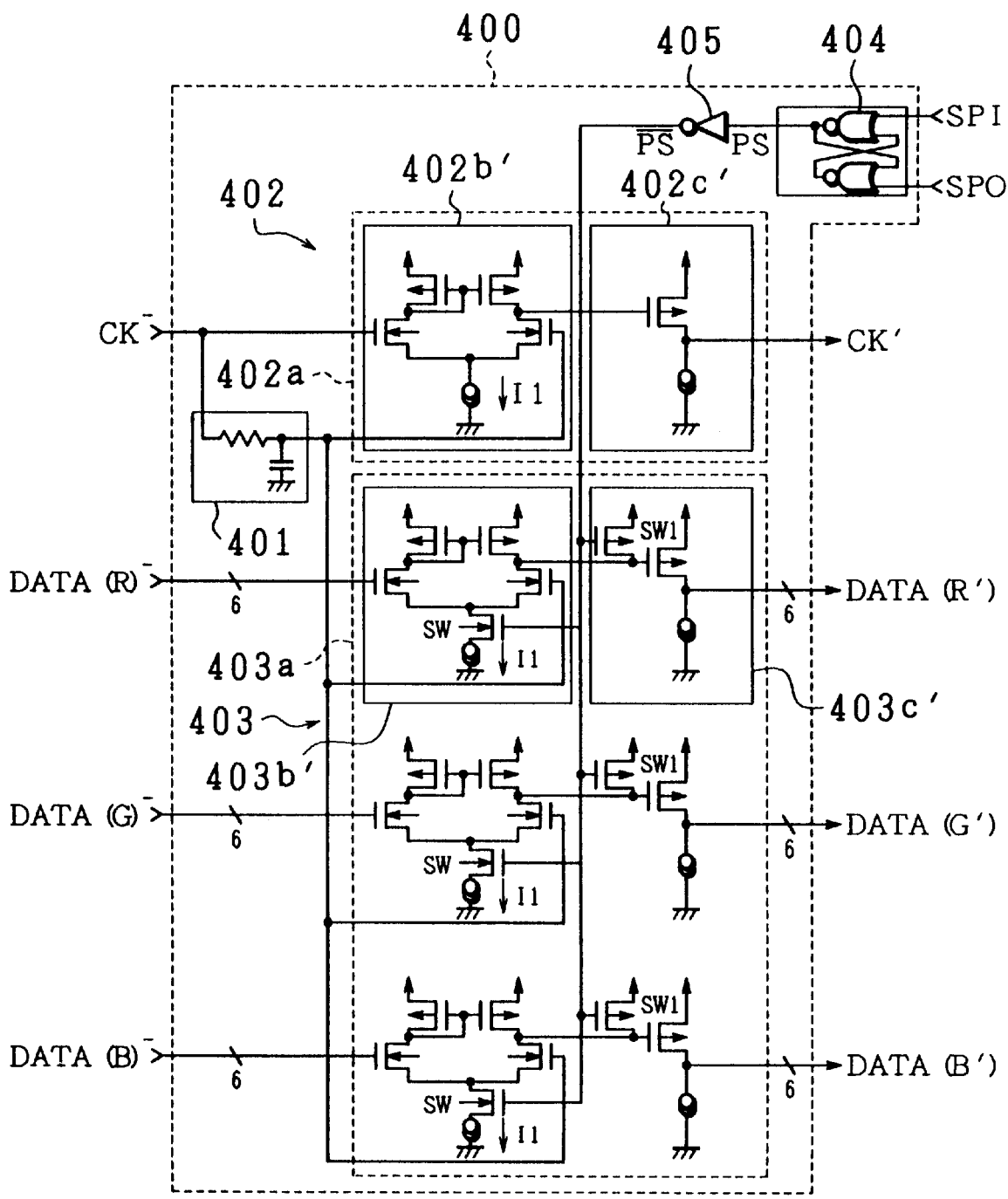
FIG. 26 is a circuit diagram of still other comparators provided in the interface circuit shown in FIG. 21(b).
Figure 27:
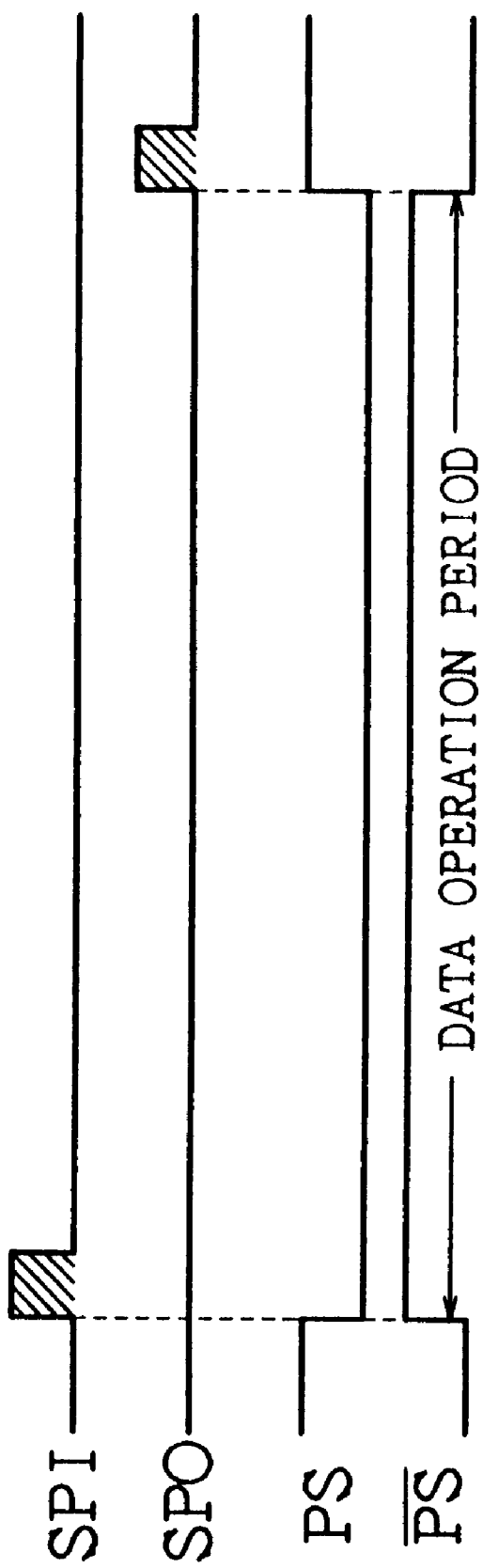
FIG. 27 is a waveform chart of a control signal for the comparators shown in FIG. 26.

In this case, as shown in the timing chart of FIG. 27 regarding signals outputted from the output terminals, like the timing chart of FIG. 23, it is necessary that a signal obtained by inverting the control signal from the power saving control circuit 404 should be supplied to each comparator 403a of the second comparator circuit 403. Therefore, as shown in FIG. 26, a buffer 405 should be provided on a stage behind the output terminal PS of the power saving control circuit 404 so that the inverted control signal may be outputted from an output terminal $\overline{PS}$ of the buffer 405.

Figure 28:
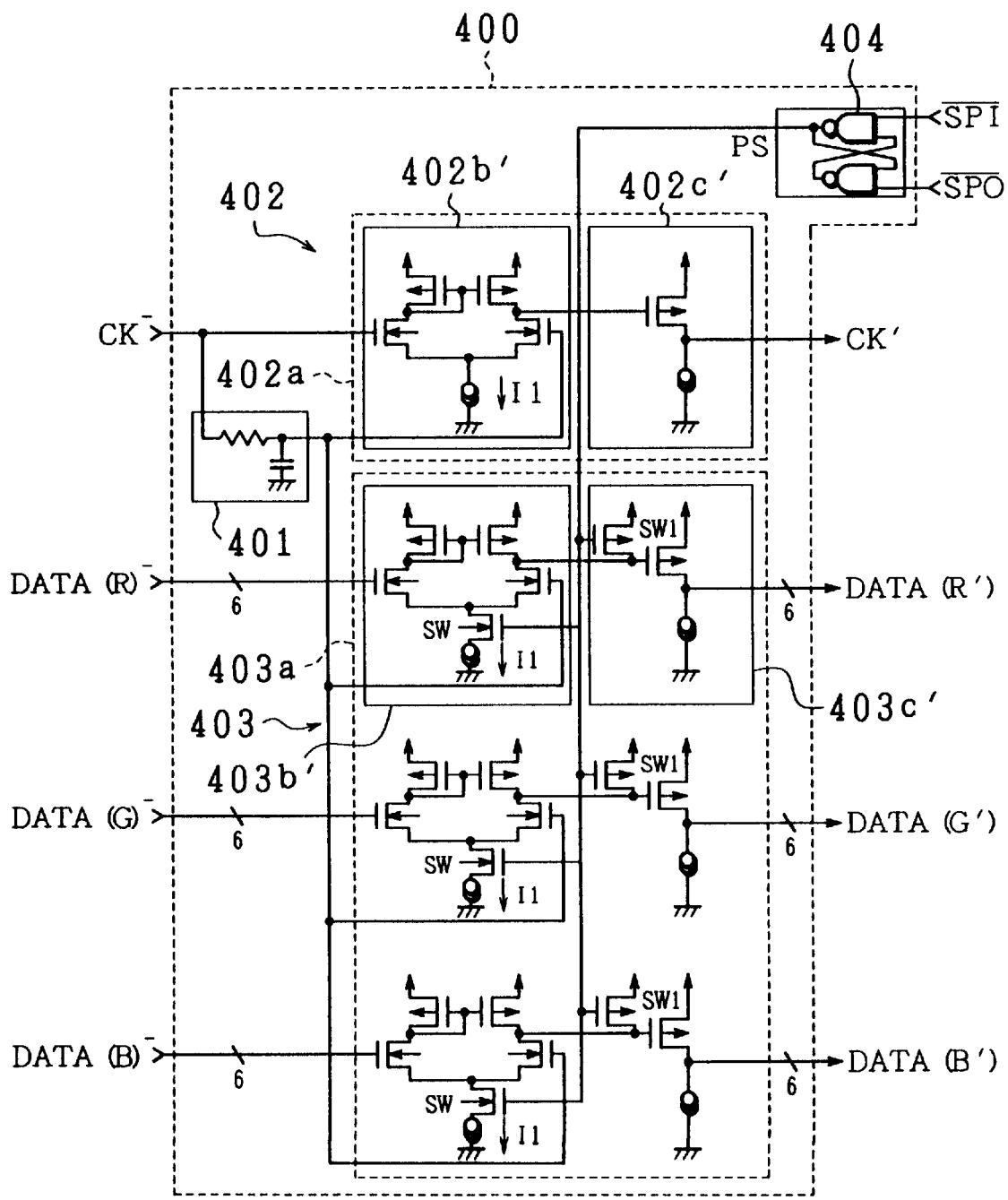
FIG. 28 is a circuit diagram of still other comparators provided in the interface circuit shown in FIG. 21(b).
Figure 29:
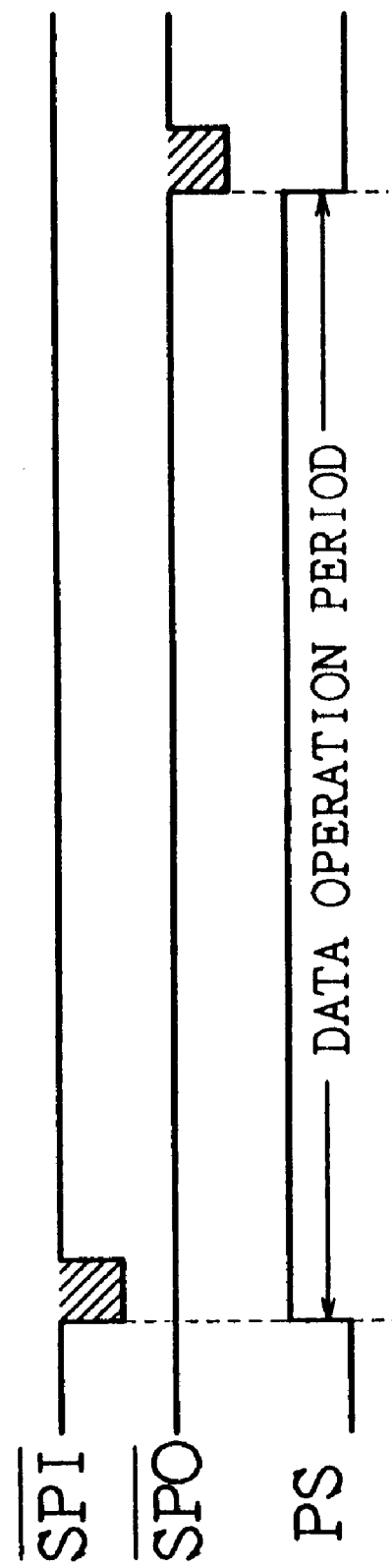
FIG. 29 is a waveform chart of a control signal for the comparators shown in FIG. 28.

The interface circuit 400 may be arranged so that an inverted signal is supplied to the input terminals SPI and SPO of the power saving control circuit 404 (see FIG. 28). In this case, the power saving control circuit 404 outputs the control signal at timings shown in FIG. 29.

Thus, the source driver of the present embodiment is equipped with the interface circuit having the power saving function. Therefore, only the comparators composing the interface circuits in the source drivers conducting a data input operation, among the plurality of the source drivers connected in cascade, are made to be in the operating state, while the comparators composing the interface circuits of the other source drivers are made to be in the non-operating state. As a result, unnecessary power consumption can be prevented.

Figure 30:
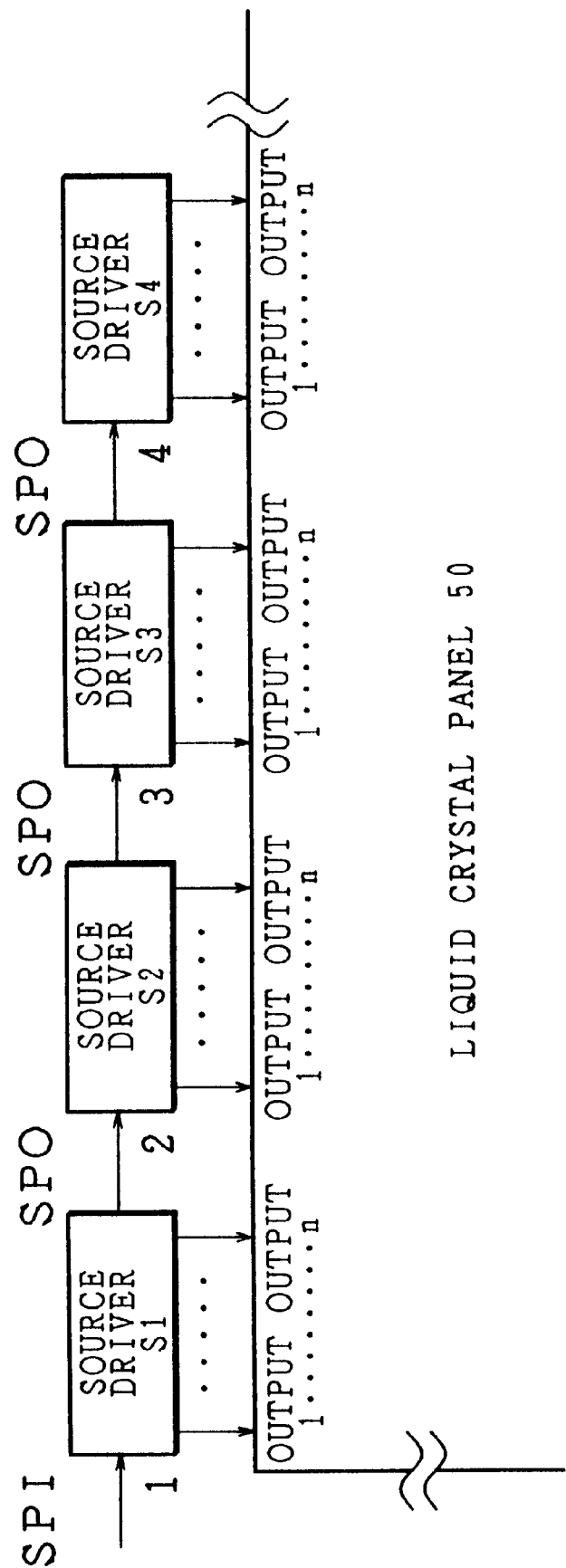
FIG. 30 is an explanatory view illustrating a state in which four source drivers are connected to the liquid crystal panel provided in the TFT-LCD module shown in FIG. 2.

An arrangement in the case where the source driver of the present embodiment is applied to the liquid crystal driving circuit is shown in FIG. 30. Further, regarding the case where four source drivers 1 through 4 are provided to the liquid crystal panel 50, a timing chart of output signals therefrom is shown in FIG. 31.

Figure 31:
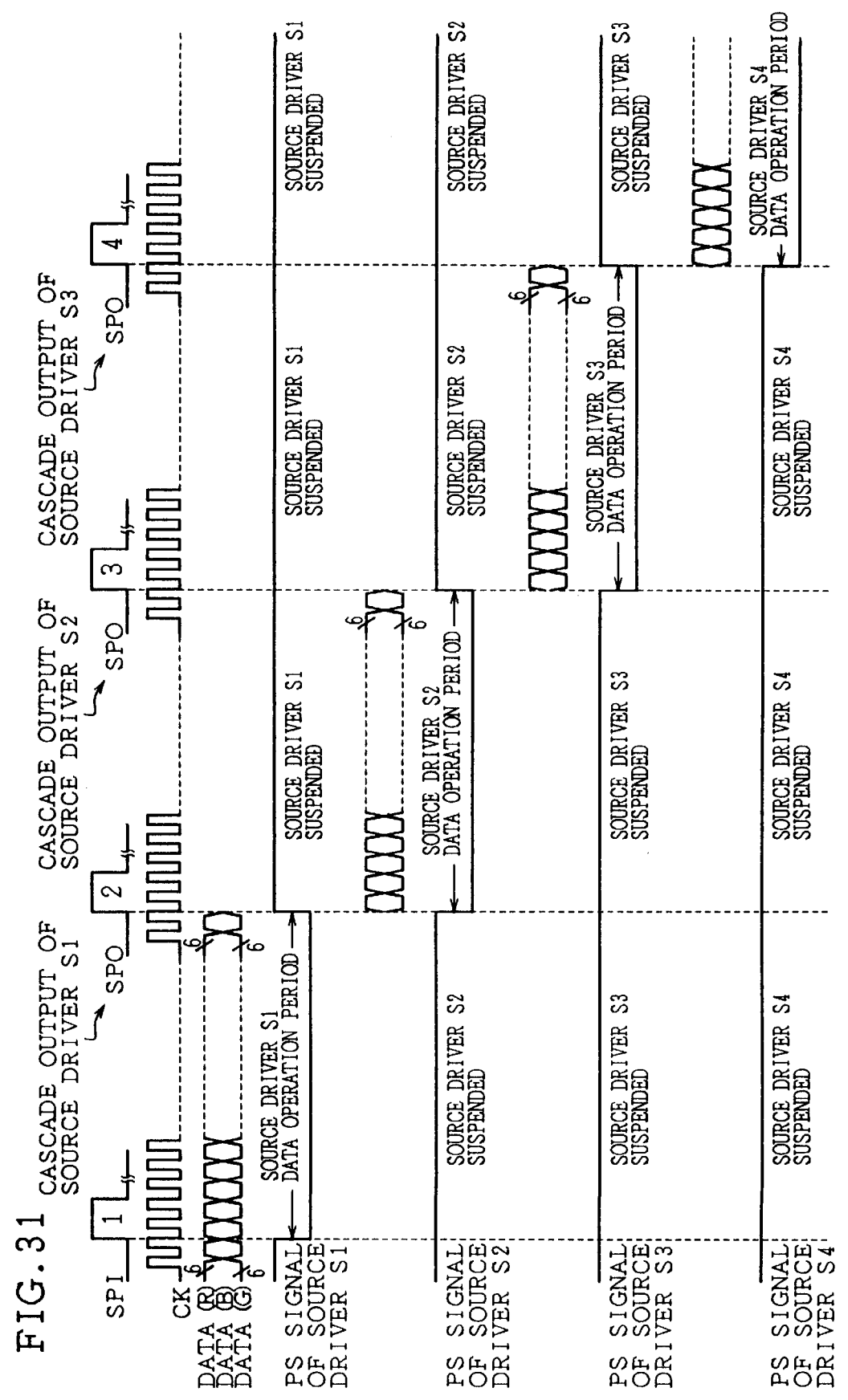

More specifically, in the case where the source drivers of the present embodiment are used, the interface circuit of one of the four source drivers is made to be in the operating state, as shown in FIG. 31, and the interface circuits of the other three source drivers are made to be in the non-operating state. Thus, unnecessary power consumption can be prevented.

Incidentally, in the first and second embodiments both, the filter circuit is arranged so as to be connected with the input terminal CK inside the source driver LSI chip. However, considering variation of the resistive element R and the capacitive element C of the low-pass filter constituting the filter circuit which may happen in the manufacturing process, a filter circuit 101' or 401' may be provided outside as shown in FIG. 32 or 33 so that adjustment is conducted outside.

Figure 32:
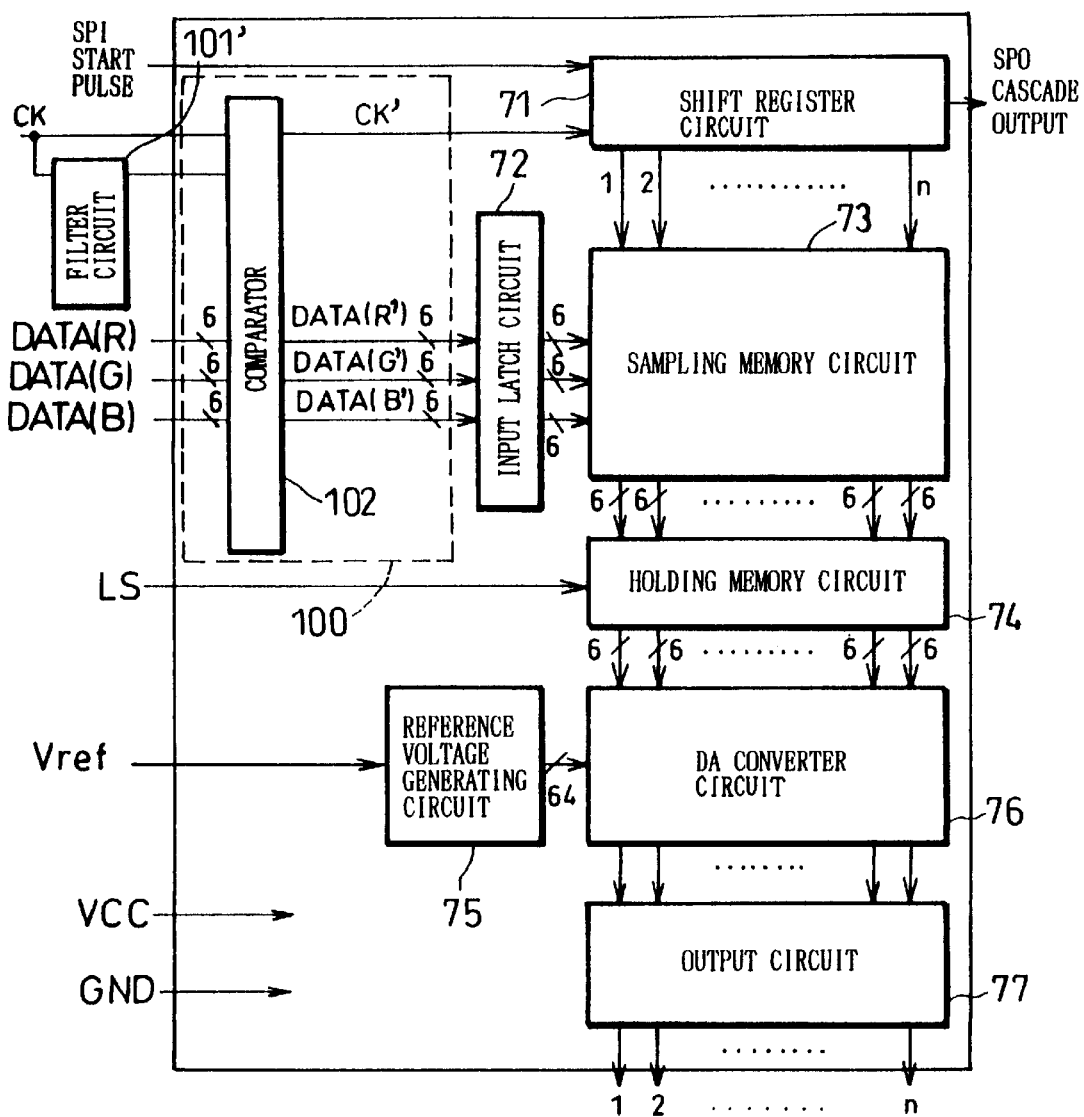
FIG. 32 is a block diagram illustrating a schematic circuit arrangement of another source driver LSI chip of the present invention.

The source driver shown in FIG. 32 corresponds to the source driver LSI chip of the first embodiment shown in FIG. 7, thereby having no power saving function.

Figure 33:
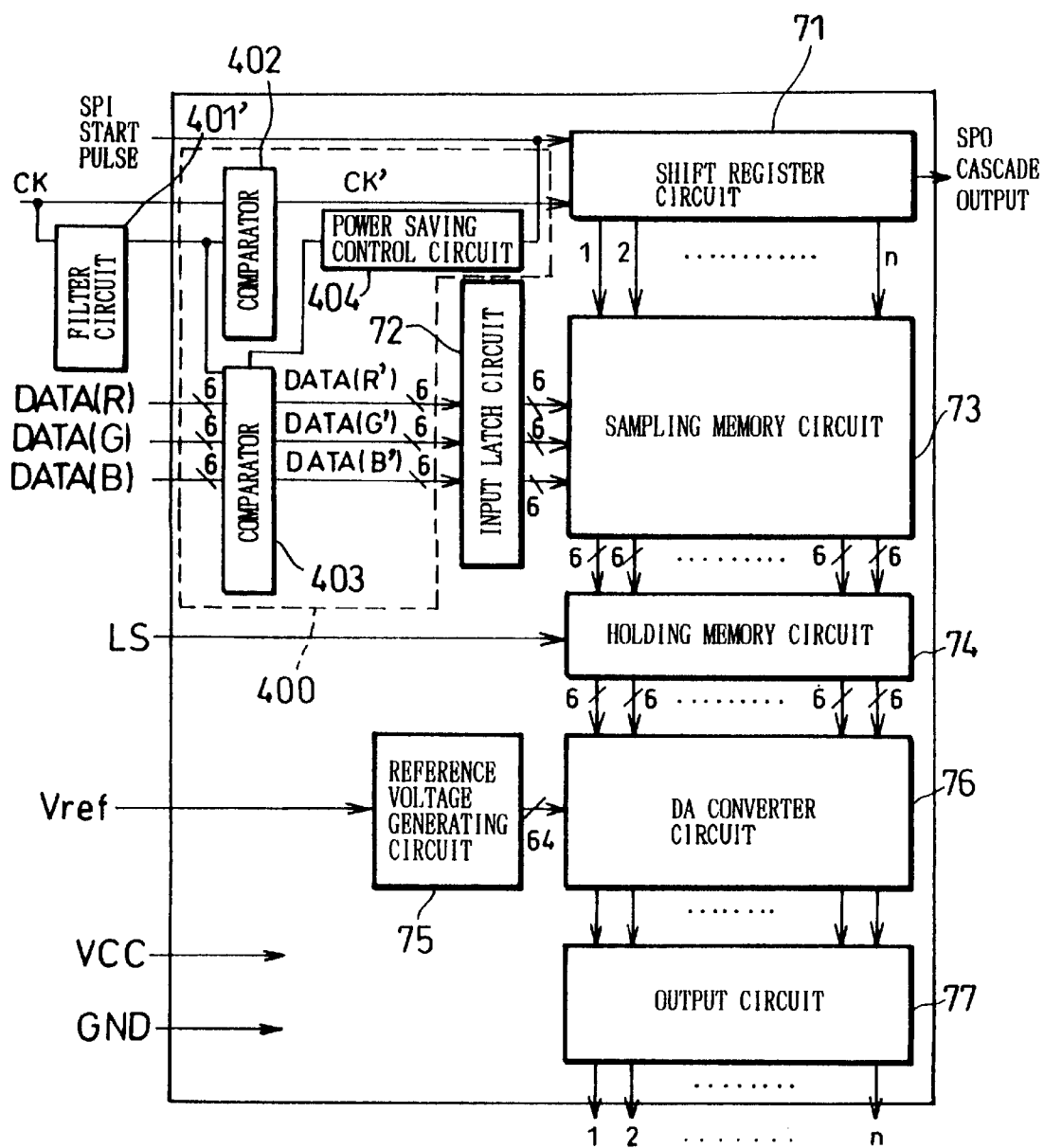
FIG. 33 is a block diagram illustrating a schematic circuit arrangement of still another source driver LSI chip of the present invention.

The source driver shown in FIG. 33 corresponds to the source driver LSI chip of the second embodiment shown in FIG. 20.

Thus, by providing the filter circuit 101' or 401' outside the LSI chip, fine adjustment is facilitated.

Further, for example, one low-pass filter may be provided outside so that a reference voltage signal VB produced by the low-pass filter is supplied to every source driver.

In this case, only one low-pass filter is needed, thereby ensuring that the chip size of the source drivers can be reduced.

In the first and second embodiments both, enhancement-type transistors are used for the comparing circuit constituting the comparator, that is, for the differential input of the differential amplifier, But the arrangement of the comparing circuit is not limited to that. For example, depression-type transistors may be used for the differential input. Such a case is shown in FIGS. 34 through 39.

Figure 34:
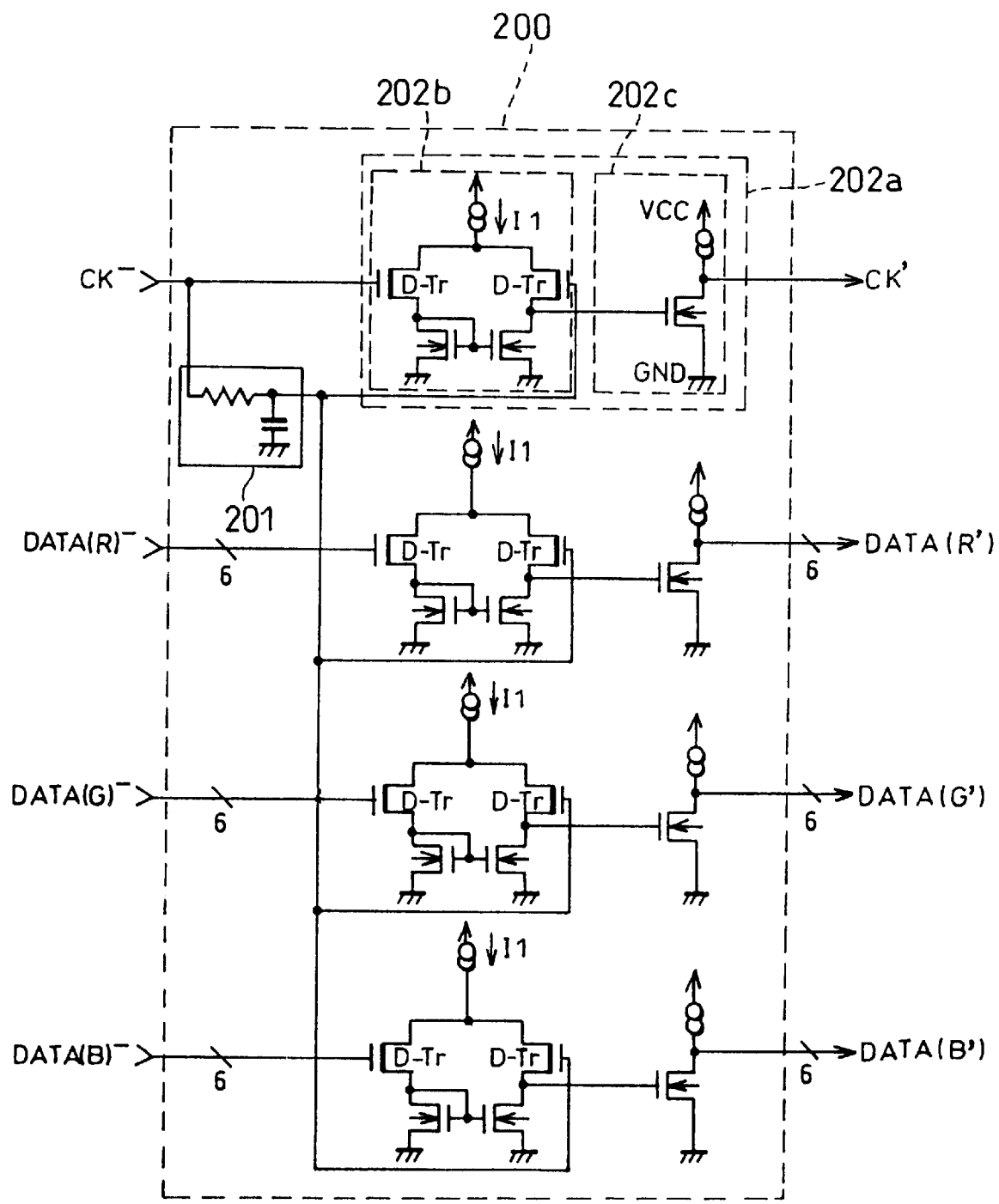
FIG. 34 is a circuit diagram of another interface circuit of the present invention.

FIG. 34 shows an interface circuit corresponding to the interface circuit 200 of the first embodiment shown in FIG. 14. Since they have the same members except transistors used for differential input, detailed description is omitted. Note that the transistors for the differential input are P-channel type.

Figure 35:
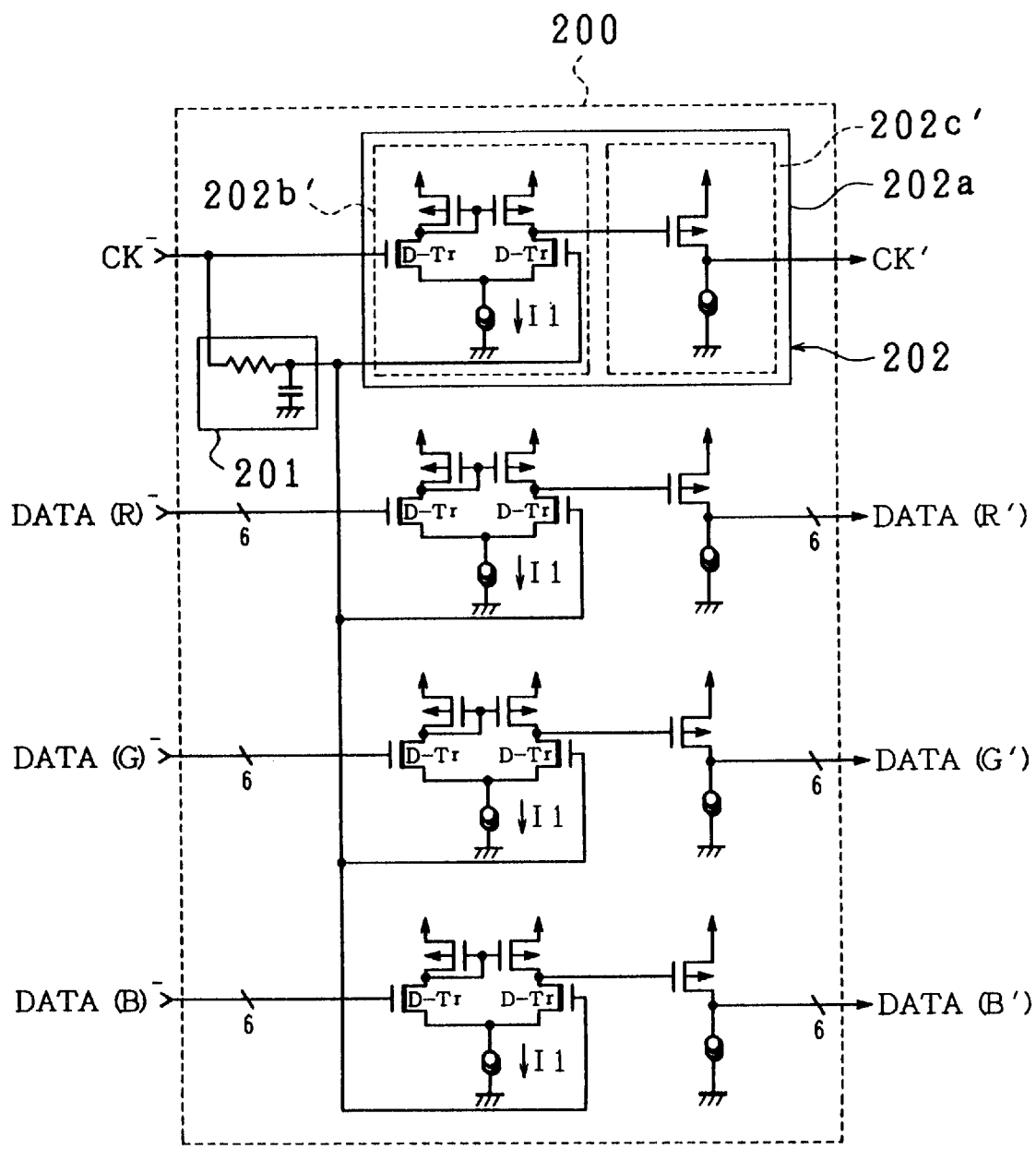
FIG. 35 is a circuit diagram of still another interface circuit of the present invention.

FIG. 35 shows an interface circuit corresponding to the interface circuit 200 of the first embodiment shown in FIG. 15. Since they have the same members except transistors used for differential input, detailed description is omitted. Note that the transistors for the differential input are N-channel type.

Figure 36:
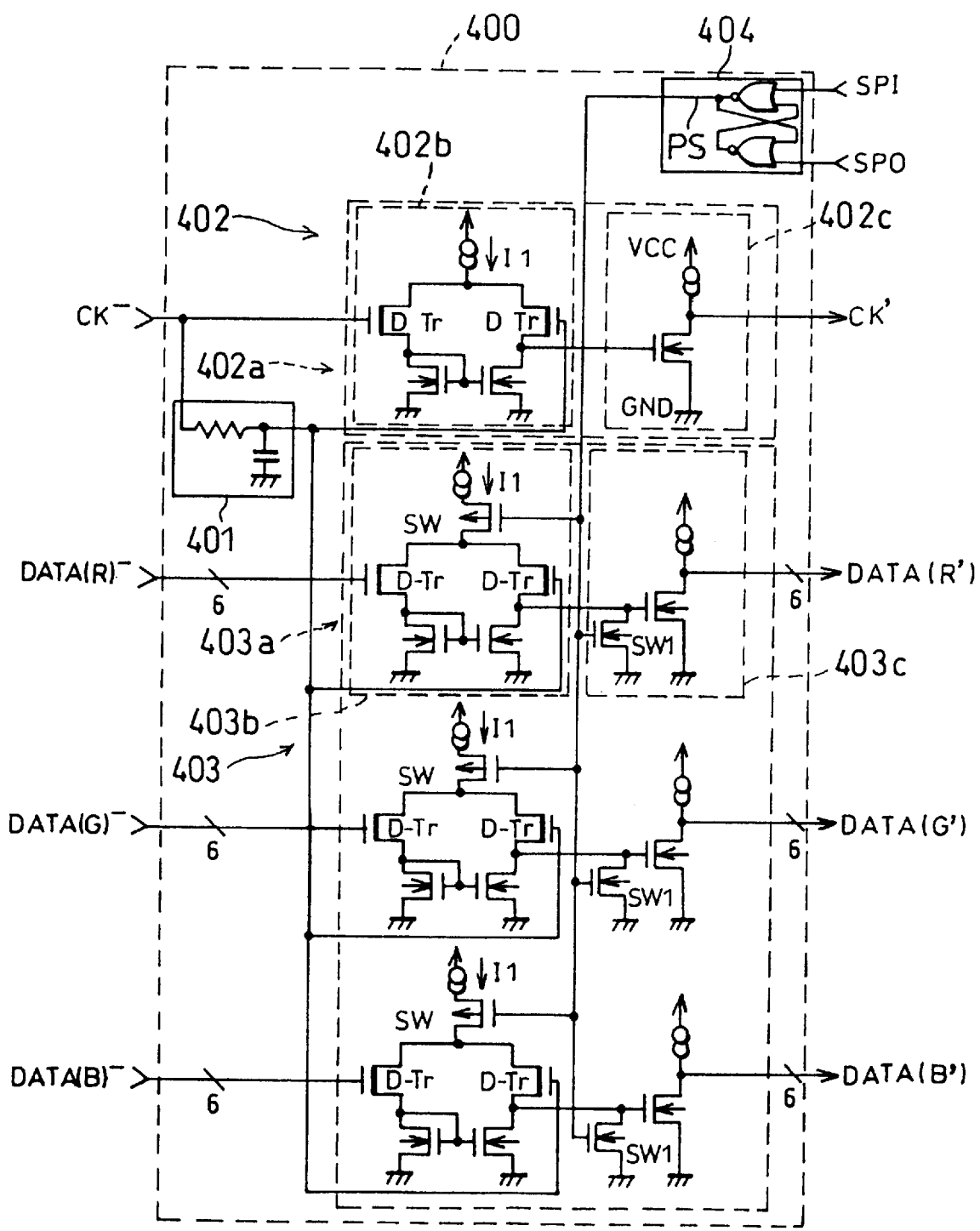
FIG. 36 is a circuit diagram of other comparators of the present invention.
Figure 37:
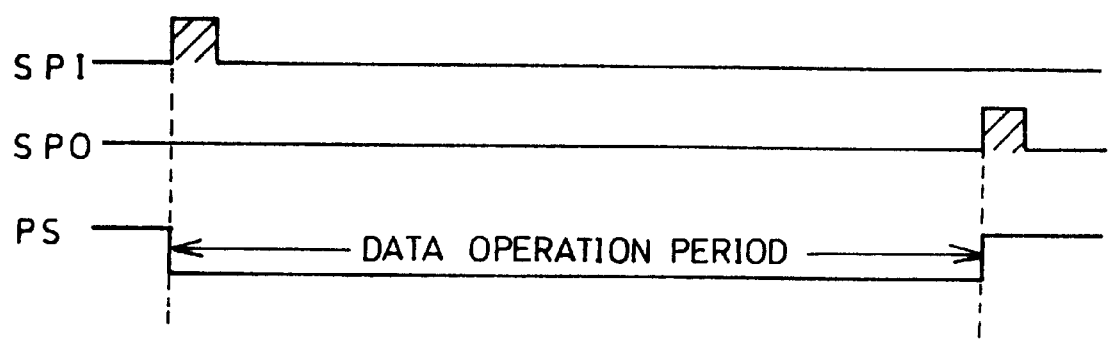
FIG. 37 is a waveform chart of a control signal for the comparators shown in FIG. 36.

FIGS. 36 and 37 show an interface circuit corresponding to the interface circuit 400 of the second embodiment shown in FIGS. 22 and 23. Since they have the same members except the transistors for differential input, detailed description is omitted.

Figure 38:
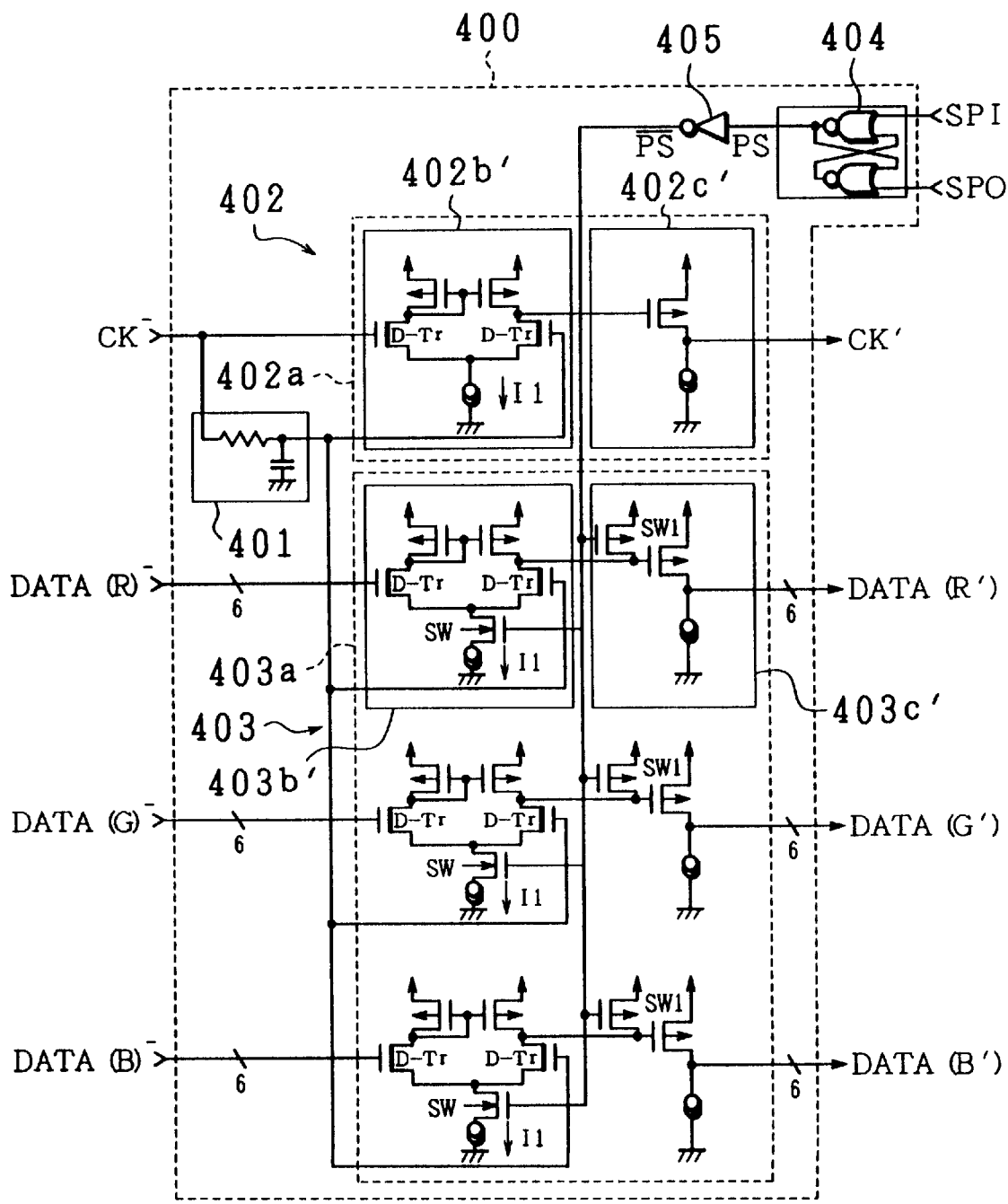
FIG. 38 is a circuit diagram of still other comparators of the present invention.
Figure 39:
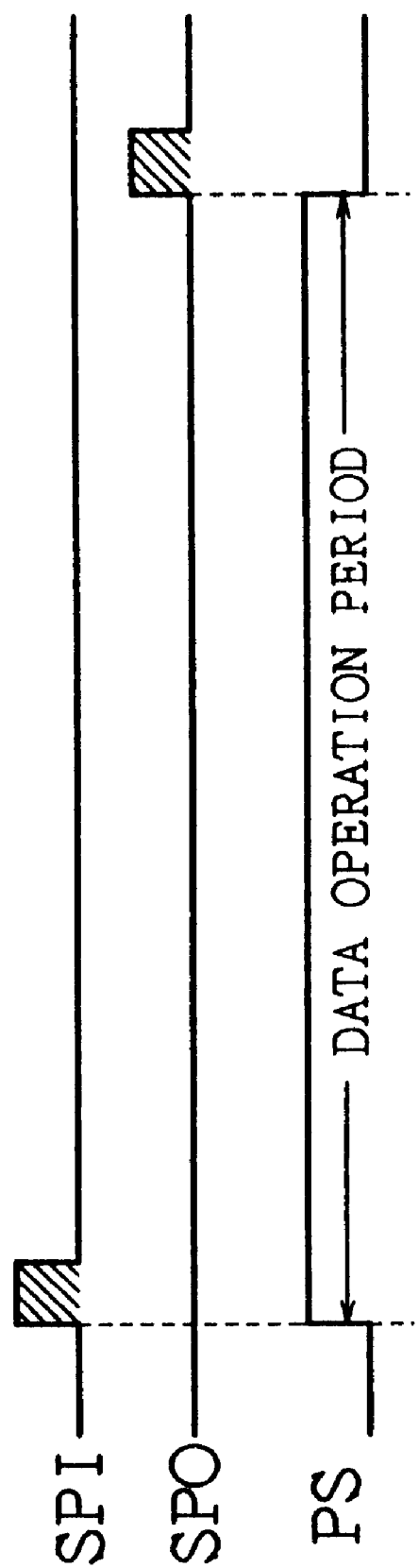
FIG. 39 is a waveform chart of a control signal for the comparators shown in FIG. 38.
Figure 40:
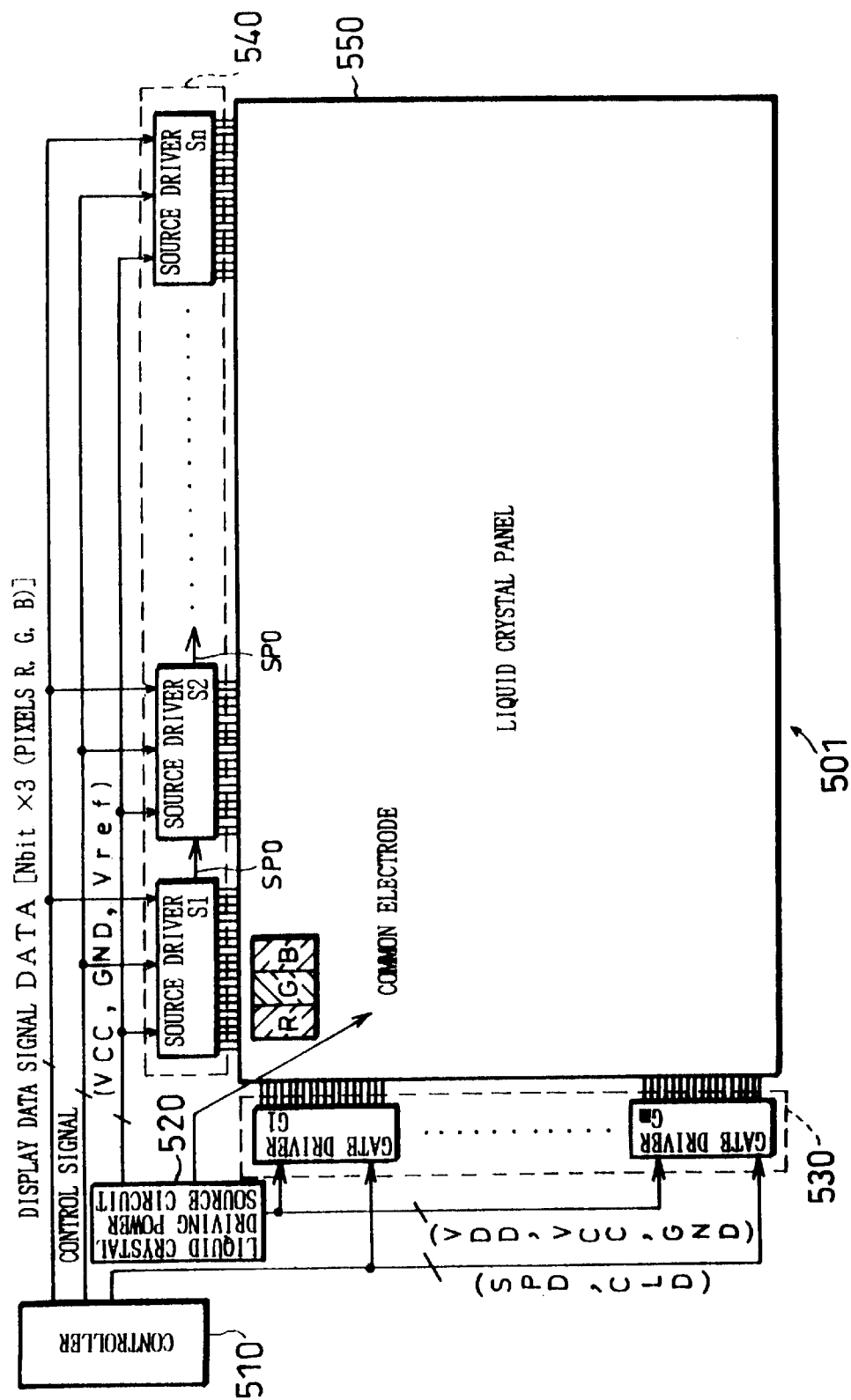
FIG. 40 is a block diagram illustrating a schematic arrangement of a conventional TFT-LCD module.
Figure 41:
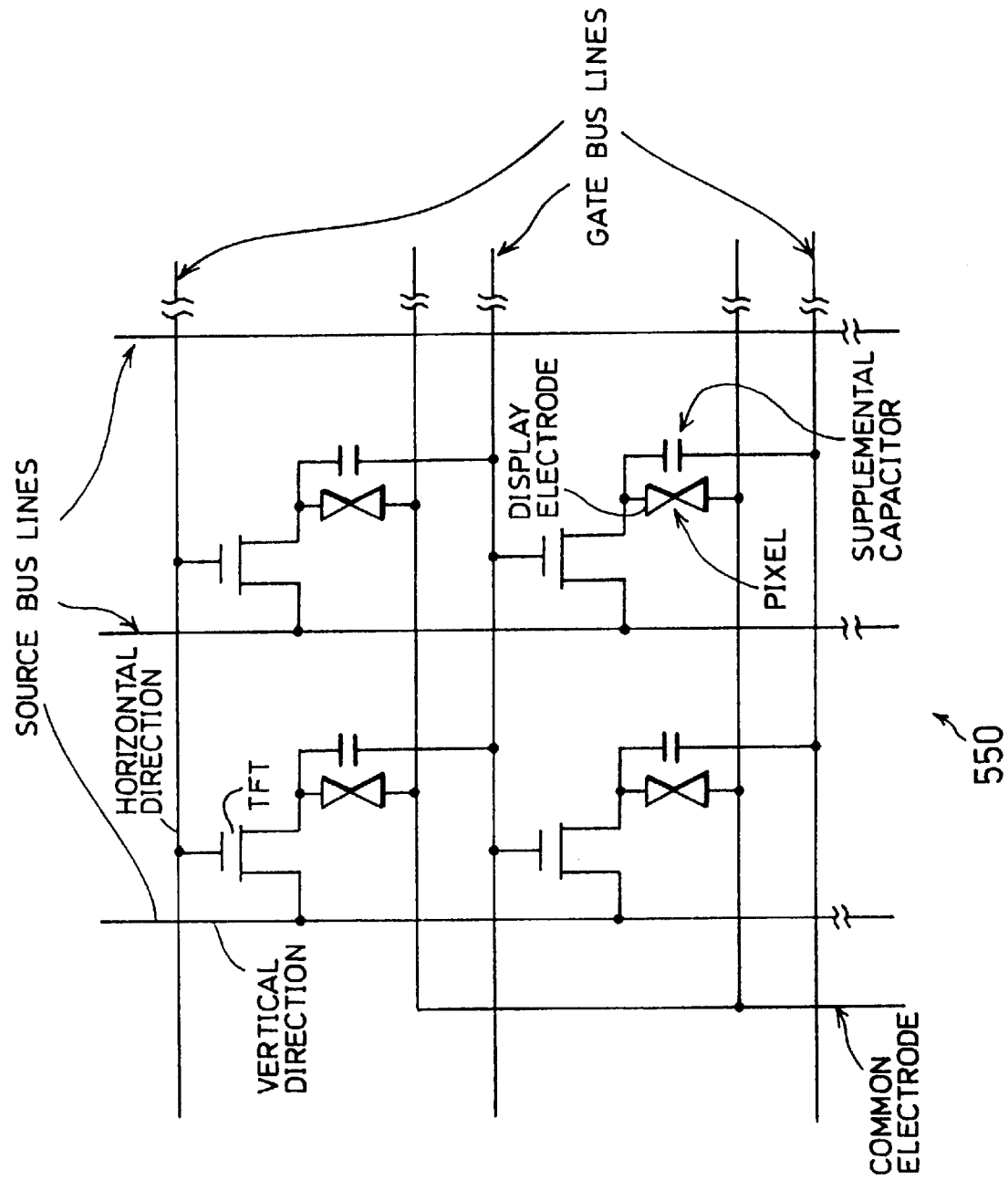
FIG. 41 is an equivalent circuit diagram of a liquid crystal panel provided in the TFT-LCD module shown in FIG. 40.
Figure 42:
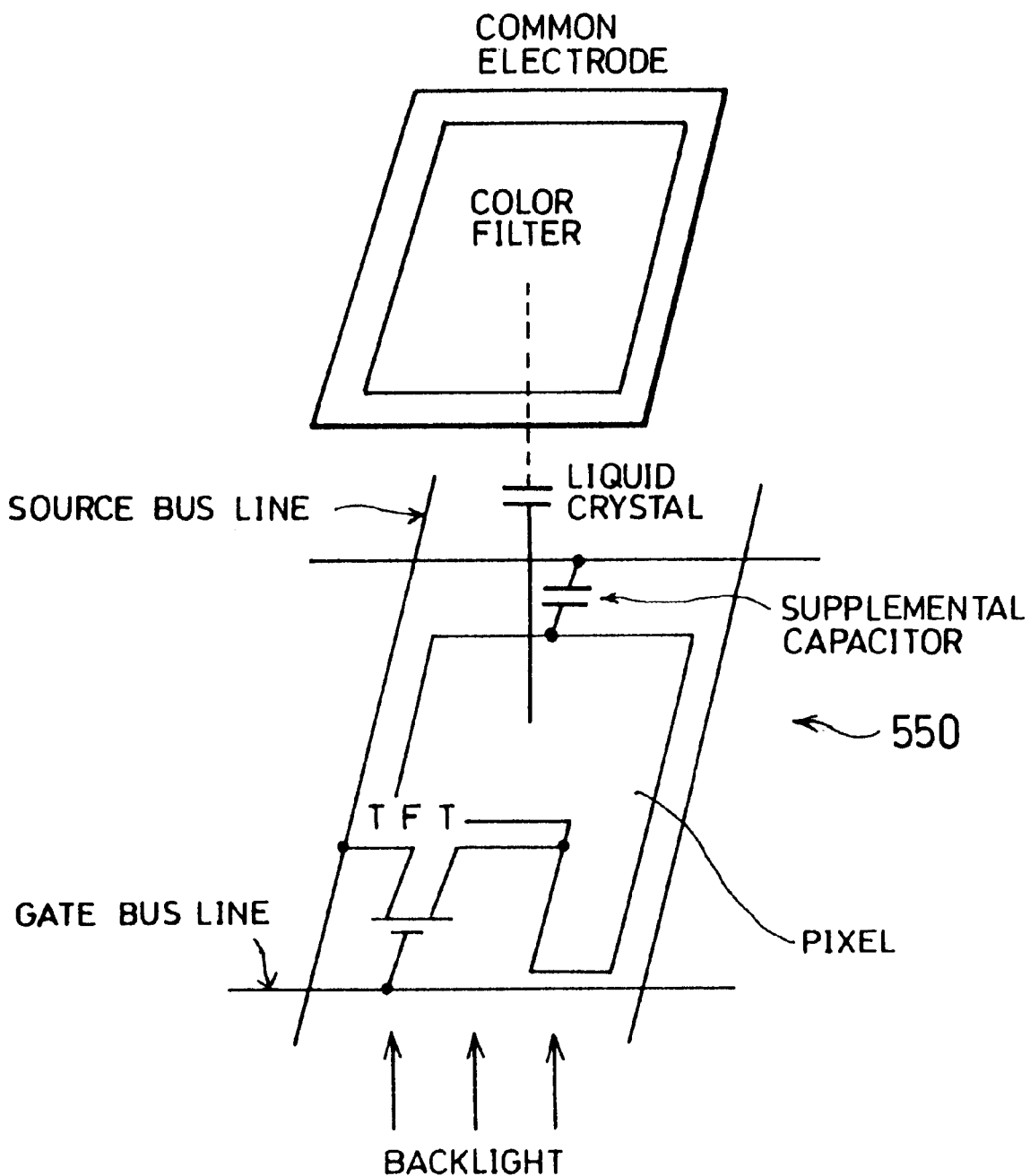
FIG. 42 is an explanatory view illustrating an image display operation of the liquid crystal panel provided in the TFT-LCD module shown in FIG. 40.
Figure 43:
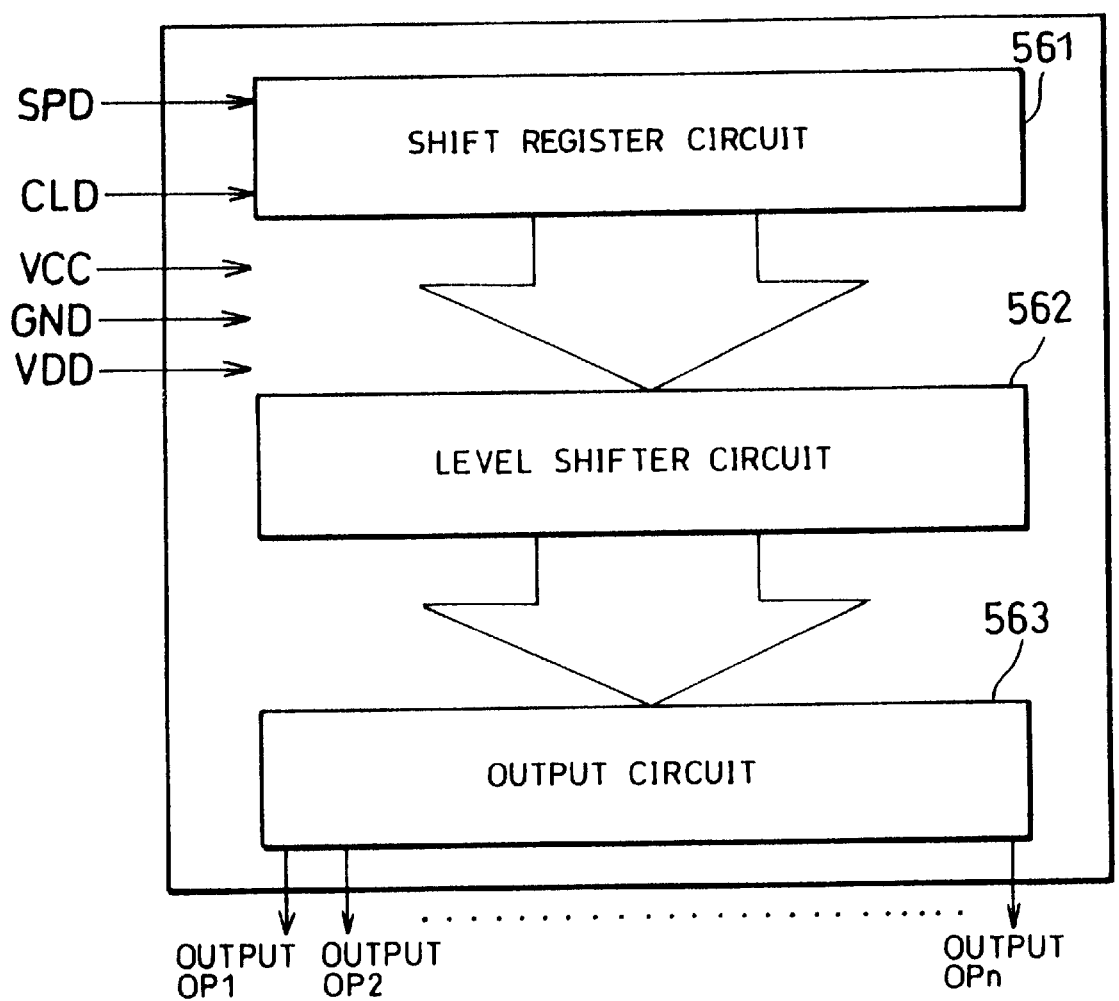
FIG. 43 is a block diagram illustrating a schematic circuit arrangement of a gate driver LSI chip provided in the TFT-LCD module shown in FIG. 40.
Figure 44:
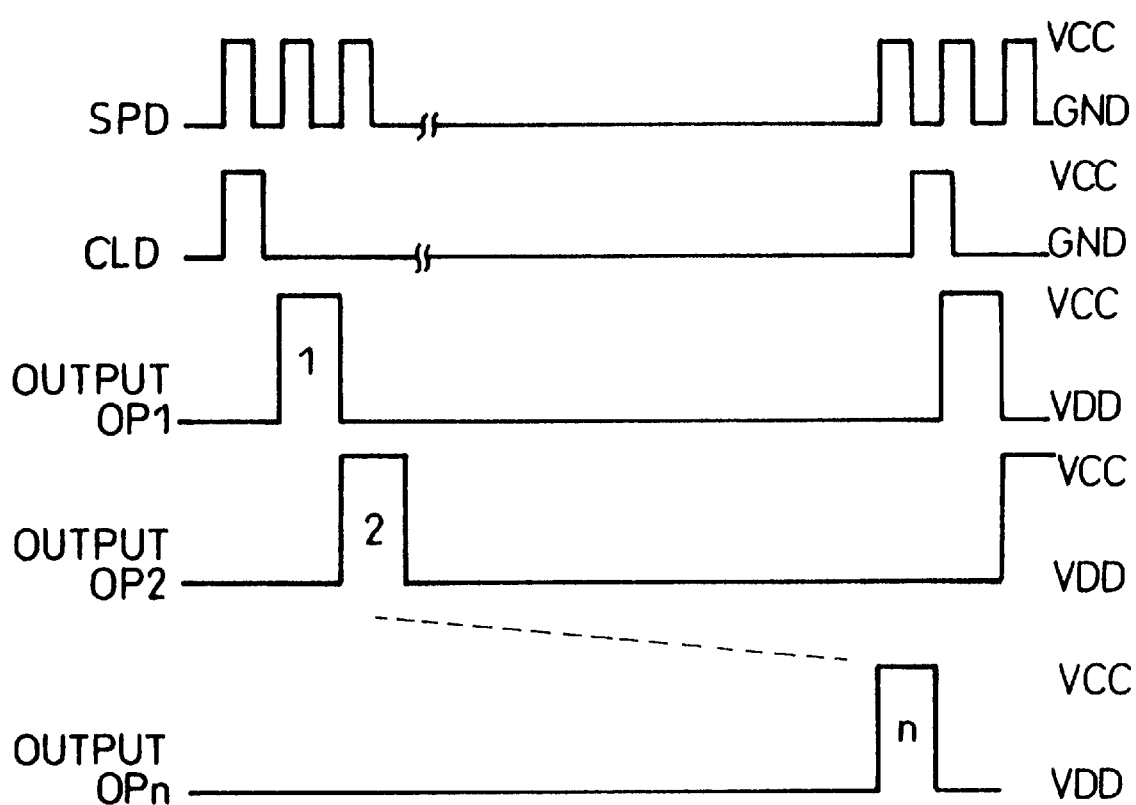
FIG. 44 is a timing chart of the gate driver LSI chip shown in FIG. 43.
Figure 45:
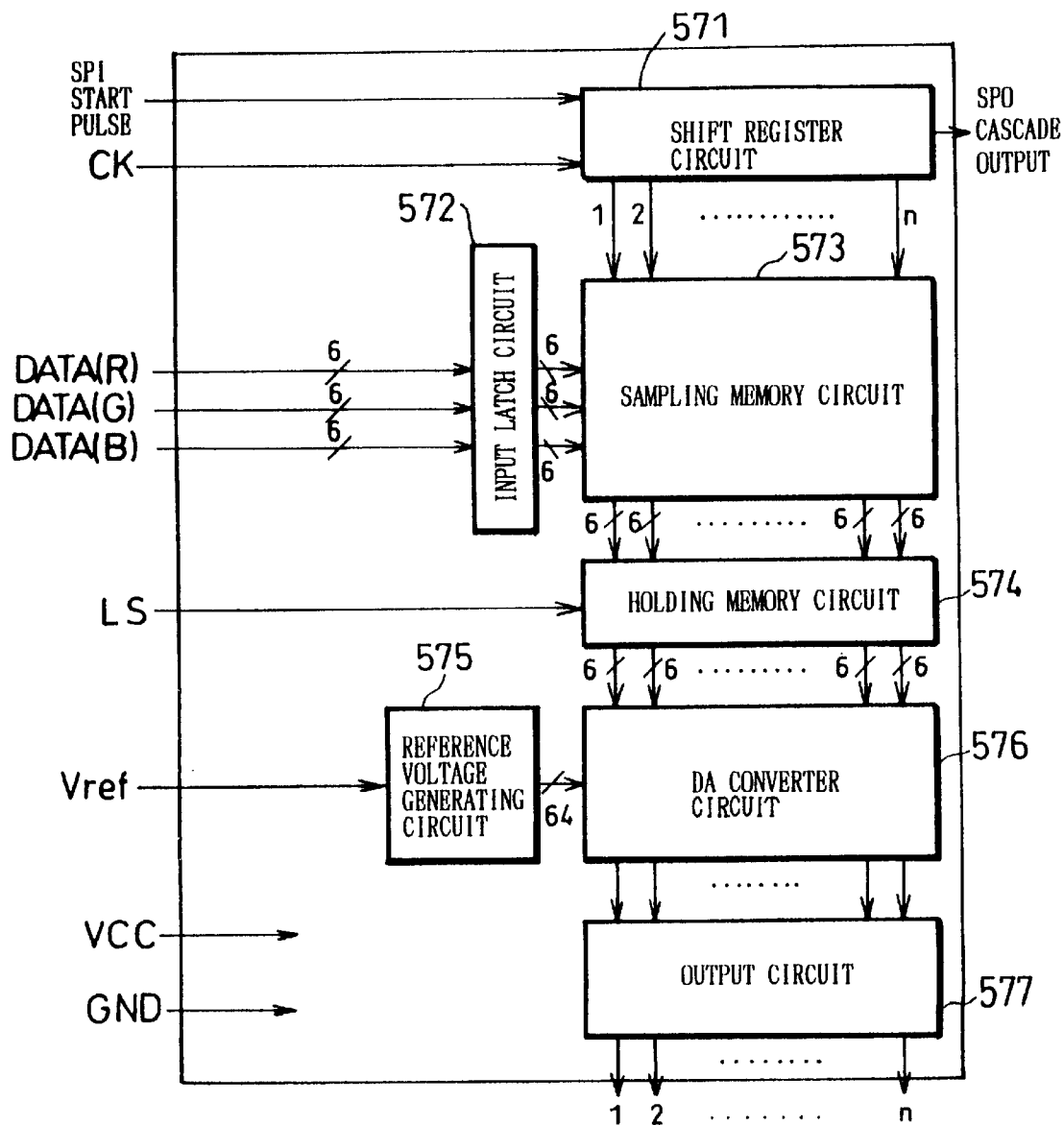
FIG. 45 is a block diagram illustrating a schematic circuit arrangement of a source driver LSI chip provided in the TFT-LCD module shown in FIG. 40.
Figure 46:
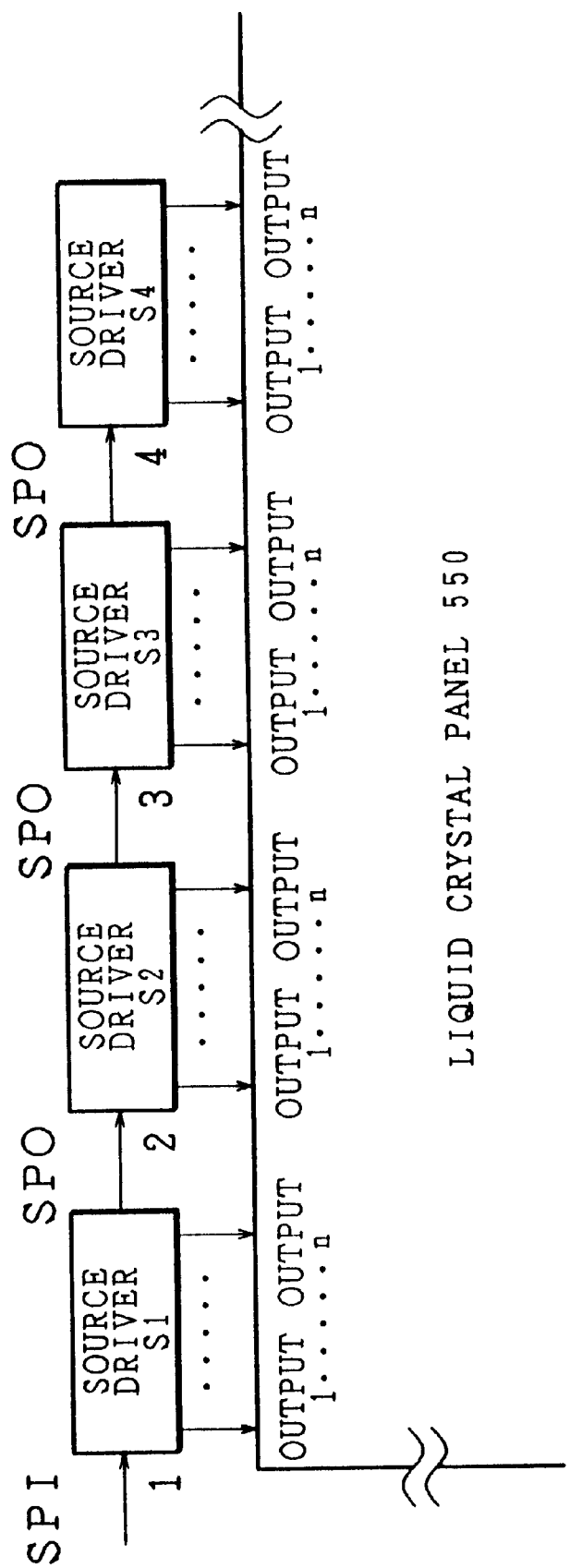
FIG. 46 is an explanatory view illustrating a state in which four source drivers are connected to a the liquid crystal panel provided in the TFT-LCD module shown in FIG. 40.
Figure 47:
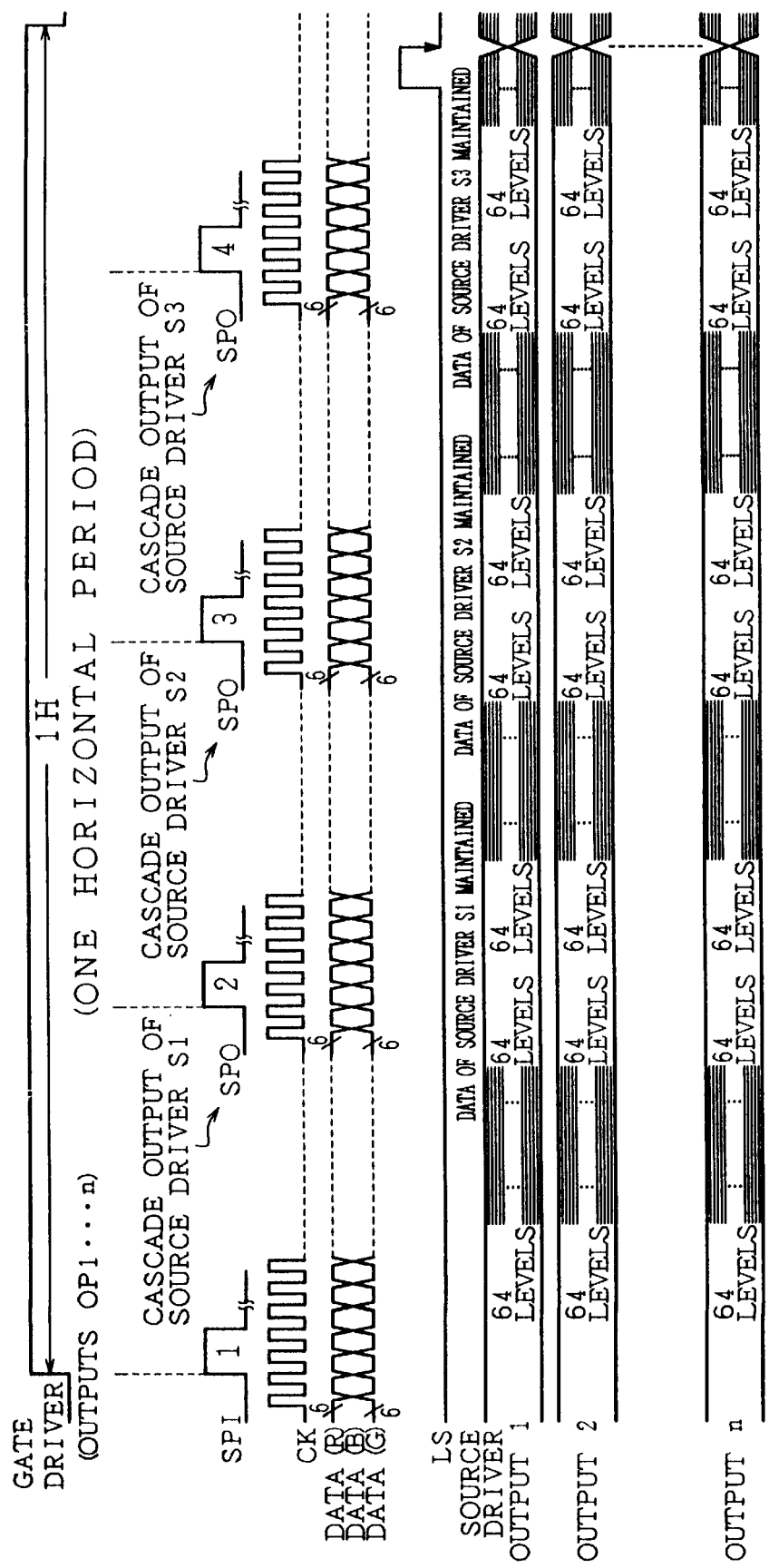
FIG. 47 is a timing chart of the 64-scale source drivers which are connected to the liquid crystal panel shown in FIG. 46.
Figure 48:
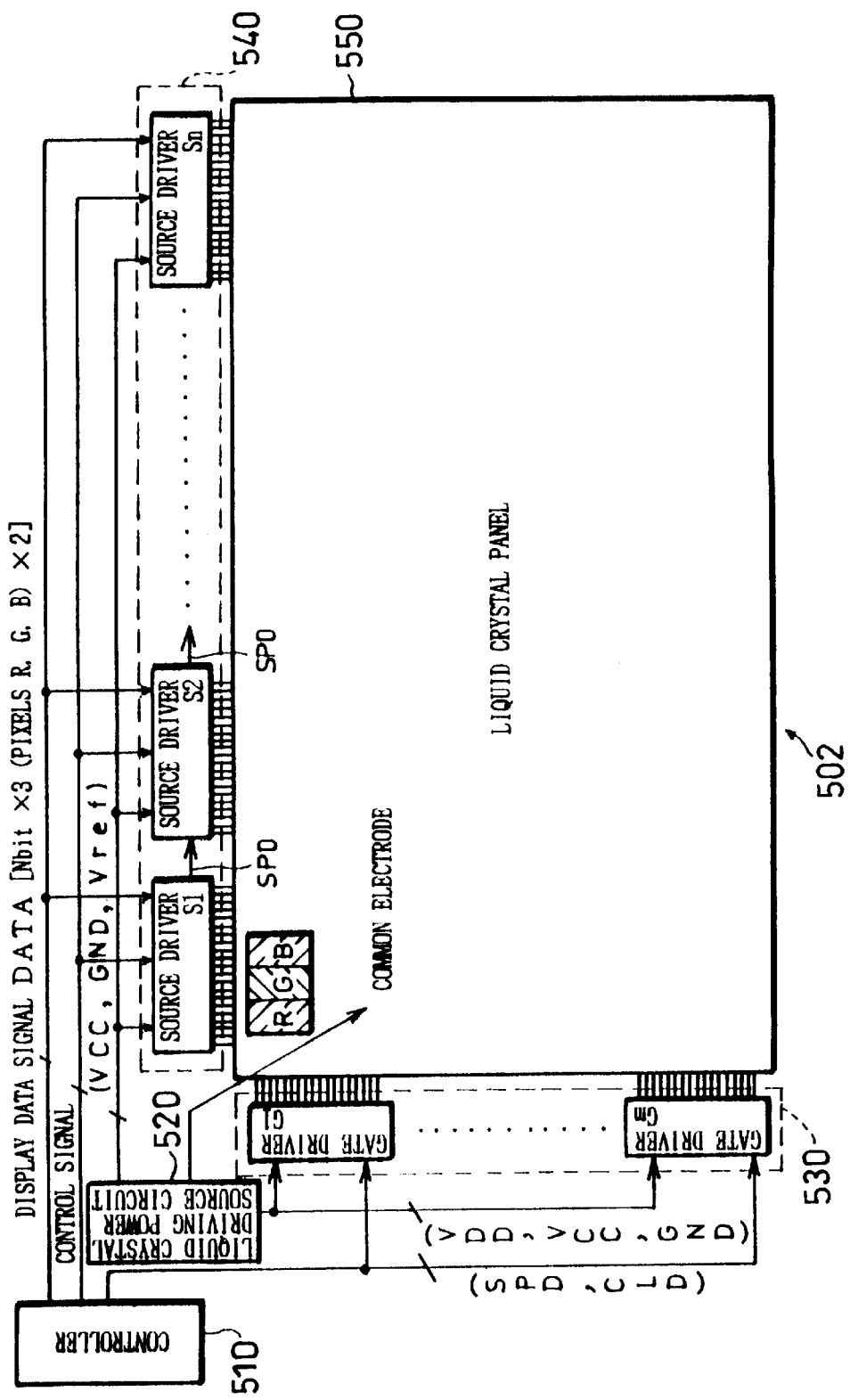
FIG. 48 is a block diagram illustrating a schematic arrangement of another conventional TFT-LCD module.
Figure 49:
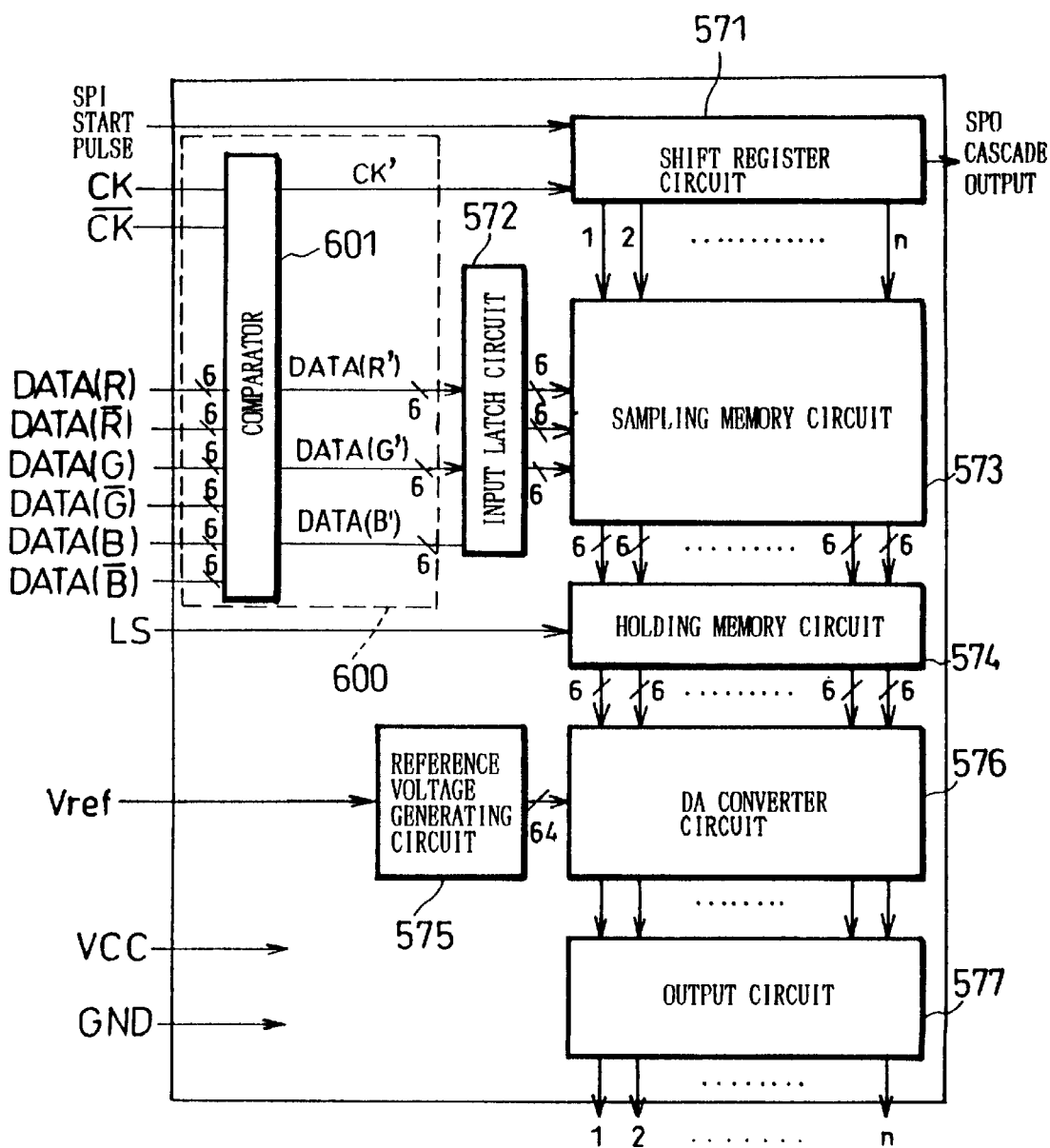
FIG. 49 is a block diagram illustrating a schematic circuit arrangement of a source driver LSI chip provided in the TFT-LCD module shown in FIG. 48.
Figure 51:
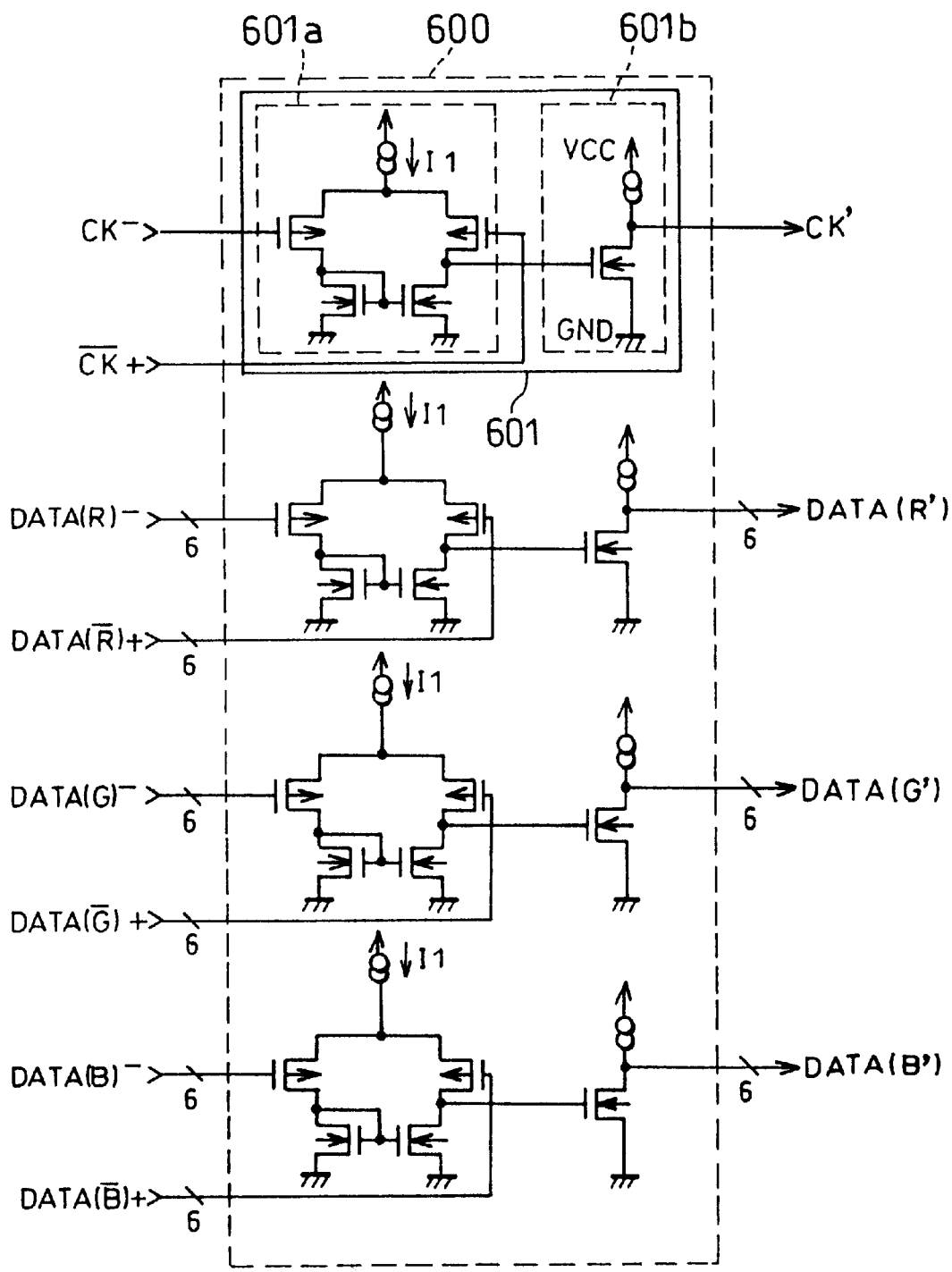
FIG. 51 is a circuit diagram of comparators provided in the interface circuit shown in FIG. 50(b).
Figure 52:
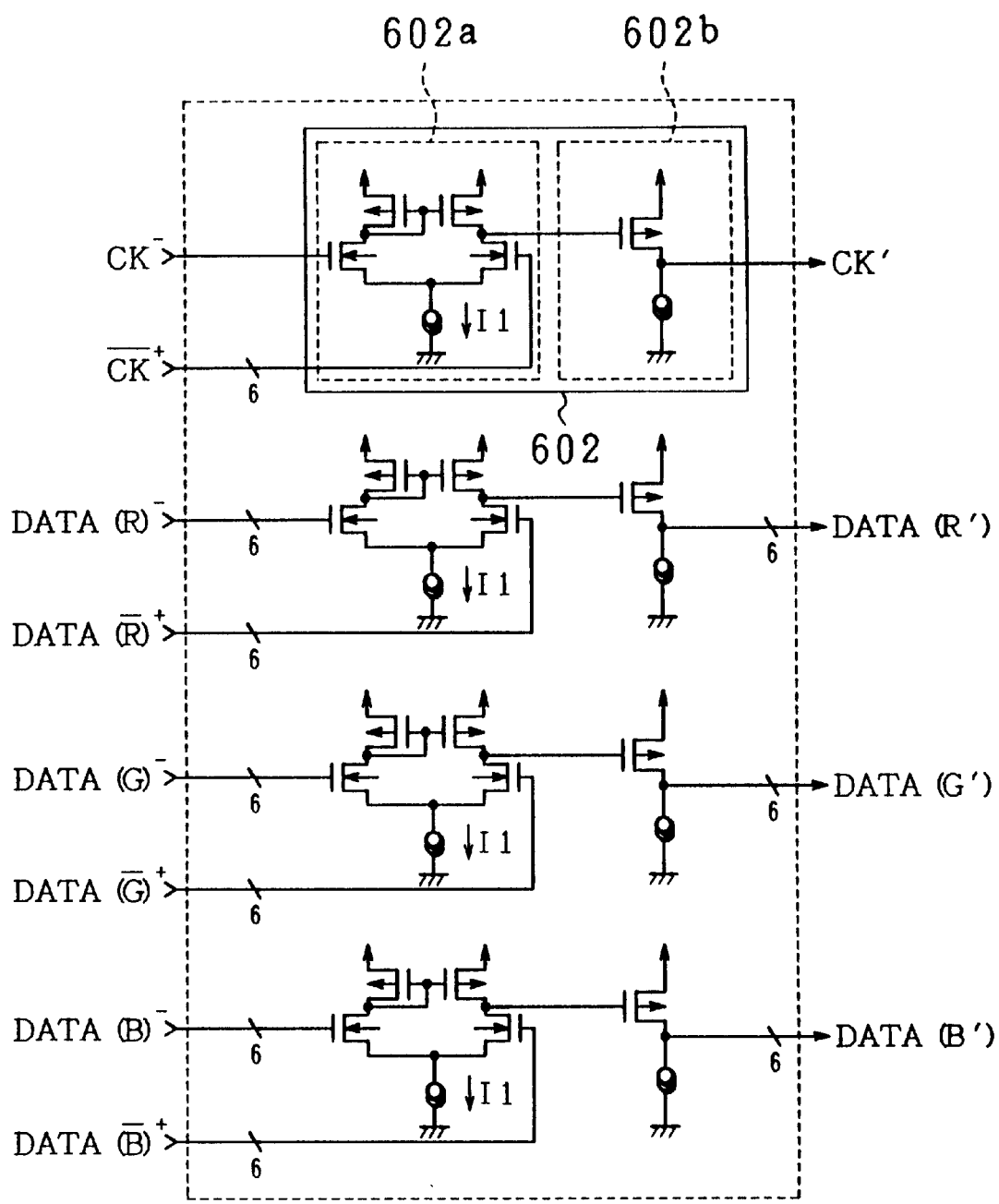
FIG. 52 is a circuit diagram of other comparators provided in the interface circuit shown in FIG. 50(b).

FIGS. 38 and 39 show an interface circuit corresponding to the interface circuit 400 of the second embodiment shown in FIGS. 26 and 27. Since they have the same members except the transistors for differential input, detailed description is omitted.

Thus, in the case where the depression-type transistors are used for differential input of a differential amplifier as a comparing circuit, a range of an input voltage can be widened, thereby preventing an operational margin from becoming narrower.

More specifically, in the case where the enhancement-type transistors are used for differential input, the input voltage is cut off by referring to the threshold voltage Vth of the transistor, and therefore, a range of the input voltage is limited. As a result, the operational margin is narrowed.

However, in the case where the enhancement-type P-channel transistors are used for differential input, the clock pulse signal supplied to one of the differential input transistors is cut off by referring to the threshold voltage Vth of differential input when the signal is at the "High" level, but the operation is possible provided that the reference voltage VB of the other transistor is set lower than the threshold voltage Vth.

In the case where the filter circuit composed of the low-pass filter is provided outside as shown in FIGS. 32 and 33, the reference voltage VB can be easily adjusted from outside, and therefore, in the case where enhancement-type transistors are used for differential input, the operational margin can be prevented from becoming narrower.

On the other hand, in the case where the filter circuit is installed in the source driver LSI chip, adjustment of the reference voltage VB is difficult, whereby the operational margin becomes narrower.

Then, by adapting the depression-type transistors so as to be used for differential input, the input voltage becomes unaffected by the threshold voltage Vth and the reference voltage VB, and hence, the range of the input voltage can be widened. As a result, the operational margin of the comparing circuit which is a differential amplifier can be widened.

As has been so far described, the interface circuit of the present invention is characterized by comprising a plurality of comparators each having an inverting input terminal and a non-inverting input terminal, which shift levels of small-amplitude digital signals inputted thereto so that digital signals with greater amplitudes than those of the inputted digital signals are outputted, wherein the small-amplitude digital signals are supplied to the non-inverting input terminals of the comparators, while a reference voltage signal obtained by filtering, through a low-pass filter, one predetermined digital signal among the digital signals supplied to the non- inverting input terminals is supplied to every inverting input terminal.

According to the foregoing arrangement, the signal produced by the low-pass filter is supplied to every inverting input of the comparators. Therefore, since the digital signals supplied from outside are supplied through only the non-inverting input terminals, the input terminals of the interface circuits decrease in number.

With this arrangement, various problems which tend to occur in the case where the input terminals increase in number can be solved. More specifically, for example, in the case where the interface circuit of the foregoing arrangement is applied to a liquid crystal driving circuit, the following problems can be avoided: expansion of a size of a LSI chip used to form the liquid crystal driving circuit, which also entails a rise of costs; a decline of the yield of the LSI chip; degradation of reliability stemming from an increase in the number of input terminals; expansion of a size of a TCP, which also entails a rise of costs; a decline of the yield due to the TCP assembling process; and expansion of an input lines substrate of the TFT-LCD module, which also entails expansion of a frame thereof.

Furthermore, in the case where the interface circuit thus arranged is applied to the liquid crystal driving circuit, power-source-originated high frequency components, which are generated by charging/discharging current of logic circuits driven in response to digital signals of a clock system and a display data system outside the liquid crystal driving circuit, can be suppressed by making the digital signals of the clock system and the display data system have small amplitudes. Therefore, it is possible to suppress high frequency components emitted from peripheral circuits (devices) outside the liquid crystal driving circuit.

Moreover, the interface circuit arranged as above may be further arranged so that each comparator includes a switching element inserted in a current path inside the comparator so that the switching element switches a state of conductivity of the current path between a conductive state and a non-conductive state in response to a control signal supplied from outside.

According to the foregoing arrangement, the switching element which is closed/opened in response to the control signal supplied from outside is provided in the current path inside the comparator, and therefore, the switching element is selectively closed/opened in response to the control signal. By so doing, the switching elements which should not operate are opened so as to become non-conductive, thereby ensuring reduction of power consumption of the interface circuit.

Furthermore, the interface circuit arranged as above may be arranged so as to further comprise control signal producing circuit which produces the control signal supplied to said switching element for controlling the closing/opening of the switching element, by using a start pulse signal and a cascade output signal supplied from outside.

With the foregoing arrangement, by using a plurality of liquid crystal driving circuit elements each of which includes the above-described interface circuit having the aforementioned power saving function, to compose a liquid crystal driving circuit, that is, by applying the interface circuits having the aforementioned power saving function to input sections of source drivers as the liquid crystal driving circuit elements, only the comparator circuits of the source drivers which should operate are made to be in the operating state among the source drivers cascaded, while the comparator circuits for multi-bit display data provided in the interface circuits of the other source drivers are made to be in the non-operating state. As a result, unnecessary power consumption is prevented.

Furthermore, to realize the control signal producing circuit, a RS flip flop may be used.

Furthermore, as a concrete example of the comparator, each comparator may include a comparing circuit section which includes a switching element inserted in a current path therein, and a source follower circuit which includes a switching element which is a MOS transistor, the switching element being inserted in a current path in the source follower circuit for preventing an input gate of the source follower circuit from becoming in a floating state, so that each of the above switching elements switches a state of conductivity of the current path between a conductive state and a non- conductive state in response to a control signal supplied from outside.

Furthermore, the interface circuit arranged as above may be arranged so as to further comprise a voltage follower circuit provided between an output terminal of the low-pass filter and the inverting input terminals of the comparators.

With the foregoing arrangement wherein the voltage follower circuit is provided between the output terminal of the low-pass filter and the inverting input terminals of the comparators, it is possible to eliminate differences between loads of the comparators in the case where the number of the comparators provided in the interface circuit is increased.

Furthermore, the liquid crystal driving circuit of the present invention is characterized by comprising a plurality of liquid crystal driving circuit elements each of which has input terminals to which digital signals such as a clock signal and display data signals are supplied, respectively, and a driving signal producing section for producing a driving signal for driving a liquid crystal display device in accordance with the digital signals supplied through the input terminals, wherein the aforementioned interface circuit is provided between the input terminals and the driving signal producing section inside each liquid crystal driving circuit element.

With the foregoing arrangement wherein the interface circuit is provided between the input terminals and the driving signal producing section in each liquid crystal driving circuit element, signals (clock signal, display data signals) are transmitted in a small-amplitude digital signal form and the signals thus transmitted are converted to great-amplitude digital signals (clock signal, display data signals) by using the comparators at the input section in each liquid crystal driving circuit element, thereby being outputted to the liquid crystal driving circuit element at the next stage.

The foregoing arrangement ensures reduction of the EMI noise which adversely affects a high-speed driving operation of the liquid crystal display device, that is, the EMI noise outside the liquid crystal driving circuit.

Furthermore, the liquid crystal driving circuit arranged as above may be further arranged so that the low-pass filter of the interface circuits is positioned outside the liquid crystal driving circuit elements.

With the foregoing arrangement wherein the low-pass filter is positioned outside the liquid crystal driving circuit elements, fine adjustment can be conducted with respect to the reference voltage signal produced by the low-pass filter.

By so doing, in designing the low-pass filter, the variation of the resistive element and the capacitive element constituting the low-pass filter, which tends to occur in the manufacturing process, can be taken into consideration.

Besides, since fine adjustment of the low-pass filter is easily performed, the reference voltage signal can be easily varied in accordance with the threshold voltage Vth of the transistors constituting the comparators.

Furthermore, the liquid crystal driving circuit arranged as above may be further arranged so that only one low-pass filter is provided outside the liquid crystal driving circuit elements, and the reference voltage signal produced by the low-pass filter is supplied to every liquid crystal driving circuit element.

According to the foregoing arrangement wherein only one low-pass filter is provided outside the liquid crystal driving circuit elements and the reference voltage signal produced by the low-pass filter is supplied to every liquid crystal driving circuit element, only one low-pass filter is needed, thereby ensuring reduction of a size of a circuit substrate of the liquid crystal driving circuit element, for example, a chip size of the source driver.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An interface circuit comprising a plurality of comparators and a low-pass filter, each comparator having a non-inverting input terminal and an inverting input terminal, wherein:
   digital signals with small amplitudes are supplied to the non-inverting input terminals of said comparators, respectively;
   a reference voltage signal obtained by filtering, through said low-pass filter, one predetermined digital signal among the digital signals supplied to the non-inverting input terminals is supplied to every inverting terminal of said comparators; and
   each comparator performs level shifting with respect to the digital signals with the small amplitudes inputted thereto, and outputs a digital signal with a greater amplitude than that of the inputted digital signal.

2. The interface circuit as set forth in claim 1, wherein each comparator includes a switching element, said switching element being inserted in a current path inside said comparator so as to switch a state of conductivity of the current path between a conductive state and a non-conductive state in response to a control signal supplied from outside.

3. The interface circuit as set forth in claim 2, further comprising control signal producing circuit for producing the control signal supplied to said switching element for controlling the state of conductivity of the current path, said control signal producing circuit producing the control signal by using a start pulse signal and a cascade output signal supplied from outside.

4. The interface circuit as set forth in claim 3, wherein said control signal producing circuit is composed of a RS flip-flop.

5. The interface circuit as set forth in claim 1, wherein:
   each comparator includes a comparing circuit section and a source follower circuit;
   each comparing circuit section includes a switching element inserted in a current path therein;
   each source follower circuit includes a switching element inserted in a current path therein for preventing an input gate of said source follower circuit from becoming in a floating state; and
   each of said switching elements switches a state of conductivity of the current path between a conductive state and a non-conductive state in response to a control signal supplied from outside.

6. The interface circuit as set forth in claim 5, wherein each switching element is composed of a MOS transistor.

7. The interface circuit as set forth in claim 5, wherein said comparing circuit section is composed of a differential amplifier in which P-channel transistors are used.

8. The interface circuit as set forth in claim 5, wherein said comparing circuit section is composed of a differential amplifier in which N-channel transistors are used.

9. The interface circuit as set forth in claim 5, wherein enhancement-type transistors are used for differential input of said comparing circuit section.

10. The interface circuit as set forth in claim 5, wherein depression-type transistors are used for differential input of said comparing circuit section.

11. The interface circuit as set forth in claim 1, further comprising a voltage follower circuit, said voltage follower circuit being provided between an output terminal of said low-pass filter and the inverting input terminals of said comparators.

12. The interface circuit as set forth in claim 5, further comprising a voltage follower circuit, said voltage follower circuit being provided between an output terminal of said low-pass filter and the inverting input terminals of said comparators.

13. A liquid crystal driving circuit, comprising:
   a plurality of liquid crystal driving circuit elements, each liquid crystal driving circuit element having input terminals to which digital signals such as a clock signal and display data signals are supplied, respectively, and a driving signal producing section for producing a driving signal for driving a liquid crystal display device in accordance with the digital signals supplied through said input terminals; and
   a plurality of interface circuits having a plurality of comparators and at least one low-pass filter, each comparator having a non-inverting input terminal and an inverting input terminal, wherein digital signals with small amplitudes are supplied to the non-inverting input terminals of said comparators, respectively, while a reference voltage signal obtained by filtering, through said low-pass filter, one predetermined digital signal among the digital signals supplied to the non-inverting input terminals is supplied to every inverting terminal of said comparators, so that each comparator performs level shifting with respect to the digital signal with the small amplitude inputted thereto, and outputs a digital signal with a greater amplitude than that of the inputted digital signal,
   wherein:
   each interface circuit is provided between said input terminals and said driving signal producing section inside each liquid crystal driving circuit element.

14. The liquid crystal driving circuit as set forth in claim 13, wherein:

each comparator includes a comparing circuit section and a source follower circuit;

each comparing circuit section includes a switching element inserted in a current path therein;

each source follower circuit includes a switching element inserted in a current path therein for preventing an input gate of said source follower circuit from becoming in a floating state; and each of said switching elements switches a state of conductivity of the current path between a conductive state and a non-conductive state in response to a control signal supplied from outside.

15. The liquid crystal driving circuit as set forth in claim 13, wherein said low-pass filter of said interface circuits is positioned outside said liquid crystal driving circuit elements.

16. The liquid crystal driving circuit as set forth in claim 15, wherein only one low-pass filter is provided outside said liquid crystal driving circuit elements, and the reference voltage signal produced by said low-pass filter is supplied to every liquid crystal driving circuit element.

* * * * *